United States Patent [19]

Whitmore

[11] 4,387,146

[45] Jun. 7, 1983

[54] MULTICOLOR FILTERS WITH NONPLANAR SUPPORT ELEMENTS

[75] Inventor: Keith E. Whitmore, Rochester, N.Y.

[73] Assignee: Eastman Kodak Company, Rochester, N.Y.

[21] Appl. No.: 383,847

[22] Filed: Jun. 1, 1982

Related U.S. Application Data

[60] Division of Ser. No. 184,714, Sep. 8, 1980, Pat. No. 4,362,806, which is a continuation-in-part of Ser. No. 8,819, Feb. 2, 1979, abandoned.

[51] Int. Cl.[3] .............. G03F 5/00

[52] U.S. Cl. .............. 430/7; 430/4; 430/138

[58] Field of Search .............. 430/4, 7, 138

[56] References Cited

U.S. PATENT DOCUMENTS

| | | | |
|---|---|---|---|
| 1,003,720 | 9/1911 | Dufay | 430/7 |
| 1,191,034 | 7/1916 | Rheinberg | 430/206 |
| 2,599,542 | 6/1952 | Carlson | 430/69 |
| 2,681,857 | 6/1954 | Rogers | 430/7 |
| 2,968,554 | 1/1961 | Land | 430/212 |
| 2,983,606 | 5/1961 | Rogers | 430/240 |
| 3,019,124 | 1/1962 | Rogers | 430/496 |
| 3,138,459 | 6/1964 | Land | 430/207 |
| 3,214,274 | 10/1965 | Ohyama et al. | 430/535 |
| 3,519,423 | 7/1970 | Sharp | 430/7 |
| 3,561,358 | 2/1971 | Weigl | 430/49 |
| 3,776,734 | 12/1973 | Kumasaka | 430/496 |
| 3,779,775 | 12/1973 | Chiba et al. | 430/154 |
| 4,092,169 | 5/1978 | Kumasaka | 430/496 |
| 4,352,874 | 10/1982 | Land et al. | 430/496 |
| 4,353,977 | 10/1982 | Gerber et al. | 430/256 |
| 4,356,257 | 10/1982 | Gerber | 430/568 |
| 4,359,525 | 11/1982 | Gerber | 430/496 |
| 4,359,526 | 11/1982 | Walworth | 430/496 |

FOREIGN PATENT DOCUMENTS

| | | |
|---|---|---|
| 15027 | of 1912 | United Kingdom . |
| 1318371 | 5/1973 | United Kingdom . |

OTHER PUBLICATIONS

Wainer, "The Aluphoto Plate and Process," 1951, Photographic Engineering, vol. 2, No. 3, pp. 161–169.

*Primary Examiner*—M. F. Downey
*Attorney, Agent, or Firm*—Carl O. Thomas

[57] ABSTRACT

Photographic elements, multicolor filters and receivers are disclosed having supports providing microvessels for materials such as radiation-sensitive materials, imaging materials, mordants, silver precipitating agents and materials which are useful in conjunction with these materials. Processes of forming microvessels and introducing materials therein are also disclosed. Processes of forming images are disclosed employing microvessel containing elements. Image transfer processes are disclosed for producing one or a combination of silver and multicolor subtractive primary images alone or in combination with multicolor additive primary images.

19 Claims, 19 Drawing Figures

FIG. 1A
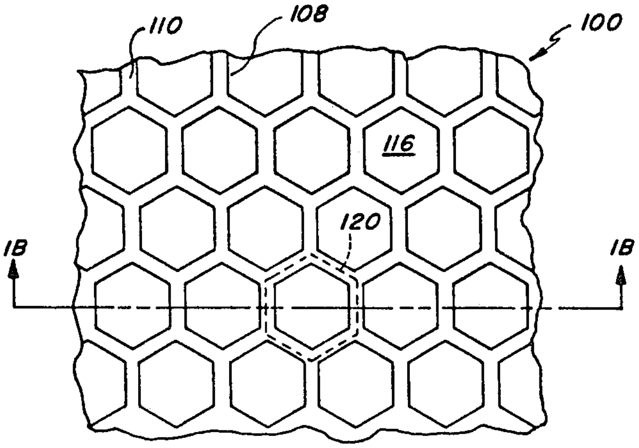
FIG. 1B
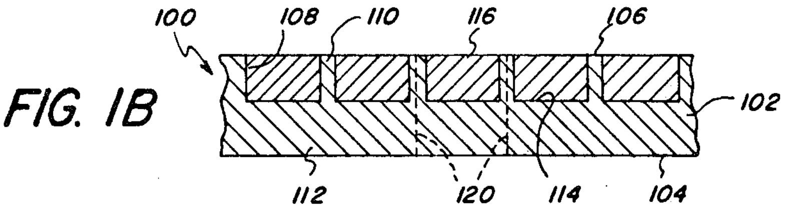
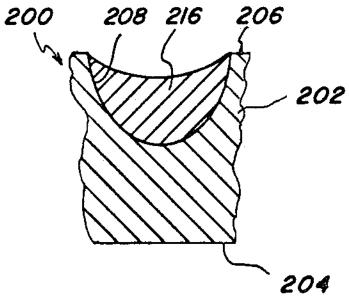
FIG. 2
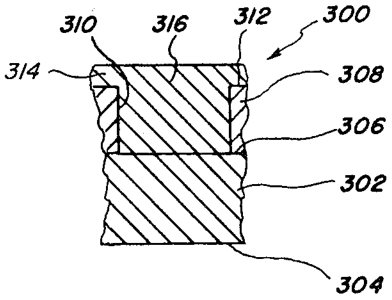
FIG. 3

FIG. 4
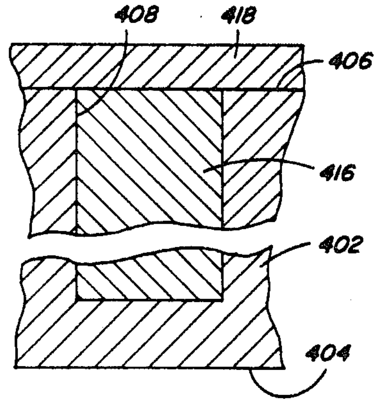
FIG. 5
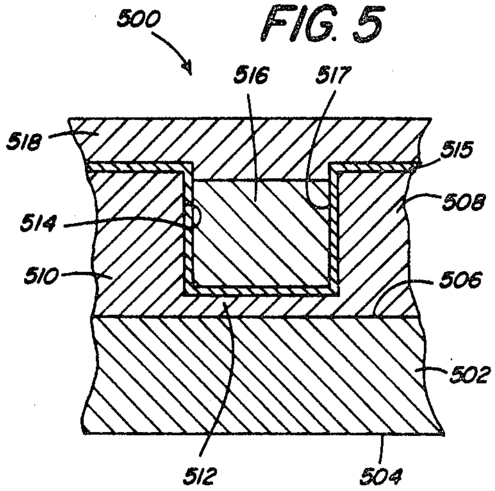
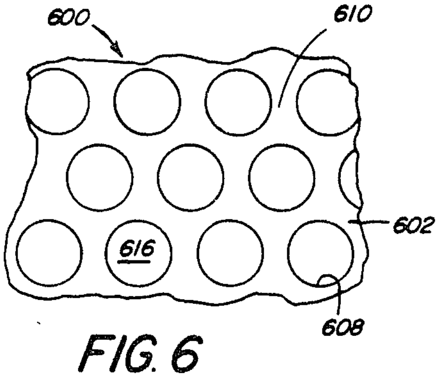
FIG. 6
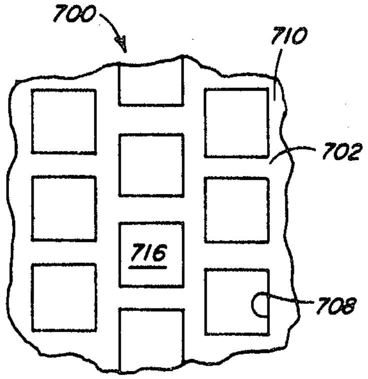
FIG. 7
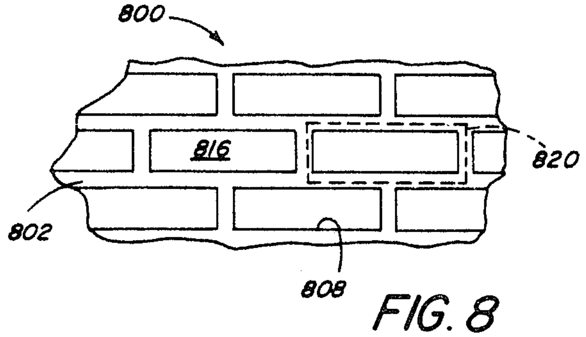
FIG. 8

FIG. 11C
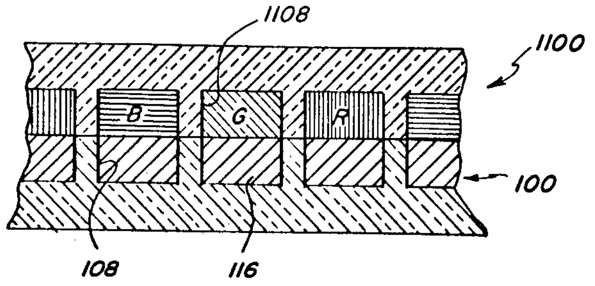
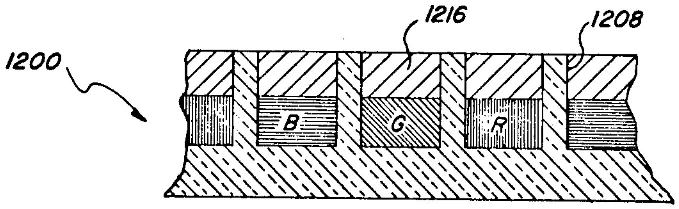
FIG. 12
FIG. 13
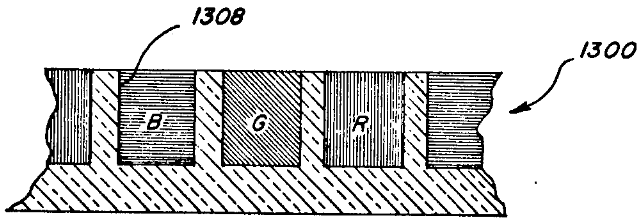
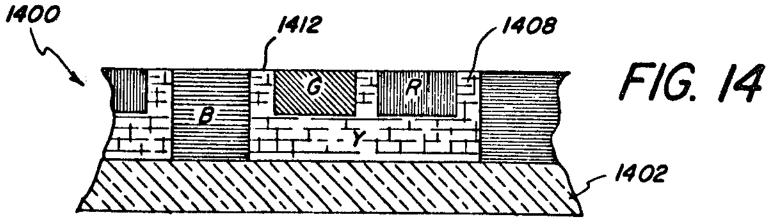
FIG. 14

MULTICOLOR FILTERS WITH NONPLANAR SUPPORT ELEMENTS

CROSS-REFERENCE TO RELATED APPLICATION(S)

This is a division of Ser. No. 184,714, filed Sept. 8, 1980, now U.S. Pat. No. 4,362,806, which is a continuation-in-part of Ser. No. 008,819, filed Feb. 2, 1979, now abandoned.

FIELD OF THE INVENTION

This invention relates to nonplanar elements useful in photography, to processes for fabrication of these elements and to processes for producing images employing such elements. This invention in one application relates to multicolor image transfer elements and processes for their use.

BACKGROUND OF THE INVENTION

In producing photographic images, a typical approach is to coat onto one or both major surfaces of a planar support a radiation-sensitive material capable of, alone or in combination with other image-forming materials, undergoing a change in optical density as a function of exposure and/or photographic processing. Coating in this way can result in loss (i.e., reduction) of image definition by reason of lateral image spreading—that is, spreading in a direction parallel to the major surfaces of the support. Lateral image spreading can be the result of radiation scattering during exposure—e.g., halation—or lateral reactant migration during photographic processing. The effects of lateral image spreading can be analyzed mathematically in terms such as modulation transfer function, or lateral image spreading can be discussed in sensory terms, such as graininess, which is recognized to be both a function of image definition loss and the randomness of image definition loss. Graininess is particularly a problem in silver halide photography, since it is directly related to and limits in many instances attainable photographic speeds.

Typical approaches to reducing graininess in photographic images have involved some modification of the imaging layers of photographic elements, their mode of processing or modification of the layers after an image has been produced therein. An illustrative teaching of this type is that of U.K. Pat. No. 1,318,371, which recognizes graininess to be a function of the randomness of image distribution and therefore teaches to superimpose on the imaging layer a grid which subdivides the image, either before or after its formation. In every embodiment of that patent planar photographic support surfaces are coated.

Except on a macro scale, which has no relevance to graininess, in only a few instances have photographic element support surfaces been employed for imaging materials which depart from a planar form. One such approach is the Aluphoto process in which silver halide is formed in situ in the random pores of an anodized aluminum plate, illustrated by Wainer, "The Aluphoto Plate and Process," 1951 *Photographic Engineering*, Vol. 2, No. 3, pp. 161-169. Kumasaka U.S. Pat. Nos. 3,776,734 and 4,092,169 are essentially cumulative. Chiba et al U.S. Pat. No. 3,779,775 applies the teachings of in situ formation of silver halide in random pores to polymeric support materials. Ohyama et al U.S. Pat. No. 3,214,274 uses random pores in subbing layers to anchor layers to photographic supports. Nonplanar supports intended to level out overlapping emulsion coating patterns are disclosed by Rogers U.S. Pat. Nos. 2,983,606 and 3,019,124.

Land U.S. Pat. No. 3,138,459 teaches the use of a two-color screen, wherein two additive primary filter dyes are coated into grooves on opposite sides of a transparent support. The grooves on one side of the support are interposed between grooves on the opposite side of the support. The grooves prevent lateral spreading of the filter dyes into overlapping relationship. However, to accomplish this the grooves on one major surface of the support must be laterally spaced by a distance greater than their width. Dufay U.K. Pat. No. 15,027 (1912) discloses a four color screen in which grooves on opposite major surfaces overlap.

Carlson U.S. Pat. No. 2,599,542 has taught that either randomly or regularly spaced recesses or projections can be employed in xerographic plates to obtain halftone images. However, xerographic photoconductive coatings, by reason of their electrical biasing, exhibit no significant halation on exposure, and Carlson does not alter the optical density of the photoconductive layer during processing.

The retention of ink in recesses in gravure printing elements is well known. Weigl U.S. Pat. No. 3,561,358 applies elements having initially uniform cells to gravure printing.

SUMMARY OF THE INVENTION

This invention, through the use of a nonplanar support configuration, offers unexpected advantages. Specifically, halation protection can be provided by the support configuration. In certain preferred forms, this is accomplished without competing absorption, as is encountered with conventional antihalation layers. Exposing radiation can be redirected, and it can be caused to reencounter a radiation-sensitive component so that the opportunity for a speed increase is provided without loss of image definition.

This invention also offers protection against loss of image definition in processing an exposed photographic element. This invention is particularly well suited to achieving high contrast images. In one embodiment, this invention permits relatively high densities to be achieved through infectious development (defined below) in image areas while inhibiting lateral spreading in background areas. In still another aspect, this invention permits extremely high photographic speeds without concomitant graininess, and in one preferred approach this is quite unexpectedly achieved by laterally distributing (smearing) the imaging material in a controlled manner.

The present invention offers the advantage of permitting greater absorption of exposing radiation. In one form, this is accomplished by permitting the use of extended thicknesses of radiation-sensitive materials without loss of image definition. This invention is particularly advantageously applied to x-ray imaging, and the invention is compatible with providing radiation-sensitive material on opposite major surfaces of a support. The invention further offers unexpected advantages when employed in combination with lenticular support surfaces.

The present invention offers distinct and unexpected advantages in image transfer photography. The invention permits improved image definition and reduced graininess to be achieved for both retained and transferred images. The invention is nevertheless compatible with and in certain preferred forms directed to image transfer approaches which require lateral image spreading during transfer. The invention offers protection against lateral spreading of transferred images in a receiver.

The present invention offers unexpected advantages in multicolor additive primary images of improved definition and reduced graininess. The invention is particularly well suited to forming multicolor additive primary filters of improved definition. The invention permits right-reading multicolor subtractive primary and multicolor additive primary images to be concurrently formed. The invention in a preferred form also permits right-reading multicolor additive primary and silver images to be concurrently formed.

Additionally, this invention is directed to certain unique processes of forming the nonplanar supports. These processes include particularly advantageous approaches of forming supports with dyed lateral walls and transparent bottom walls. The invention offers advantageous approaches for providing interlaid patterns of materials related to a unitary support.

In one aspect, this invention is directed to an element comprising a support means having first and second major surfaces and, on said support means, a portion which is (1) a radiation-sensitive imaging means capable of undergoing as a function of at least one of photographic exposure and processing a change in the optical density or mobility of said imaging means, the imaging means being comprised of at least one component which permits visibly detectable lateral image spreading to occur when the imaging means is coated as a continuous layer on a planar support surface, (2) a material capable of reducing the mobility of a diffusible imaging material or (3) at least three laterally offset segmented filters. The invention is in one aspect characterized by the support means defining microvessels which individually open toward one of the first and second major surfaces. A plurality of the microvessels open toward the first major surface of said support means to form a predetermined, ordered planar array. Next adjacent of the microvessels forming the planar array are laterally spaced by less than the width of adjacent microvessels opening toward either of the first and second major surfaces, and the component of the imaging means, the mobility reducing material, or the filters forming the portion of the element being present at least in part in a plurality of the microvessels of the planar array to form a recurring pattern.

In one preferred aspect, this invention is directed to a photographic element comprised of a support means having first and second major surfaces and a radiation-sensitive imaging means which permits visibly detectable lateral image spreading to occur when the imaging means is coated as a continuous layer on a planar support surface. The improvement is in one aspect characterized by the support means defining a predetermined, ordered array of microvessels which open toward one major surface of the support means and the support means being present in the microvessels of the planar array.

In another aspect, this invention is directed to a process of translating to a viewable form an imagewise exposure pattern of a photographic element including a support having first and second major surfaces and a radiation-sensitive imaging means capable of undergoing as a function of at least one of photographic exposure and processing a change in its optical density or mobility. The imaging means is comprised of at least one component which permits visually detectable lateral imaging spread to occur when the imaging means is coated on a planar support surface. The invention is characterized, in one aspect, by the improvement comprising limiting lateral image spreading by retaining at least the one component of the imaging means in a predetermined, ordered planar array of microvessels formed by the support. The microvessels of the planar array formed by the support open toward one major surface of the support, the next adjacent microvessels of the planar array are laterally spaced by less than the width of adjacent microvessels opening toward either major surface of the support.

In another preferred form, this invention is directed to a process of producing a photographic image comprising imagewise exposing, while associated with a photographic support, a planar distribution of radiation-sensitive imaging means which exhibits halation. The invention is characterized in this asepct by the improvement comprising retaining during exposure the radiation-sensitive imaging means in a predetermined, ordered array of microvessels formed by the support, thereby intercepting during exposure laterally deflected exposing radiation with the support in a plane common to the radiation-sensitive imaging means.

In an additional preferred aspect, the invention is directed to a filter-containing element as described above additionally including a panchromatically radiation-sensitive imaging means overlying the first, second, and third sets of the microvessels. In a further preferred aspect, the invention is directed to a process of producing a multicolor additive primary image comprised of imagewise exposing a filter-containing element including radiation-sensitive means, as described above, and producing an increased neutral density in areas in which the radiation-sensitive imaging means is exposed.

In still another aspect, this invention is directed to a process of forming an element, comprised of forming in a support having first and second major surfaces a predetermined, ordered planar array of microvessels opening toward the first major surface. In one form, the process is comprised of introducing into a plurality of the microvessels radiation-sensitive imaging means capable of undergoing as a function of at least one of photographic exposure and processing a change in the optical density or mobility of the imaging means. The imaging means is comprised of at least one component which permits visibly detectable lateral image spreading to occur when the imaging means is coated as a continuous layer on a planar support surface. In another form, the process is comprised of introducing into a first set of microvessels forming the array a first primary dye, pigment or dye precursor, into a second set of microvessels forming the array a second primary dye, pigment or dye precursor, and into a third set of microvessels forming the array a third primary dye, pigment or dye precursor. In a third form, the process is comprised of introducing into the microvessels of the planar array means for immobilizing an imaging material.

In an additional aspect, this invention is directed to a process comprised of, in a support having first and second major surfaces, forming a planar array of microvessels opening toward the first major surface, initially blocking the microvessels. A first set of microvessels is selectively unblocked, and into the first set of microvessels is introduced a first material capable of permitting selective absorption or transmission of light within one of the blue, green or red regions of the spectrum. The procedure is then twice repeated selectively unblocking second and third sets of microvessels and introducing second and third materials, the first, second and third materials each affecting a separate one of the blue, green and red regions of the spectrum.

The invention may be better understood by reference to the following detailed description considered in conjunction with the drawings, in which:

FIG. 1A is a plan view of an element portion;

FIG. 1B is a sectional view taken along section lines 1B—1B in FIG. 1A;

FIGS. 2 through 5 are sectional views of alternative pixel (defined below) constructions;

FIGS. 6 through 8 are plan views of alternative element portions;

FIGS. 11B, 11C and 12 through 16 are sectional details of elements according to this invention.

DESCRIPTION OF THE PREFERRED EMBODIMENTS

Figure 9:
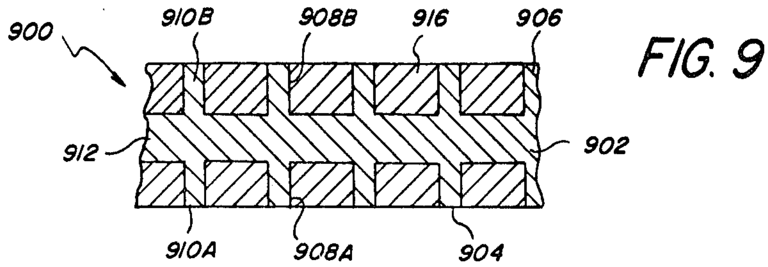
FIGS. 9 and 10 are sectional details of elements according to this invention.

While subheadings are provided for convenience, to appreciate fully the elements of the invention, it is intended that the disclosure be read and intrepreted as a whole.

Illustrative Photographic Element Configurations

A preferred embodiment of a photographic element constructed according to the present invention is a photographic element 100 schematically illustrated in FIGS. 1A and 1B. The element is comprised of a support 102 having substantially parallel first and second major surfaces 104 and 106. The support defines a plurality of tiny cavities or microcells (hereinafter termed microvessels or reaction microvessels) 108 which open toward the second major surface of the support. The reaction microvessels are defined in the support by an interconnecting network of lateral walls 110 which are of lesser width than the adjacent microvessels they define. As a result, next adjacent microvessels are laterally spaced by less than their widths. The lateral walls are integrally joined to an underlying portion 112 of the support so that the support acts as a barrier between adjacent microvessels. The underlying portion of the support defines the bottom wall 114 of each reaction microvessel. Within each reaction microvessel is provided a radiation-sensitive imaging material 116 which is capable of undergoing as a function of photographic exposure and/or processing a change in its optical density or mobility but which includes at least one component exhibiting the characteristic of visually detectable lateral image spreading in translating an exposure pattern to a viewable form when coated on a planar support surface as a continuous layer.

The dashed line 120 is a boundary of a pixel. The term "pixel" is employed herein to indicate a single unit of the photographic element which is repeated to make up the entire imaging area of the element. This is consistent with the general use of the term in the imaging arts. The number of pixels is, of course, dependent on the size of the individual pixels and the dimensions of the photographic element. Looking at the pixels collectively, it is apparent that the imaging material in the reaction microvessels can be viewed as a segmented layer associated with the support.

The photographic elements of the present invention can be varied in their geometrical configurations and structural makeup. For example, FIG. 2 schematically illustrates in section a single pixel of a photographic element 200. The support 202 is provided for a first major surface 204 and a second, substantially parallel major surface 206. A reaction microvessel 208 opens toward the second major surface. Contained within the reaction microvessel is a radiation-sensitive material 216. The reaction microvessels are formed so that the support provides inwardly sloping walls which perform the functions of both the lateral and bottom walls of the microvessels 108. Such inwardly curving wall structures are more conveniently formed by certain techniques of manufacture, such as etching, and also can be better suited toward redirecting exposing radiation toward the interior of the reaction microvessels.

In FIG. 3 a pixel of a photographic element 300 is shown. The element is comprised of a first support element 302 having a first major surface 304 and a second, substantially parallel major surface 306. Joined to the first support element is a second support element 308 which is provided in each pixel with an aperture 310. The second support element is provided with an outer major surface 312. The walls of the second support element forming the aperture 310 and the second major surface of the first support element together define a reaction microvessel. A radiation-sensitive material 316 is located in the reaction microvessel. Additionally, a relatively thin extension 314 of the radiation-sensitive material overlies the outer major surface of the upper support element and forms a continuous layer joining adjacent pixels. The lateral extensions of the radiation-sensitive material are sometimes a by-product of a specific technique of coating the radiation-sensitive material. One coating technique which can leave extensions of the radiation-sensitive material is doctor blade coating. It is generally preferred that the lateral extensions be absent or of the least possible thickness.

In FIG. 4 a pixel of a photographic element 400 is illustrated comprised of a support 402, which can be of extended depth. The support is provided with a first major surface 404 and a second, substantially parallel major surface 406. The support defines a reaction microvessel 408 which can be similar to reaction microvessel 108, but is by comparison of extended depth. Two components 416 and 418 together form a radiation-sensitive imaging means which is capable of translating an imaging radiation pattern striking it into a viewable image, but which exhibits the characteristic of permitting visually detectable lateral image spreading to occur in translating the imaging radiation pattern to viewable form when coated on a planar surface as two continuous layers. The first component 416, which in a continuous layer form would produce visually detectable lateral image spreading, forms a column of extended depth, as compared with the material 116 in the reaction microvessels 108. The second component 418 is in the form of a continuous layer overlying the second major surface of the support. In an alternative form the first component can be identical to the radiation-sensitive imaging material 116—that is, itself form the entire radiation-sensitive imaging means—and the second component 418 can be a continuous layer which performs another function, such as those conventionally performed by overcoat layers.

In FIG. 5 a pixel of a photographic element 500 is illustrated comprised of a first support element 502 having a first major surface 504 and a second, substantially parallel major surface 506. Joined to the first support element is a transparent second support element 508 which is provided with a network of lateral walls 510 integrally joined to an underlying portion 512 of the second support element. In one preferred form the first support element is a relatively nondeformable element while the second support element is relatively deformable. An indentation 514 is formed in the second support element in each pixel area. The surfaces of the second support element adjacent its outer major surface, that is the outer surface of the lateral walls, as well as the surfaces of the indentation, are overlaid with a thin layer 515, which performs one or a combination of surface modifying functions. The portion of the coating lying within the indentation defines the boundaries of a reaction microvessel 517. A first component 516 which lies within the reaction microvessel and a second component 518 which overlies one entire major surface of the pixel can be similar to the first and second components 416 and 418, respectively.

Each of the pixels shown in FIGS. 2 through 5 can be of a configuration and arranged in relation to other pixels so that the photographic elements 200, 300, 400 and 500 (ignoring any continuous material layers overlying the viewed major surfaces of the supports) appear identical in plan view to the photographic element 100. The pixels 120 shown in FIG. 1 are hexagonal in plan view, but it is appreciated that a variety of other pixel shapes and arrangements are possible. For example, in FIG. 6 a photographic element 600 is shown comprised of a support 602 provided with reaction microvessels 608, which are circular in plan view, containing radiation-sensitive material 616. Reaction microvessels which are circular in plan are particularly suited to formation by etching techniques, although they can be easily formed by other techniques, as well. A disadvantage of the circular reaction microvessels as compared with other configurations shown is that the lateral walls 610 vary continuously in width. Providing lateral walls of at least the minimum required width at their narrowest point inherently requires the walls in some portions of the pattern to be larger than that required minimum width. In FIG. 7 a photographic element 700 is shown comprised of a support 702 provided with reaction microvessels 708, which are square in plan view, containing radiation-sensitive material 716. The lateral walls 710 are of uniform width.

FIG. 8 illustrates an element 800 comprised of a support 802 having an interlaid pattern of rectangular reaction microvessels 808. Each of the microvessels contains a radiation-sensitive imaging material 816. The dashed line 820 identifies a single pixel of the element.

In each of the elements 100 through 500, the surface of the support remote from the reaction microvessels is illustrated as being planar. This is convenient for many photographic applications, but is not essential to the practice of this invention. Other element configurations are contemplated, particularly where the support is transparent to exposing radiation and/or when viewed.

For example, in FIG. 9 a photographic element 900 is illustrated. The element is comprised of a support 902 having substantially parallel first and second major surfaces 904 and 906. The support defines a plurality of reaction microvessels 908A and 908B which open toward the first and second major surfaces, respectively. In the preferred form, the reaction microvessels 908A are aligned with the reaction microvessels 908B along axes perpendicular to the major surfaces. The reaction microvessels are defined in the support by two interconnecting networks of lateral walls 910A and 910B which are integrally joined by an underlying, preferably transparent, portion 912 of the support. Within each reaction microvessel is provided a radiation-sensitive material 916.

It can be seen that element 900 is essentially similar to element 100, except that the former element contains reaction microvessels along both major surfaces of the support. Thus the microvessels form two separate planar arrays, one along each major surface of the support. As shown, the lateral walls 910A and 910B and the underlying portion 912 are proportioned so that next adjacent of the microvessels forming the same planar array are laterally spaced by less than the width of adjacent microvessels opening toward either of the first and second major surfaces. It is apparent that similar variants of the photographic elements 200, 300, 400, 500, 600, 700 and 800 can be formed.

Figure 10:
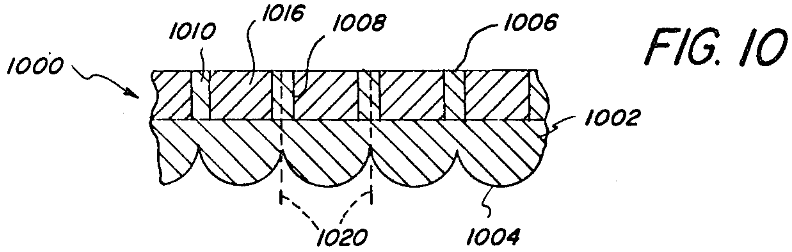

In FIG. 10 a photographic element 1000 is illustrated. The element is comprised of a support 1002 having a lenticular first major surface 1004 and a second major surface 1006. Reaction microvessels 1008 containing radiation-sensitive material 1016 and defined by lateral walls 1010 of the support open toward the second major surface. The element is made up of a plurality of pixels indicated in one occurrence by dashed line boundary 1020. Individual lenticules are coextensive with the pixel boundaries. Although element 1000 is shown as a modification of element 100 to which the feature of a lenticular surface has been added, it is appreciated that photographic elements 200, 300, 400, 500, 600, 700 and 800 can be similarly modified to provide lenticules.

The photographic elements and pixels thereof illustrated schematically in FIGS. 1 through 10 are merely exemplary of a wide variety of forms which the elements of this invention can take. For ease of illustration the drawings show the pixels greatly enlarged and with some deliberate distortions of relative proportions. For example, as is well known in the photographic arts, support thicknesses often range from about 10 times the thickness of the radiation-sensitive layers coated thereon up to 50 or even 100 times their thickness. Thus, in keeping with the usual practice in patent drawings in this art, the relative thicknesses of the supports have been reduced. This has permitted the reaction microvessels to be drawn conveniently to a larger scale.

One function of the microvessels provided in the photographic elements is to limit lateral image spreading. The degree to which it is desirable to limit lateral image spreading will depend upon the photographic application. For most imaging applications the microvessels are preferably sufficiently small in size that the unaided eye does not detect discrete image areas (graininess) in viewing images in the photographic element or images made from the photographic element. Where the photographic image is to be viewed without enlargement and minimal visible graininess is desired, microvessels having widths within the range of from about 1 to 200 microns, preferably from about 4 to 100 microns, are contemplated for use in the practice of this invention. To the extent that visible graininess an be tolerated for the photographic application, the microvessels can be still larger in width. Where the photographic images produced are intended for enlargement, microvessel widths in the lower portion of the width ranges are preferred. It is accordingly preferred that the microvessels be about 20 microns or less in width where enlargements are to be made of the images produced by the photographic elements of this invention.

The lower limit on the size of the reaction microvessels is a function of the photographic speed desired for the element. As the areal extent of the reaction microvessel is decreased, the probability of an imaging amount of radiation striking a particular reaction microvessel on exposure is reduced. Reaction microvessel widths of at least about 7 microns, preferably at least 8 microns, optimally at least 10 microns, are contemplated where the reaction microvessel contains radiation-sensitive material. At widths below 7 microns, silver halide emulsions in the microvessels can be expected to show a significant reduction in speed.

The reaction microvessels are of sufficient depth to contain at least a major portion of the radiation-sensitive material. In one preferred form the reaction microvessels are of sufficient depth that the radiation-sensitive materials are entirely contained therein when employed in conventional coating thicknesses, and the support element which forms the lateral walls of the reaction microvessels efficiently divides the radiation-sensitive materials into discrete units or islands. In some forms the reaction microvessels do not contain all, but only a major portion, of the radiation-sensitive material, as can occur, for example, by introducing the radiation-sensitive material into the reaction microvessels by doctor blade coating.

The minimum depth of the reaction microvessels is that which allows the support element to provide an effective lateral wall blockage of image spreading. In terms of actual dimensions the minimum depth of the reaction microvessels can vary as a function of the radiation-sensitive material employed and the maximum density which is desired to be produced. The depth of the reaction microvessels can be less than, equal to or greater than their width. The thickness of the imaging material or the component thereof coated in the microvessels is preferably at least equal to the thicknesses to which the material is conventionally continuously coated on planar support surfaces. This permits a maximum density to be achieved within the area subtended by the reaction microvessel which approximates the maximum density that can be achieved in imaging a corresponding coating of the same radiation-sensitive material. It is recognized that reflected radiation from the microvessel walls during exposure and/or viewing can have the effect of yielding a somewhat different density than obtained in an otherwise comparable continuous coating of the radiation-sensitive material. For instance, where the microvessel walls are reflective and the radiation-sensitive material is negative-working, a higher density can be obtained during exposure within the microvessels than would be obtained with a continuous coating of the same thickness of the radiation-sensitive material.

Because the areas lying between adjacent reaction microvessels are free of radiation-sensitive material (or contain at most a relatively minor proportion of the radiation-sensitive material), the visual effect of achieving a maximum density within the areas subtended by the reaction microvessels equal to the maximum density in a corresponding conventional continuous coating of the radiation-sensitive material is that of a somewhat reduced density. The exact amount of the reduction in density is a function of the thickness of any material lying within the reaction microvessels as well as the spacing between adjacent reaction microvessels. Where the continuous conventional coating produces a density substantially less than the maximum density obtainable by increasing the thickness of the coating and the reaction microvessel area is a larger fraction of the pixel area (e.g., 90 to 99 percent), the comparative loss of density attributable to the spacing of reaction microvessels can be at least partially offset by increasing the thickness of the imaging material or component in the reaction microvessel. This, of course, means increasing the minimum depth of the reaction microvessels. Where the photographic element is not intended to be viewed directly, but is to be used as an intermediate for photographic purposes, such as a negative which is used as a printing master to form positive images in a reflection print photographic element, the effect of spacing between adjacent reaction microvessels can be eliminated in the reflection print by applying known printing techniques, such as slightly displacing the reflection print with respect to the master during the printing exposure, employing an optical filter, controlling a chemical diffusion path, or controlling a scanning beam. Thus, in this instance, increase in the depth of the reaction microvessels is not necessary to achieve conventional maximum density levels with conventional thicknesses of radiation-sensitive materials.

The maximum depth of the reaction microvessels can be substantially greater than the thickness of the radiation-sensitive material to be placed therein. For certain coating techniques it is preferred that the maximum depth of the reaction microvessels approximate or substantially equal the thickness of the radiation-sensitive material to be employed. In forming conventional continuous coatings of radiation-sensitive materials one factor which limits the maximum thickness of the coating material is acceptable lateral image spreading, since the thicker the coating, the greater is the tendency, in most instances, toward loss of image definition. In the present invention lateral image spreading is limited by the lateral walls of the support element defining the reaction microvessels and is independent of the thickness of the radiation-sensitive material located in the microvessels. Thus, it is possible and specifically contemplated in the present invention to employ reaction microvessel depths and radiation-sensitive material thicknesses therein which are far in excess of those thicknesses employed in conventional continuous coatings of the same radiation-sensitive materials.

While the depth of the reaction microvessels can vary widely, it is generally contemplated that the depth of the reaction microvessels will fall within the range of from about 1 to 1000 microns in depth or more. For exceptional radiation-sensitive materials, such as vacuum vapor deposited silver halides, conventional coating thicknesses are typically in the range from 40 to 200 nanometers, and very shallow microvessels of a depth of 0.5 micron or less can be employed. In one preferred form, the depth of the reaction microvessels is in the range of from about 5 to 20 microns. This is normally sufficient to permit a maximum density to be generated within the area subtended by the reaction microvessel corresponding to the maximum density obtainable with continuously coated radiation-sensitive materials of conventional thicknesses, such as silver halide emulsions containing conventional addenda, including dye image-producing components. These preferred depths of the reaction microvessels are also well suited to applications where the radiation-sensitive material is intended to fill the entire reaction microvessels—e.g., to have a thickness corresponding to the depth of the reaction microvessel.

The reaction microvessels are located on the support element in a predetermined, controlled relationship to each other. The microvessels are relatively spaced in a predetermined, ordered manner to form an array. It is usually desirable and most efficient to form the microvessels so that they are aligned along at least one axis in the plane of the support surface. For example, microvessels in the configuration of hexagons, preferred for multicolor applications, are conveniently aligned along three support surface axes which intersect at 120° angles. It is generally preferred that the reaction microvessels be positioned to form a regular pattern. However, it is recognized that adjacent reaction microvessels can be varied in spacing to permit alterations in visual effects. Generally it is preferred that adjacent reaction microvessels be closely spaced, since this aids the eye in visually combining adjacent image areas and facilitates obtaining higher overall maximum densities. The minimum spacing of adjacent reaction microvessels is limited only by the necessity of providing intervening lateral walls in the support elements. Typical adjacent reaction microvessels are laterally spaced a distance (corresponding to lateral walls thickness) of from about 0.5 to 5 microns, although both greater and lesser spacings are contemplated.

Spacing of adjacent reaction microvessels can be approached in another way in terms of the percentage of each pixel area subtended by the reaction microvessel. This is a function of the size and peripheral configuration of the reaction vessel and the pixel in which it is contained. Generally the highest percentages of pixel area subtended by reaction microvessel area are achieved when the peripheral configuration of the pixel and the reaction microvessel are identical, such as a hexagonal reaction microvessel in a hexagonal pixel (as in FIG. 1A) or a square reaction microvessel in a square pixel (as in FIG. 7). For closely spaced patterns it is preferred that the subtended reaction microvessel area account for from about 50 to 99 percent of the pixel area, most preferably from 90 to 98 percent of the pixel area. Even with microvessel and pixel configurations which do not permit the closest and most efficient spacing the subtended microvessel area can readily account for 50 to 80 (preferably 90) percent of the pixel area.

The photographic elements can be formed by one or a combination of support elements which, alone or in combination, are capable of reducing lateral image spread and maintaining spatial integrity of the pixels forming the elements. Where the photographic elements are formed by a single support element, the support element performs both of these functions. Wher the photographic elements are formed by more than one support element, as in FIGS. 3 and 5, for example, only one of the elements (preferably the first support elements 302 and 502) need have the structural strength to retain the desired spatial relationship of adjacent pixels. The second support elements can be formed of relatively deformable materials. They can, but need not, contribute appreciably to the ability of the photographic elements 300 and 500 to be handled as a unit without permanent structural deformation.

Illustrative Support Materials

The support elements of the elements of this invention can be formed of the same types of materials employed in forming conventional photographic supports. Typical photographic supports include polymeric film, wood fiber—e.g., paper, metallic sheet and foil, glass and ceramic supporting elements providing with one or more subbing layers to enhance the adhesive, antistatic, dimensional, abrasive, hardness, frictional, antihalation and/or other properties of the support surface.

Typical of useful polymeric film supports are films of cellulose nitrate and cellulose esters such as cellulose triacetate and diacetate, polystyrene, polyamides, homo- and co-polymers of vinyl chloride, poly(vinyl acetal), polycarbonate, homo- and co-polymers of olefins, such as polyethylene and polypropylene, and polyesters of dibasic aromatic carboxylic acids with divalent alcohols, such as poly(ethylene terephthalate).

Typical of useful paper supports are those which are partially acetylated or coated with baryta and/or a polyolefin, particularly a polymer of an α-olefin containing 2 to 10 carbon atoms, such as polyethylene, polypropylene, copolymers of ethylene and propylene and the like.

Polyolefins, such as polyethylene, polypropylene and polyallomers—e.g., copolymers of ethylene with propylene, as illustrated by Hagemeyer et al U.S. Pat. No. 3,478,128, are preferably employed as resin coatings over paper, as illustrated by Crawford et al U.S. Pat. No. 3,411,908 and Joseph et al U.S. Pat. No. 3,630,740, over polystyrene and polyester film supports, as illustrated by Crawford et al U.S. Pat. No. 3,630,742, or can be employed as unitary flexible reflection supports, as illustrated by Venor et al U.S. Pat. No. 3,973,963.

Preferred cellulose ester supports are cellulose triacetate supports, as illustrated by Fordyce et al U.S. Pat. Nos. 2,492,977, '978 and 2,739,069, as well as mixed cellulose ester supports, such as cellulose acetate propionate and cellulose acetate butyrate, as illustrated by Fordyce et al U.S. Pat. No. 2,739,070.

Preferred polyester film supports are comprised of linear polyester, such as illustrated by Alles et al U.S. Pat. No. 2,627,088, Wellman U.S. Pat. No. 2,720,503, Alles U.S. Pat. No. 2,779,684 and Kibler et al U.S. Pat. No. 2,901,466. Polyester films can be formed by varied techniques, as illustrated by Alles, cited above, Czerkas et al U.S. Pat. No. 3,663,683 and Williams et al U.S. Pat. No. 3,504,075, and modified for use as photographic film supports, as illustrated by Van Stappen U.S. Pat. No. 3,227,576, Nadeau et al U.S. Pat. No. 3,501,301, Reedy et al U.S. Pat. No. 3,589,905, Babbitt et al U.S. Pat. No. 3,850,640, Bailey et al U.S. Pat. No. 3,888,678, Hunter U.S. Pat. No. 3,904,420 and Mallinson and et al U.S. Pat. No. 3,928,697.

The elements can employ supports which are resistant to dimensional change to elevated temperatures. Such supports can be comprised of linear condensation polymers which have glass transition temperatures above about 190° C., preferably 220° C., such as polycarbonates, polycarboxylic esters, polyamides, polysulfonamides, polyethers, polyimides, polysulfonates and copolymers variants, as illustrated by Hamb U.S. Pat. Nos. 3,634,089 and 3,772,405; Hamb et al U.S. Pat. Nos. 3,725,070 and 3,793,249; Gottermeier U.S. Pat. No. 4,076,532; Wilson *Research Disclosure,* Vol. 118, February 1974, Item 11833, and Vol. 120, April 1974, Item 12046; Conklin et al *Research Disclosure,* Vol. 120, April 1974, Item 12012; *Product Licensing Index*, Vol. 92, December 1971, Items 9205 and 9207; *Research Disclosure*, Vol. 101, September 1972, Items 10119 and 10148; *Research Disclosure*, Vol. 106, February 1973, Item 10613; *Research Disclosure*, Vol. 117, January 1974, Item 11709, and *Research Disclosure*, Vol. 134, June 1975, Item 13455.

The second support elements which define the lateral walls of the reaction microvessels can be selected from a variety of materials lacking sufficient structural strength to be employed alone as supports. It is specifically contemplated that the second support elements can be formed using conventional photopolymerizable or photocrosslinkable materials—e.g., photoresists. Exemplary conventional photoresists are disclosed by Arcesi et al U.S. Pat. Nos. 3,640,722 and 3,748,132, Reynolds et al U.S. Pat. Nos. 3,696,072 and 3,748,131, Jenkins et al U.S. Pat. Nos. 3,699,025 and '026, Borden U.S. Pat. No. 3,737,319, Noonan et al U.S. Pat. No. 3,748,133, Wadsworth et al U.S. Pat. No. 3,779,989, DeBoer U.S. Pat. No. 3,782,938, and Wilson U.S. Pat. No. 4,052,367. Still other useful photopolymerizable and photocrosslinkable materials are disclosed by Kosar, *Light-Sensitive Systems: Chemistry and Application of Nonsilver Halide Photographic Processes*, Chapters 4 and 5, John Wiley and Sons, 1965. It is also contemplated that the second support elements can be formed using radiation-responsive colloid compositions, such as dichromated colloids—e.g., dichromated gelatin, as illustrated by Chapter 2, Kosar, cited above. The second support elements can also be formed using silver halide emulsions and processing in the presence of transition metal ion complexes, as illustrated by Bissonette U.S. Pat. No. 3,856,524 and McGuckin U.S. Pat. No. 3,862,855. The advantage of using radiation-sensitive materials to form the second support elements is that the lateral walls and reaction microvessels can be simultaneously defined by patterned exposure. Once formed the second support elements are not themselves further responsive to exposing radiation.

It is contemplated that the second support elements can alternatively be formed of materials commonly employed as vehicles and/or binders in radiation-sensitive materials. The advantage of using vehicle or binder materials is their known compatibility with the radiation-sensitive materials. The binders and/or vehicles can be polymerized or hardened to a somewhat higher degree than when employed in radiation-sensitive materials to insure dimensional integrity of the lateral walls which they form. Illustrative of specific binder and vehicle materials are those employed in silver halide emulsions, more specifically described below.

The light transmission, absorption and reflection qualities of the support elements can be varied for different photographic applications. The support elements can be substantially transparent or reflective, preferably white, as are the majority of conventional photographic supports. The support elements can be reflective, such as by mirroring the reaction microvessel walls. The support elements can in some applications contain dyes or pigments to render them substantially light impenetrable. Levels of dye or pigment incorporation can be chosen to retain the light transmission characteristics in the thinner regions of the support elements—e.g., in the microvessel bottom wall region—while rendering the support elements relatively less light penetrable in thicker region—e.g., in the lateral wall regions between adjacent microvessels. The support elements can contain neutral colorant or colorant combinations. Alternatively, the support elements can contain radiation absorbing materials which are selective to a single region of the electromagnetic spectrum—e.g., blue dyes. The support elements can contain materials which alter radiation transmission qualities, but are not visible, such as ultraviolet absorbers. Where two support elements are employed in combination, the light transmission, absorption and reflection qualities of the two support elements can be the same or different. The unique advantages of varied forms of the support elements can be better appreciated by reference to the illustrative embodiments described below.

Where the support elements are formed of conventional photographic support materials they can be provided with reflective and absorbing materials by techniques well known by those skilled in the art, such techniques being adequately illustrated in the various patents cited above in relation to support materials. In addition, reflective and absorbing materials can be employed of varied types conventionally incorporated directly in radiation-sensitive materials, particularly in second support elements formed of vehicle and/or binder materials or using photoresists or dichromated gelatin. The incorporation of pigments of high reflection index in vehicle materials is illustrated, for example, by Marriage U.K. Pat. No. 504,283 and Yutzy et al U.K. Pat. No. 760,775. Absorbing materials incorporated in vehicle materials are illustrated by Jelley et al U.S. Pat. No. 2,697,037; colloidal silver (e.g., Carey Lea Silver widely used as a filter for blue light); super fine silver halide used to improve sharpness, as illustrated by U.K. Pat. No. 1,342,687; finely divided carbon used to improve sharpness or for antihalation protection, as illustrated by Simmons U.S. Pat. No. 2,327,828; filter and antihalation dyes, such as the pyrazolone oxonol dyes of Gaspar U.S. Pat. No. 2,274,782, the solubilized diaryl azo dyes of Van Campen U.S. Pat. No. 2,956,879, the solubilized styryl and butadienyl dyes of Heseltine et al U.S. Pat. Nos. 3,423,207 and 3,384,487, the merocyanine dyes of Silberstein et al U.S. Pat. No. 2,527,583, the merocyanine and oxonol dyes of Oliver U.S. Pat. Nos. 3,486,897 and 3,652,284 and Oliver et al U.S. Pat. No. 3,718,472 and the enamino hemioxonol dyes of Brooker et al U.S. Pat. No. 3,976,661 and ultraviolet absorbers, such as the cyanomethyl sulfone-derived merocyanines of Oliver U.S. Pat. No. 3,723,154, the thiazolidones, benzotriazoles and thiazolothiazoles of Sawdey U.S. Pat. Nos. 2,739,888, 3,253,921 and 3,250,617 and Sawdey et al U.S. Pat. No. 2,739,971, the triazoles of Heller et al U.S. Pat. No. 3,004,896 and the hemioxonols of Wahl et al U.S. Pat. No. 3,125,597 and Weber et al U.S. Pat. No. 4,045,229. The dyes and ultraviolet absorbers can be mordanted, as illustrated by Jones et al U.S. Pat. No. 3,282,699 and Heseltine et al U.S. Pat. Nos. 3,455,693 and 3,438,779.

Illustrative Materials for Imaging Portions of Elements

The radiation-sensitive portions of conventional photographic elements are typically coated onto a planar support surface in the form of one or more continuous layers of substantially uniform thickness. The radiation-sensitive portions of the photographic elements of this invention can be selected from among such conventional radiation-sensitive portions which, when coated as one or more layers of substantially uniform thickness, exhibit the characteristics of undergoing (1) an imagewise change in optical density or mobility in response to imagewise exposure and/or photographic processing, and (2) visually detectable lateral image spreading in translating an imaging exposure to a viewable form. Lateral image spreading has been observed in a wide variety of conventional photographic elements. Lateral image spread can be a product of optical phenomena, such as reflection or scattering of exposing radiation; diffusion phenomena, such as lateral diffusion of radiation-sensitive and/or imaging materials in the radiation-sensitive and/or imaging layers of the photographic elements; or, most commonly, a combination of both. Lateral image spreading is particularly common where the radiation-sensitive and/or other imaging materials are dispersed in a vehicle or binder intended to be penetrated by exposing radiation and/or processing fluids.

The radiation-sensitive portions of the photographic elements of this invention can be of a type which contain within a single component, corresponding to a layer of a conventional photographic element, radiation-sensitive materials capable of directly producing or being processed to produce a visible image by undergoing a change in optical density of mobility or a combination of radiation-sensitive materials and imaging materials which together similarly produce directly or upon processing a viewable image. The radiation-sensitive portion can be formed alternatively of two or more components, corresponding to two or more layers of a conventional photographic element, which together contain radiation-sensitive and imaging materials. Where two or more components are present, only one of the components need be radiation-sensitive and only one of the components need be an imaging component. Further, either the radiation-sensitive component or the imaging component of the radiation-sensitive portion of the element can be solely responsible for lateral image spreading when conventionally coated as a continuous, substantially uniform thickness layer. In one form, the radiation-sensitive portion can be of a type which permits a viewable image to be formed directly therein. In another form, the image produced is not directly viewable in the element itself, but can be viewed in a separate element. For example, the image can be of a type which is viewed as a transferred image in a separate receiver element.

In one form, the radiation-sensitive portion of the photographic element can take the form of a material which relies upon a dye to provide a visible coloration, the coloration being created, destroyed or altered in its light absorption characteristic in response to imagewise exposure and processing. A dye is tyically either formed or destroyed in response to imaging exposure and processing. In an exemplary form, the radiation-sensitive portion can be formed of an imaging composition containing a photoreductant and an imaging material. The photoreductant can be a material which is activated by imagewise light exposure along or in combination with heat and/or a base (typically ammonia) to produce a reducing agent. In some forms, a hydrogen source is incorporated within the photoreductant itself (i.e., an internal hydrogen source) or externally provided. Exemplary photoreductants include materials such as 2H-benzimidazoles, disulfides, phenazinium salts, diazoanthrones, β-ketosulfides, nitroarenes and quinones (particularly internal hydrogen source quinones), while the reducible imaging materials include aminotriarylmethane dyes, azo dyes, xanthene dyes, triazine dyes, nitroso dye complexes, indigo dyes, phthalocyanine dyes, tetrazolium salts and triazolium salts. Such radiation-sensitive materials and processes for their use are more specifically disclosed by Bailey et al U.S. Pat. No. 3,880,659, Bailey U.S. Pat. Nos. 3,887,372 and 3,917,484, Fleming et al U.S. Pat. No. 3,887,374 and Schleigh U.S. Pat. Nos. 3,894,874 and 3,880,659, the disclosures of which are here incorporated by reference.

In another form, the radiation-sensitive portion of the photographic element can include a cobalt(III) complex which can produce images in various known combinations. The cobalt(III) complexes are themselves responsive to imaging exposures in the ultraviolet portion of the spectrum. They can also be spectrally sensitized to respond to the visible portion of the spectrum. In still another variant form, they can be employed in combination with photoreductants, such as those described above, to produce images. The cobalt(III) complexes can be employed in compositions such as those disclosed by Hickman et al U.S. Pat. Nos. 1,897,843 and 1,962,307 and Weyde U.S. Pat. No. 2,084,420 to produce metal sulfide images. The cobalt(III) complexes typically include ammine or amine ligands which are released upon exposure of the complexes to actinic radiation and, usually, heating. The radiation-sensitive portion of the photographic element can include in the same component as the cobalt(III) complex or in an adjacent component of the same element or a separate element, materials which are responsive to a base, particularly ammonia, to produce an image. For example, materials such as phthaladehyde and ninhydrin printout upon contact with ammonia. A number of dyes, such as certain types of cyanine, styryl, rhodamine and azo dyes, are known to be capable of being altered in color upon contact with a base. Dyes, such as pyrylium dyes, capable of being rendered transparent upon contact with ammonia, are preferred. By proper selection of chelating compounds employed in combination with the cobalt(III) complexes internal amplification can be achieved. These and other imaging compositions and techniques employing cobalt(III) complexes to form images are disclosed in *Research Disclosure,* Vol. 126, Item 12617, published October, 1974; Vol. 130, Item 13023, published February, 1975; and Vol. 135, Item 13523, published July, 1975; as well as in DoMinh U.S. Pat. No. 4,075,019, Enriquez U.S. Pat. No. 4,057,427 and Adin U.S. Ser. No. 865,275, filed Dec. 28, 1977, the disclosures of which are here incorporated by reference.

The radiation-sensitive portion of the photographic element can include diazo imaging materials. Diazo materials can initially incorporate both a diazonium salt and an ammonia activated coupler (commonly referred to as two component diazo systems) or can initially incorporate only the diazonium salt and rely upon subsequent processing to imbibe the coupler (commonly referred to as one-component diazo systems). Both one-component and two-component diazo systems can be employed in the practice of this invention. Typically, diazo photographic elements are first imagewise exposed to ultraviolet light to activate radiation-struck areas and then uniformly contacted with ammonia to printout a positive image. Diazo materials and processes for their use are described in Chapter 6, Kosar, cited above.

Since diazo materials employ ammonia processing, it is apparent that diazo materials can be employed in combination with cobalt(III) complexes which release ammonia. Where the cobalt(III) complex forms one component of the radiation-sensitive portion of the photographic element, the diazo component can either form a second component or be part of a separate element which is placed adjacent the cobalt(III) complex containing component during the ammonia releasing step. Using combinations of visible and/or ultraviolet exposures, positive or negative diazo images can be formed, as is more particularly described in the publications and patents cited above in relation to cobalt(III) complex containing materials, particularly DoMinh U.S. Pat. No. 4,075,019.

The photographic elements of this invention can include those which photographically form or inactivate a physical development catalyst in an imagewise manner. Following creation of the physical development catalyst image, solvated metal ions can be electrolessly plated at the catalyst image site to form a viewable metallic image. A variety of metals, such as silver, copper, nickel, cobalt, tin, lead and indium, have been employed in physical development imaging. In a positive-working form a uniform catalyst is imagewise inactivated. Such a system is illustrated by Hanson et al U.S. Pat. No. 3,320,064, in which a mixture of a light-sensitive organic azide with a thioether coupler is imagewise exposed to inactivate a uniform catalyst in exposed areas. Subsequent electroless plating produces a positive image.

Negative-working physical development systems which form catalyst images include those which form catalyst images by disproportionation of metal ions and those which form catalyst images by reduction of metal ions. A preferred disproportionation catalyst imaging approach is to imagewise expose a diazonium salt, such as used in diazo imaging, described above, to form with mercury or silver ions a metal salt which can be disproportionated to form a catalyst image, as is illustrated by Dippel et al U.S. Pat. No. 2,735,773 and de Jonge et al U.S. Pat. Nos. 2,764,484, 2,686,643 and 2,923,626. Disproportionation imaging to form copper nuclei for physical development is disclosed by Hilson et al U.S. Pat. No. 3,700,448. Disproportionation to produce a mercury catalyst image can also be achieved by exposing a mixture of mercuric chloride and an oxalate, as illustrated by Slifkin U.S. Pat. No. 2,459,136. Reduction of metal ions to form a catalyst can be achieved by exposing a diazonium compound in the presence of water to produce a phenol reducing agent, as illustrated by Jonker et al U.S. Pat. No. 2,738,272. Zinc oxide and titanium oxide particles can be dispersed in a binder to provide a catalytic surface for photoreduction, as illustrated by Levinos U.S. Pat. No. 3,052,541. Zinc oxide and titanium oxide can also be dispersed in a binder with an oxidation-reduction image-forming combination, such as silver nitrate and a suitable reducing agent, as described in Shepard et al U.S. Pat. No. 3,152,903. Lead acetate employed in combination with silver nitrate is disclosed in de Boer et al U.S. Pat. No. 2,057,016. Silver halide photographic elements, discussed below, constitute one specifically contemplated class of photographic elements which can be used for physical development imaging. Physical development imaging systems useful in the practice of this invention are generally illustrated by Jonker et al, "Physical Development Recording Systems. I. General Survey and Photochemical Principles", *Photographic Science and Engineering*, Vol. 13, No. 1, January-February, 1969, pages 1 through 8, the disclosure of which is here incorporated by reference.

Other types of radiation-sensitive imaging systems can, of course, be employed in the practice of this invention. Illustrative nonsilver imaging systems are disclosed by Kosar, *Light-Sensitive Systems: Chemistry and Application of Nonsilver Halide Photographic Processes*, John Wiley & Sons, 1956, here incorporated by reference.

The radiation-sensitive silver halide containing imaging portions of the photographic elements of this invention can be of a type which contain within a single component, corresponding to a layer of a conventional silver halide photographic element, radiation-sensitive silver halide capable of directly producing or being processed to produce a visible image or a combination of radiation-sensitive silver halide and imaging materials which together produce directly or upon processing a viewable image. The imaging portion can be formed alternatively of two or more components, corresponding to two or more layers of a conventional photographic element, which together contain radiation-sensitive silver halide and imaging materials. Where two or more components are present, only one of the components need contail radiation-sensitive silver halide and only one of the components need be an imaging component. Further, either the radiation-sensitive silver halide containing component or the imaging component of the imaging portion of the element can be primarily responsible for lateral image spreading when conventionally coated as a continuous, substantially uniform thickness layer. In one form the radiation-sensitive silver halide containing portion can be of a type which permits a viewable image to be formed directly therein. In another form the image produced is not directly viewable in the element itself, but can be viewed in a separate element. For example, the image can be of a type which is viewed as a transferred image in a separate receiver element.

In a preferred form the radiation-sensitive silver halide containing imaging portions of the photographic elements are comprised of one or more silver halide emulsions. The silver halide emulsions can be comprised of silver bromide, silver chloride, silver iodide, silver chlorobromide, silver chloroiodide, silver bromoiodide, silver chlorobromoiodide or mixtures thereof. The emulsions can include coarse, medium or fine silver halide grains bounded by 100, 111 or 110 crystal planes and can be prepared by a variety of techniques—e.g., single-jet, double-jet (including continuous removal techniques), accelerated flow rate and interrupted precipitation techniques, as illustrated by Trivelli and Smith, *The Photographic Journal*, vol. LXXIX, May, 1939, pp. 330–338, T. H. James, *The Theory of the Photographic Process*, 4th Ed., Macmillan, 1977, Chapter 3, Terwilliger et al *Research Disclosure*, Vol. 149, September 1976, Item 14987, as well as Nietz et al U.S. Pat. No. 2,222,264, Wilgus German OLS 2,107,118, Lewis U.K. Pat. Nos. 1,335,925, 1,430,465 and 1,469,480, Irie et al U.S. Pat. No. 3,650,757, Kurz U.S. Pat. No. 3,672,900, Morgan U.S. Pat. No. 3,917,485, Musliner U.S. Pat. No. 3,790,387, Evans U.S. Pat. No. 3,761,276 and Gilman et al U.S. Pat. No. 3,979,213. Sensitizing compounds, such as compounds of copper, thallium, lead, bismuth, cadmium and Group VIII noble metals, can be present during precipitation of the silver halide emulsion, as illustrated by Arnold et al U.S. Pat. No. 1,195,432, Hochstetter U.S. Pat. No. 1,951,933, Tivelli et al U.S. Pat. No. 2,448,060, Overman U.S. Pat. No. 2,628,167, Mueller et al U.S. Pat. No. 2,950,972, Sidebotham U.S.

Pat. No. 3,488,709 and Rosecrants et al U.S. Pat. No. 3,737,313.

The silver halide emulsions can be either monodispersed or polydispersed. The grain size distribution of the emulsions can be controlled by silver halide grain separation techniques or by blending silver halide emulsions of differing grain sizes. The emulsions can include Lippmann emulsions and ammoniacal emulsions, as illustrated by Glafkides, *Photographic Chemistry,* Vol. 1, Fountain Press, London, 1958, pp. 365–368 and pp. 301–304; thiocyanate ripened emulsions, as illustrated by Illingsworth U.S. Pat. No. 3,320,069; thioether ripened emulsions, as illustrated by McBride U.S. Pat. No. 3,271,157, Jones U.S. Pat. No. 3,574,628 and Rosecrants et al U.S. Pat. No. 3,737,313 or emulsions containing weak silver halide solvents, such as ammonium salts, as illustrated by Perignon U.S. Pat. No. 3,784,381 and *Research Disclosure,* Vol. 134, June 1975, Item 13452.

The emulsions can be surface-sensitive emulsions—i.e., emulsions that form latent images primarily on the surfaces of the silver halide grains—or internal latent image-forming emulsions—i.e., emulsions that form latent images predominantly in the interior of the silver halide grains, as illustrated by Knott et al U.S. Pat. No. 2,456,953, Davey et al U.S. Pat. No. 2,592,250, Porter et al U.S. Pat. Nos. 3,206,313 and 3,317,322, Berriman U.S. Pat. No. 3,367,778, Bacon et al U.S. Pat. No. 3,447,927, Evans U.S. Pat. No. 3,761,276, Morgan U.S. Pat. No. 3,917,485, Gilman et al U.S. Pat. No. 3,979,213, Miller U.S. Pat. No. 3,767,413.

The emulsions can be negative-working emulsions, such as surface-sensitive emulsions or unfogged internal latent image-forming emulsions, or direct-positive emulsions of the surface fogged type, as illustrated by Kendall et al U.S. Pat. No. 2,541,472, Shouwenaars U.K. Pat. No. 723,019, Illingsworth U.S. Pat. No. 3,501,307, Berriman U.S. Pat. No. 3,367,778, *Research Disclosure,* Vol. 134, June 1975, Item 13452, Kurz U.S. Pat. No. 3,672,900, Judd et al U.S. Pat. No. 3,600,180 and Taber et al U.S. Pat. No. 3,647,463, or of the unfogged, internal latent image-forming type, which are positive-working with fogging development, as illustrated by Ives U.S. Pat. No. 2,563,785, Evans U.S. Pat. No. 3,761,276, Knott et al U.S. Pat. No. 2,456,953 and Jouy U.S. Pat. No. 3,511,662.

Combinations of surface-sensitive emulsions and internally fogged, internal latent image-forming emulsions can be employed, as illustrated by Luckey et al U.S. Pat. Nos. 2,996,382, 3,397,987 and 3,705,858, Luckey U.S. Pat. No. 3,695,881, *Research Disclosure,* Vol. 134, June 1975, Item 13452, Millikan et al Defensive Publication T-904017, Apr. 21, 1972 and Kurz *Research Disclosure,* Vol. 122, June 1974, Item 12233.

The silver halide emulsions can be unwashed or washed to remove soluble salts. The soluble salts can be removed by chill setting and leaching, as illustrated by Craft U.S. Pat. No. 2,316,845 and McFall et al U.S. Pat. No. 3,396,027; by coagulation washing, as illustrated by Hewitson et al U.S. Pat. No. 2,618,556, Yutzy et al U.S. Pat. No. 2,614,928, Yackel U.S. Pat. No. 2,565,418, Hart et al U.S. Pat. No. 3,241,969, Waller et al U.S. Pat. No. 2,489,341, Klinger U.K. Pat. No. 1,305,409 and Dersch et al U.K. Pat. No. 1,167,159; by centrifugation and decantation of a coagulated emulsion, as illustrated by Murray U.S. Pat. No. 2,463,794, Ujihara et al U.S. Pat. No. 3,707,378, Audran U.S. Pat. No. 2,996,287 and Timson U.S. Pat. No. 3,498,454; by employing hydrocyclones alone or in combination with centrifuges, as illustrated by U.K. Pat. No. 1,336,692, Claes U.K. Pat. No. 1,356,573 and Ushomirskii et al *Soviet Chemical Industry,* Vol. 6, No. 3, 1974, pp. 181–185; by diafiltration with a semipermeable membrane, as illustrated by *Research Disclosure,* Vol. 102, October 1972, Item 10208, Hagemaier et al *Research Disclosure* Vol. 131, March 1975, Item 13122, Bonnet *Research Disclosure,* Vol. 135, July 1975, Item 13577, Berg et al German OLS No. 2,436,461 and Bolton U.S. Pat. No. 2,495,918 or by employing an ion exchange resin, as illustrated by Maley U.S. Pat. No. 3,782,953 and Noble U.S. Pat. No. 2,827,428. The emulsions, with or without sensitizers, can be dried and stored prior to use as illustrated by *Research Disclosure,* Vol. 101, September 1972, Item 10152.

The silver halide emulsions and associated layers and components of the photographic elements can contain various colloids alone or in combination as vehicles. Suitable hydrophilic materials include both naturally occurring substances such as proteins, protein derivatives, cellulose derivatives—e.g., cellulose esters, gelatin—e.g., alkali-treated gelatin (cattle bone or hide gelatin) or acid-treated gelatin (pigskin gelatin), gelatin derivatives—e.g., acetylated gelatin, phthalated gelatin and the like, polysaccharides such as dextran, gum arabic, zein, casein, pectin, callagen derivatives, collodion, agar-agar, arraowaroot, albumin and the like as described in Yutzy et al U.S. Pat. Nos. 2,614,928 and '929, Lowe et al U.S. Pat. Nos. 2,691,582, 2,614,930, '931, 2,327,808 and 2,448,534, Gates et al U.S. Pat. Nos. 2,787,545 and 2,956,880, Himmelmann et al U.S. Pat. No. 3,061,436, Farrell et al U.S. Pat. No. 2,816,027, Ryan U.S. Pat. Nos. 3,132,945, 3,138,461 and 3,186,846, Dersch et al U.K. Pat. No. 1,167,159 and U.S. Pat. Nos. 2,960,405 and 3,436,220, Geary U.S. Pat. No. 3,486,896, Gazzard U.K. Pat. No. 793,549, Gates et al U.S. Pat. Nos. 2,992,213, 3,157,506, 3,184,312 and 3,539,353, Miller et al U.S. Pat. No. 3,227,571, Boyer et al U.S. Pat. No. 3,532,502, Malan U.S. Pat. No. 3,551,151, Lohmer et al U.S. Pat. No. 4,018,609, Luciani et al U.K. Pat. No. 1,186,790, U.K. Pat. No. 1,489,080 and Hori et al Belgian Pat. No. 856,631, U.K. Pat. No. 1,490,644, U.K. Pat. No. 1,483,551, Arase et al U.K. Pat. No. 1,459,906, Salo U.S. Pat. Nos. 2,110,491 and 2,311,086, Fallesen U.S. Pat. No. 2,343,650, Yutzy U.S. Pat. No. 2,322,085, Lowe U.S. Pat. No. 2,563,791, Talbot et al U.S. Pat. No. 2,725,293, Hilborn U.S. Pat. No. 2,748,022, DePauw et al U.S. Pat. No. 2,956,883, Ritchie U.K. Pat. No. 2,095, DeStubner U.S. Pat. No. 1,752,069, Sheppard et al U.S. Pat. No. 2,127,573, Lierg U.S. Pat. No. 2,256,720, Gaspar U.S. Pat. No. 2,361,936, Farmer U.K. Pat. No. 15,727, Stevens U.K. Pat. No. 1,062,116 and Yamamoto et al U.S. Pat. No. 3,923,517.

The silver halide emulsions and associated layers and components of the photographic elements can also contain alone or in combination with hydrophilic water permeable colloids as vehicles or vehicle extenders (e.g., in the form of latices), synthetic polymeric peptizers, carriers and/or binders such as poly(vinyl lactams), acrylamide polymers, polyvinyl alcohol and its derivatives, polyvinyl acetals, polymers of alkyl and sulfoalkyl acrylates and methacrylates, hydrolyzed polyvinyl acetates, polyamides, polyvinyl pyridine, acrylic acid polymers, maleic anhydride copolymers, polyalkylene oxides, methacrylamide copolymers, polyvinyl oxazolidinones, maleic acid copolymers, vinylamine copolymers, methacrylic acid copolymers, acryloyloxyalkylsulfonic acid copolymers, sulfoalkylacrylamide copolymers, polyalkyleneimine copolymers, polyamines, N,N-dialkylaminoalkyl acrylates, vinyl imidazole copolymers, vinyl sulfide copolymers, halogenated styrene polymers, amineacrylamide polymers, polypeptides and the like as described in Hollister et al U.S. Pat. Nos. 3,679,425, 3,706,564 and 3,813,251, Lowe U.S. Pat. Nos. 2,253,078, 2,276,322, '323, 2,281,703, 2,311,058 and 2,414,207, Lowe et al U.S. pat. Nos. 2,484,456, 2,541,474 and 2,632,704, Perry et al U.S. Pat. No. 3,425,836, Smith et al U.S. Pat. Nos. 3,415,653 and 3,615,624, Smith U.S. Pat. No. 3,488,708, Whiteley et al U.S. Pat. Nos. 3,392,025 and 3,511,818, Fitzgerald U.S. Pat. Nos. 3,681,079, 3,721,565, 3,852,073, 3,861,918 and 3,925,083, Fitzgerald et al U.S. Pat. No. 3,879,205, Nottorf U.S. Pat. No. 3,142,568, Houck et al U.S. Pat. Nos. 3,062,674 and 3,220,844, Dann et al U.S. Pat. No. 2,882,161, Schupp U.S. Pat. No. 2,579,016, Weaver U.S. Pat. No. 2,829,053, Alles et al U.S. Pat. No. 2,698,240, Priest et al U.S. Pat. No. 3,003,879, Merrill et al U.S. Pat. No. 3,419,397, Stonham U.S. Pat. No. 3,284,207, Lohmer et al U.S. Pat. No. 3,167,430, Williams U.S. Pat. No. 2,957,767, Dawson et al U.S. Pat. No. 2,893,867, Smith et al U.S. Pat. Nos. 2,860,986 and 2,904,539, Ponticello et al U.S. Pat. Nos. 3,929,482 and 3,860,428, Ponticello U.S. Pat. No. 3,939,130, Dykstra U.S. Pat. No. 3,411,911 and Dykstra et al Canadian Pat. No. 774,054, Ream et al U.S. Pat. No. 3,287,289, Smith U.K. Pat. No. 1,466,600, Stevens U.K. Pat. No. 1,062,116, Fordyce U.S. Pat. No. 2,211,323, Martinez U.S. Pat. No. 2,284,877, Watkins U.S. Pat. No. 2,420,455, Jones U.S. Pat. No. 2,533,166, Bolton U.S. Pat. No. 2,495,918, Graves U.S. Pat. No. 2,289,775, Yackel U.S. Pat. No. 2,565,418, Unruh et al U.S. Pat. Nos. 2,865,893 and 2,875,059, Rees et al U.S. Pat. No. 3,536,491, Broadhead et al U.K. Pat. No. 1,348,815, Taylor et al U.S. Pat. No. 3,479,186, Merrill et al U.S. Pat. No. 3,520,857, Bacon et al U.S. Pat. No. 3,690,888, Bowman U.S. Pat. No. 3,748,143, Dickinson et al U.K. Pat. Nos. 808,227 and '228, Wood U.K. Pat. No. 822,192 and Iguchi et al U.K. Pat. No. 1,398,055.

The components of the photographic elements containing crosslinkable colloids, particularly the gelatin-containing layers, can be hardened by various organic and inorganic hardeners, such as those described in T. H. James, *The Theory of the Photographic Process,* 4th Ed., MacMillan, 1977, pp. 77–87. The hardeners can be used alone or in combination and in free or in blocked form.

Typical useful hardeners include formaldehyde and free dialdehydes, such as succinaldehyde and glutaraldehyde, as illustrated by Allen et al U.S. Pat. No. 3,232,764; blocked dialdehydes, as illustrated by Kaszuba U.S. Pat. No. 2,586,168, Jeffreys U.S. Pat. No. 2,870,013, and Yamamoto et al U.S. Pat. No. 3,819,608; α-diketones, as illustrated by Allen et al U.S. Pat. No. 2,725,305; active esters of the type described by Burness et al U.S. Pat. No. 3,542,558; sulfonate esters, as illustrated by Allen et al U.S. Pat. Nos. 2,725,305 and 2,726,162; active halogen compounds, as illustrated by Burness U.S. Pat. No. 3,106,468, Silverman et al U.S. Pat. No. 3,839,042, Ballantine et al U.S. Pat. No. 3,951,940 and Himmelmann et al U.S. Pat. No. 3,174,861; s-triazines and diazines, as illustrated by Yamamoto et al U.S. Pat. No. 3,325,287, Anderau et al U.S. Pat. No. 3,288,775 and Stauner et al U.S. Pat. No. 3,992,366; epoxides, as illustrated by Allen et al U.S. Pat. No. 3,047,394, Burness U.S. Pat. No. 3,189,459 and Birr et al German Pat. No. 1,085,663; aziridines, as illustrated by Allen et al U.S. Pat. No. 2,950,197, Burness et al U.S. Pat. No. 3,271,175 and Sato et al U.S. Pat. No. 3,575,705; active olefins having two or more active bonds, as illustrated by Burness et al U.S. Pat. Nos. 3,490,911, 3,539,644 and 3,841,872 (Reissue 29,305), Cohen U.S. Pat. No. 3,640,720, Kleist et al German Pat. No. 872,153 and Allen U.S. Pat. No. 2,992,109; blocked active olefins, as illustrated by Burness et al U.S. Pat. No. 3,360,372 and Wilson U.S. Pat. No. 3,345,177; carbodiimides, as illustrated by Blout et al German Pat. No. 1,148,446; isoxazolium salts unsubstituted in the 3-position, as illustrated by Burness et al U.S. Pat. No. 3,321,313; esters of 2-alkoxy-N-carboxydihydroquinoline, as illustrated by Bergthaller et al U.S. Pat. No. 4,013,468; N-carbamoyl and N-carbamoyloxypyridinium salts, as illustrated by Himmelmann U.S. Pat. No. 3,880,665; hardeners of mixed function, such as halogen-substituted aldehyde acids (e.g., mucochloric and mucobromic acids), as illustrated by White U.S. Pat. No. 2,080,019, 'onium substituted acroleins, as illustrated by Tschopp et al U.S. Pat. No. 3,792,021, and vinyl sulfones containing other hardening functional groups, as illustrated by Sera et al U.S. Pat. No. 4,028,320; and polymeric hardeners, such as dialdehyde starches, as illustrated by Jeffreys et al U.S. Pat. No. 3,057,723, and copoly(acrolein-methacrylic acid), as illustrated by Himmelmann et al U.S. Pat. No. 3,396,029.

The use of hardeners in combination is illustrated by Sieg et al U.S. Pat. No. 3,497,358, Dallon et al U.S. Pat. No. 3,832,181 and 3,840,370 and Yamamoto et al U.S. Pat. No. 3,898,089. Hardening accelerators can be used, as illustrated by Sheppard et al U.S. Pat. No. 2,165,421, Kleist German Pat. No. 881,444, Riebel et al U.S. Pat. No. 3,628,961 and Ugi et al U.S. Pat. No. 3,901,708.

The silver halide emulsions can be chemically sensitized with active gelatin, as illustrated by T. H. James, *The Theory of the Photographic Process,* 4th Ed., Macmillan, 1977, pp. 67–76, or with sulfur, selenium, tellurium, gold, platinum, palladium, iridium, osmium, rhenium or phosphorus sensitizers or combinations of these sensitizers, such as at pAg levels of from 5 to 10, pH levels of from 5 to 8 and temperatures of from 30° to 80° C., as illustrated by *Research Disclosure,* Vol. 120, April 1974, Item 12008, *Research Disclosure,* Vol. 134, June 1975, Item 13452, Sheppard et al U.S. Pat. No. 1,623,499, Matthies et al U.S. Pat. No. 1,673,522, Waller et al U.S. Pat. No. 2,399,083, Damshroder et al U.S. Pat. No. 2,642,361, McVeigh U.S. Pat. No. 3,297,447, Dunn U.S. Pat. No. 3,297,446, McBride U.K. Pat. No. 1,315,755, Berry et al U.S. Pat. No. 3,772,031, Gilman et al U.S. Pat. No. 3,761,267, Ohi et al U.S. Pat. No. 3,857,711, Klinger et al U.S. Pat. No. 3,565,633 and Oftedahl U.S. Pat. Nos. 3,901,714 and 3,904,415. Additionally or alternatively, the emulsions can be reduction sensitized—e.g., with hydrogen, as illustrated by Janusonis U.S. Pat. No. 3,891,446 and Babcock et al U.S. Pat. No. 3,984,249, by low pAg (e.g., less than 5) high pH (e.g., greater than 8) treatment or through the use of reducing agents, such as stannous chloride, thiourea dioxide, polyamines and amineboranes, as illustrated by Allen et al U.S. Pat. No. 2,983,609, Oftedahl et al *Research Disclosure,* Vol. 136, August 1975, Item 13654, Lowe et al U.S. Pat. No. 2,518,698, Roberts et al U.S. Pat. No. 2,743,182, Chambers et al U.S. Pat. No. 3,026,203 and Bigelow et al U.S. Pat. No. 3,361,564.

The silver halide emulsions can be spectrally sensitized with dyes from a variety of classes, including the polymethine dye class, which includes the cyanines, merocyanines, complex cyanines and merocyanines (i.e., tri-, tetra-, and poly-nuclear cyanines and merocyanines), oxonols, hemioxonols, styryls, merostyryls and streptocyanines.

The cyanine spectral sensitizing dyes include, joined by a methine linkage, two basic heterocyclic nuclei, such as those derived from quinolinium, pyridinium, isoquinolinium, 3H-indolium, benz[e]indolium, oxazolium, thiazolium, selenazolinium, imidazolium, benzoxazolinium, benzothiazolium, benzoselenazolium, benzimidazolium, naphthoxazolium, naphthothiazolium, naphthoselenazolium, thiazolinium dihydronaphthothiazolium, pyrylium and imidazopyrazinium quaternary salts.

The merocyanine spectral sensitizing dyes include, joined by a methine linkage, a basic heterocyclic nucleus of the cyanine dye type and an acidic nucleus, such as can be derived from barbituric acid, 2-thiobarbituric acid, rhodanine, hydantoin, 2-thiohydantoin, 4-thiohyantoin, 2-pyrazolin-5-one, 2-isoxazolin-5-one, indan-1,3-dione, cyclohexan-1,3-dione, 1,3-dioxan-4,6-dione, pyrazolin-3,5-dione, pentan-2,4-dione, alkylsulfonyl acetonitrile, malononitrile, isoquinolin-4-one, and chroman-2,4-dione.

One or more spectral sensitizing dyes may be used. Dyes with sensitizing maxima at wavelengths throughout the visible spectrum and with a great variety of spectral sensitivity curve shapes are known. The choice and relative proportions of dyes depends upon the region of the spectrum to which sensitivity is desired and upon the shape of the spectral sensitivity curve desired. Dyes with overlapping spectral sensitivity curves will often yield in combination a curve in which the sensitivity at each wavelength in the area of overlap is approximately equal to the sum of the sensitivities of the individual dyes. Thus, it is possible to use combinations of dyes with different maxima to achieve a spectral sensitivity curve with a maximum intermediate to the sensitizing maxima of the individual dyes.

Combinations of spectral sensitizing dyes can be used which result in supersensitization—that is, spectral sensitization that is greater in some spectral region than that from any concentration of one of the dyes alone or that which would result from the additive effect of the dyes. Supersensitization can be achieved with selected combinations of spectral sensitizing dyes and other addenda, such as stabilizers and antifoggants, development accelerators or inhibitors, coating aids, brighteners and antistatic agents. Any one of several mechanisms as well as compounds which can be responsible for supersensitization are discussed by Gilman, *Photographic Science and Engineering,* Vol. 18, 1974, pp. 418–430.

Spectral sensitizing dyes also affect the emulsions in other ways. For example, many spectrally sensitizing dyes either reduce (desensitize) or increase photographic speed within the spectral region of inherent sensitivity. Spectral sensitizing dyes can also function as antifoggants or stabilizers, development accelerators or inhibitors, reducing or nucleating agents, and halogen acceptors or electron acceptors, as disclosed in Brooker et al U.S. Pat. No. 2,131,038, Illingsworth et al U.S. Pat. No. 3,501,310, Webster et al U.S. Pat. No. 3,630,749, Spence et al U.S. Pat. No. 3,718,470 and Shiba et al U.S. Pat. No. 3,930,860.

Dyes which desensitize negative-working silver halide emulsions are generally useful as electron accepting spectral sensitizers for fogged direct-positive emulsions. Typical heterocyclic nuclei featured in cyanine and merocyanine dyes well suited for use as desensitizers are derived from nitrobenzothiazole, 2-aryl-1-alkylindole, pyrrolo[2,3-b]pyridine, imidazo[4,5-b]quinoxaline, carbazole, pyrazole, 5-nitro-3H-indole, 2-arylbenzindole, 2-aryl-1,8-trimethyleneindole, 2-heterocyclylindole, pyrylium, benzopyrylium, thiapyrylium, 2-amino-4-aryl-5-thiazole, 2-pyrrole, 2-(nitroaryl)indole, imidazo[1,2-a]pyridine, imidazo[2,1-b]thiazole, imidazo[2,1-b]-1,3,4-thiadiazole, imidazo[1,2-b]pyridazine, imidazo[4,5-b]quinoxaline, pyrrolo[2,3-b]quinoxaline, pyrrolo[2,3-b]pyrazine, 1,2-diarylindole, 1-cyclohexylpyrrole and nitrobenzoselenazole. Such nuclei can be further enhanced as desensitizers by electron-withdrawing substituents, such as nitro, acetyl, benzoyl, sulfonyl, benzosulfonyl and cyano groups.

Sensitizing action and desensitizing action can be correlated to the position of molecular energy levels of a dye with respect to ground state and conduction band energy levels of the silver halide crystals. These energy levels can in turn be correlated to polarographic oxidation and reduction potentials, as discussed in *Photographic Science and Engineering,* Vol. 18, 1974, pp. 49–53 (Sturmer et al), pp. 175–178 (Leubner) and pp. 475–485 (Gilman). Oxidation and reduction potentials can be measured as described by R. J. Cox, *Photographic Sensitivity,* Academic Press, 1973, Chapter 15.

The chemistry of cyanine and related dyes is illustrated by Weissberger and Taylor, *Special Topics of Heterocyclic Chemistry,* John Wiley and Sons, New York, 1977, Chapter VIII; Venkatarama, *The Chemistry of Synthetic Dyes,* Academic Press, New York, 1971, Chapter V; James, *The Theory of the Photographic Process,* 4th Ed., Macmillan, 1977, Chapter 8, and F. M. Hamer, *Cyanine Dyes and Related Compounds,* John Wiley and Sons, 1964.

Among useful spectral sensitizing dyes for sensitizing silver halide emulsions are those found in U.K. Pat. No. 742,112, Brooker U.S. Pat. Nos. 1,846,300, '301, '302, '303, '304, 2,078,233 and 2,089,729, Brooker et al U.S. Pat. Nos. 2,165,338, 2,213,238, 2,493,747, '748, 2,526,632, 2,739,964 (Reissue 24,292), 2,778,823, 2,917,516, 3,352,857, 3,411,916 and 3,431,111, Sprague U.S. Pat. No. 2,503,776, Nys et al U.S. Pat. No. 3,282,933, Riester U.S. Pat. No. 3,660,102, Kampfer et al U.S. Pat. No. 3,660,103, Taber et al U.S. Pat. Nos. 3,335,010, 3,352,680 and 3,384,486, Lincoln et al U.S. Pat. No. 3,397,981, Fumia et al U.S. Pat. Nos. 3,482,978 and 3,623,881, Spence et al U.S. Pat. No. 3,718,470 and Mee U.S. Pat. No. 4,025,349. Examples of useful supersensitizing dye combinations, of non-light absorbing addenda which function as supersensitizers or of useful dye combinations are found in McFall et al U.S. Pat. No. 2,933,390, Jones et al U.S. Pat. No. 2,937,089, Motter U.S. Pat. No. 3,506,443 and Schwan et al U.S. Pat. No. 3,672,898. Among desensitizing dyes useful as spectral sensitizers for fogged direct-positive emulsions are those found in Kendall U.S. Pat. No. 2,293,261, Coenen et al U.S. Pat. No. 2,930,694, Brooker et al U.S. Pat. No. 3,431,111, Mee et al U.S. Pat. Nos. 3,492,123, 3,501,312 and 3,598,595, Illingsworth et al U.S. Pat. No. 3,501,310, Lincoln et al U.S. Pat. No. 3,501,311, VanLare U.S. Pat. No. 3,615,608, Carpenter et al U.S. Pat. No. 3,615,639, Riester et al U.S. Pat. No. 3,567,456, Jenkins U.S. Pat. No. 3,574,629, Jones U.S. Pat. No. 3,579,345, Mee U.S. Pat. No. 3,582,343, Fumia et al U.S.

Pat. No. 3,592,653 and Chapman U.S. Pat. No. 3,598,596.

The silver halide emulsions can include desensitizers which are not dyes, such as N,N'-dialkyl-4,4'-bis-pyridinium salts, nitron and its salts, thiuram disulfide, piazine, nitro-1,2,3-benzothiazole, nitroindazole and 5-mercaptotetrazole, as illustrated by Peterson et al U.S. Pat. No. 2,271,229, Kendall et al U.S. Pat. No. 2,541,472, Abbott et al U.S. Pat. No. 3,295,976, Rees et al U.S. Pat. Nos. 3,184,313 and 3,403,025 and Gibbons et al U.S. Pat. No. 3,922,545.

Instability which increases minimum density in negative type emulsion coatings (i.e., fog) or which increases minimum density or decreases maximum density in direct-positive emulsion coatings can be protected against by incorporation of stabilizers, antifoggants, antikinking agents, latent image stabilizers and similar addenda in the emulsion and contiguous layers prior to coating. Most of the antifoggants which are effective in emulsions can also be used in developers and can be calssified under a few general headings, as illustrated by C. E. K. Mees, *The Theory of the Photographic Process,* 2nd Ed., Macmillan, 1954, pp. 677–680.

To avoid such instability in emulsion coatings stabilizers and antifoggants can be employed, such as halide ions (e.g., bromide salts); chloropalladates and chloropalladites, as illustrated by Trivelli et al U.S. Pat. No. 2,566,263; water-soluble inorganic salts of cadmium, cobalt, manganese and zinc, as illustrated by Jones U.S. Pat. No. 2,839,405 and Sidebotham U.S. Pat. No. 3,488,709; mercury salts, as illustrated by Allen et al U.S. Pat. No. 2,728,663; selenols and diselenides, as illustrated by Brown et al U.K. Pat. No. 1,336,570 and Pollet et al U.K. Pat. No. 1,282,303; quaternary ammonium salts of the type illustrated by Allen et al U.S. Pat. No. 2,694,716, Brooker et al U.S. Pat. No. 2,131,038, Graham U.S. Pat. No. 3,342,596 and Arai et al U.S. Pat. No. 3,954,478; azomethine desensitizing dyes, as illustrated by Thiers et al U.S. Pat. No. 3,630,744; isothiourea derivatives, as illustrated by Herz et al U.S. Pat. No. 3,220,839 and Knott et al U.S. Pat. No. 2,514,650; thiazolidines, as illustrated by Scavron U.S. Pat. No. 3,565,625; peptide derivatives, as illustrated by Maffet U.S. Pat. No. 3,274,002; pyrimidines and 3-pyrazolidones, as illustrated by Welsh U.S. Pat. No. 3,161,515 and Hood et al U.S. Pat. No. 2,751,297; azotriazoles and azotetrazoles, as illustrated by Baldassarri et al U.S. Pat. No. 3,925,086; azaindenes, particularly tetraazaindenes, as illustrated by Heimbach U.S. Pat. No. 2,444,605, Knott U.S. Pat. No. 2,933,388, Williams U.S. Pat. No. 3,202,512, *Research Disclosure,* Vol. 134, June 1975, Item 13452, and Vol. 148, August 1976, Item 14851, and Nepker et al U.K. Pat. No. 1,338,567; mercaptotetrazoles, -triazoles and -diazoles, as illustrated by Kendall et al U.S. Pat. No. 2,403,927, Kennard et al U.S. Pat. No. 3,266,897, *Research Disclosure,* Vol. 116, December 1973, Item 11684, Luckey et al U.S. Pat. No. 3,397,987 and Salesin U.S. Pat. No. 3,708,303; azoles, as illustrated by Peterson et al U.S. Pat. No. 2,271,229 and *Research Disclosure,* Item 11684, cited above; purines, as illustrated by Sheppard et al U.S. Pat. No. 2,319,090, Birr et al U.S. Pat. No. 2,152,460, *Research Discosure,* Item 13452, cited above, and Dostes et al French Pat. No. 2,296,204 and polymers of 1,3-dihydroxy(and/or 1,3-carbamoxy)-2-methylenepropane, as illustrated by Saleck et al U.S. Pat. No. 3,926,635.

Among useful stabilizers for gold sensitized emulsions are water-insoluble gold compounds of benzothiazole, benzoxazole, naphthothiazole and certain merocyanine and cyanine dyes, as illustrated by Yutzy et al U.S. Pat. No. 2,597,915, and sulfinamides, as illustrated by Nishio et al U.S. Pat. No. 3,498,792.

Among useful stabilizers in layers containing poly(alkylene oxides) are tetraazaindenes, particularly in combination with Group VIII noble metals or resorcinol derivatives, as illustrated by Carroll et al U.S. Pat. No. 2,716,062, U.K. Pat. No. 1,466,024 and Habu et al U.S. Pat. No. 3,929,486; quaternary ammonium salts of the type illustrated by Piper U.S. Pat. No. 2,886,437; water-insoluble hydroxides, as illustrated by Maffet U.S. Pat. No. 2,953,455; phenols, as illustrated by Smith U.S. Pat. Nos. 2,955,037 and '038; ethylene diurea, as illustrated by Dersch U.S. Pat. No. 3,582,346; barbituric acid derivatives, as illustrated by Wood U.S. Pat. No. 3,617,290; boranes, as illustrated by Bigelow U.S. Pat. No. 3,725,078; 3-pyrazolidinones, as illustrated by Wood U.K. Pat. No. 1,158,059 and aldoximines, amides, anilides and esters, as illustrated by Butler et al U.K. Pat. No. 988,052.

The emulsions can be protected from fog and desensitization caused by trace amounts of metals such as copper, lead, tin, iron and the like, by incorporating addenda, such as sulfocatechol-type compounds, as illustrated by Kennard et al U.S. Pat. No. 3,236,652; aldoximines, as illustrated by Carroll et al U.K. Pat. No. 623,448 and meta- and poly-phosphates, as illustrated by Draisbach U.S. Pat. No. 2,239,284, and carboxylic acids such as ethylenediamine tetraacetic acid, as illustrated by U.K. Pat. No. 691,715.

Among stabilizers useful in layers containing synthetic polymers of the type employed as vehicles and to improve covering power are monohydric and polyhydric phenols, as illustrated by Forsgard U.S. Pat. No. 3,043,697; saccharides, as illustrated by U.K. Pat. No. 897,497 and Stevens et al U.K. Pat. No. 1,039,471 and quinoline derivatives, as illustrated by Dersch et al U.S. Pat. No. 3,446,618.

Among stabilizers useful in protecting the emulsion layers against dichroic fog are addenda, such as salts of nitron, as illustrated by Barbier et al U.S. Pat. Nos. 3,679,424 and 3,820,998; mercaptocarboxylic acids, as illustrated by Willems et al U.S. Pat. No. 3,600,178, and addenda listed by E. J. Birr, *Stabilization of Photographic Silver Halide Emulsions,* Focal Press, London, 1974, pp. 126–218.

Among stabilizers useful in protecting emulsion layers against development fog are addenda such as azabenzimidazoles, as illustrated by Bloom et al U.K. Pat. No. 1,356,142 and U.S. Pat. No. 3,575,699, Rogers U.S. Pat. No. 3,473,924 and Carlson et al U.S. Pat. No. 3,649,267; substituted benzimidazoles, benzothiazoles, benzotriazoles and the like, as illustrated by Brooker et al U.S. Pat. No. 2,131,038, Land U.S. Pat. No. 2,704,721, Rogers et al U.S. Pat. No. 3,265,498; mercapto-substituted compounds, e.g., mercaptotetrazoles, as illustrated by Dimsdale et al U.S. Pat. No. 2,432,864, Rauch et al U.S. Pat. No. 3,081,170, Weyerts et al U.S. Pat. No. 3,260,597, Grasshoff et al U.S. Pat. No. 3,674,478 and Arond U.S. Pat. No. 3,706,557; isothiourea derivatives, as illustrated by Herz et al U.S. Pat. No. 3,220,839, and thiodiazole derivatives, as illustrated by von Konig U.S. Pat. No. 3,364,028 and von Konig et al U.K. Pat. No. 1,186,441.

Where hardeners of the aldehyde type are employed, the emulsion layers can be protected with antifoggants, such as monohydric and polyhydric phenols of the type illustrated by Sheppard et al U.S. Pat. No. 2,165,421; nitro-substituted compounds of the type disclosed by Rees et al U.K. Pat. No. 1,269,268; poly(alkylene oxides), as illustrated by Valbusa U.K. Pat. No. 1,151,914, and mucohalogenic acids in combination with urazoles, as illustrated by Allen et al U.S. Pat. Nos. 3,232,761 and 3,232,764, or further in combination with maleic acid hydrazide, as illustrated by Rees et al U.S. Pat. No. 3,295,980.

To protect emulsion layers coated on linear polyester supports addenda can be employed such as parabanic acid, hydantoin acid hydrazides and urazoles, as illustrated by Anderson et al U.S. Pat. No. 3,287,135, and piazines containing two symmetrically fused 6-member carbocyclic rings, especially in combination with an aldehyde-type hardening agent, as illustrated in Rees et al U.S. Pat. No. 3,396,023.

Kink desensitization of the emulsions can be reduced by the incorporation of thallous nitrate, as illustrated by Overman U.S. Pat. No. 2,628,167; compounds, polymeric latices and dispersions of the type disclosed by Jones et al U.S. Pat. No. 2,759,821 and '822; azole and mercaptotetrazole hydrophilic colloid dispersions of the type disclosed by *Research Disclosure, Vol.* 116, December 1973, Item 11684; plasticized gelatin compositions of the type disclosed by Milton et al U.S. Pat. No. 3,033,680; water-soluble interpolymers of the type disclosed by Rees et al U.S. Pat. No. 3,536,491; polymeric latices prepared by emulsion polymerization in the presence of poly(alkylene oxide), as disclosed by Pearson et al U.S. Pat. No. 3,772,032, and gelatin graft copolymers of the type disclosed by Rakoczy U.S. Pat. No. 3,837,861.

Where the photographic element is to be processed at elevated bath or drying temperatures, as in rapid access processors, pressure desensitization and/or increased fog can be controlled by selected combinations of addenda, vehicles, hardeners and/or processing conditions, as illustrated by Abbott et al U.S. Pat. No. 3,295,976, Barnes et al U.S. Pat. No. 3,545,971, Salesin U.S. Pat. No. 3,708,303, Yamamoto et al U.S. Pat. No. 3,615,619, Brown et al U.S. Pat. No. 3,623,873, Taber U.S. Pat. No. 3,671,258, Abele U.S. Pat. No. 3,791,830, *Research Disclosure,* Vol. 99, July 1972, Item 9930, Florens et al U.S. Pat. No. 3,843,364, Priem et al U.S. Pat. No. 3,867,152, Adachi et al U.S. Pat. No. 3,967,965 and Mikawa et al U.S. Pat. Nos. 3,947,274 and 3,954,474.

In addition to increasing the pH or decreasing the pAg of an emulsion and adding gelatin, which are known to retard latent image fading, latent image stabilizers can be incorporated, such as amino acids, as illustrated by Ezekiel U.K. Pat. Nos. 1,335,923, 1,378,354, 1,387,654 and 1,391,672, Ezekiel et al U.K. Pat. No. 1,394,371, Jefferson U.S. Pat. No. 3,843,372, Jefferson et al U.K. Pat. No. 1,412,294 and Thurston U.K. Pat. No. 1,343,904; carbonyl-bisulfite addition products in combination with hydroxybenzene or aromatic amine developing agents, as illustrated by Seiter et al U.S. Pat. No. 3,424,583; cycloalkyl-1,3-diones, as illustrated by Beckett et al U.S. Pat. No. 3,447,926; enzymes of the catalase type, as illustrated by Matejec et al U.S. Pat. No. 3,600,182; halogen-substituted hardeners in combination with certain cyanine dyes, as illustrated by Kumai et al U.S. Pat. No. 3,881,933; hydrazides, as illustrated by Honig et al U.S. Pat. No. 3,386,831; alkenylbenzothiazolium salts, as illustrated by Arai et al U.S. Pat. No. 3,954,478; hydroxy-substituted benzylidene derivatives, as illustrated by Thurston U.K. Pat. No. 1,308,777 and Ezekiel et al U.K. Pat. Nos. 1,347,544 and 1,353,527; mercapto-substituted compounds of the type disclosed by Sutherns U.S. Pat. No. 3,519,427; metal-organic complexes of the type disclosed by Matejec et al U.S. Pat. No. 3,639,128; penicillin derivatives, as illustrated by Ezekiel U.K. Pat. No. 1,389,089; propynylthio derivatives of benzimidazoles, pyrimidines, etc., as illustrated by von Konig et al U.S. Pat. No. 3,910,791; combinations of iridium and rhodium compounds, as disclosed by Yamasue et al U.S. Pat. No. 3,901,713; sydnones or sydnone imines, as illustrated by Noda et al U.S. Pat. No. 3,881,939; thiazolidine derivatives, as illustrated by Ezekiel U.K. Pat. No. 1,458,197 and thioester-substituted imidazoles, as illustrated by *Research Disclosure,* Vol. 136, August 1975, Item 13651.

The foregoing description of specific radiation-sensitive portions of the photographic elements of this invention is recognized to be illustrative only of the varied known photographic materials employed. For example, other conventional silver halide photographic element forming materials and addenda are disclosed in *Product Licensing Index,* Vol. 92, December 1971, publication 9232, pp. 107–110, and *Research Disclosure,* Vol. 176, December 1978, publication 17643, pp. 22–31, the disclosure of which is here incorporated by reference. *Product Licensing Index* and *Research Disclosure* are published by Industrial Opportunities Ltd., Homewell, Havant Hampshire, PO9 LEF, UK.

The foregoing description of specific radiaton-sensitive portions of the photographic elements of this invention is recognized to be illustrative only of the varied known photographic materials which can be employed. Similarly the uses and advantages of the photographic elements according to this invention will be apparent and can be generally appreciated from the following illustrative description directed to certain preferred silver halide emulsion photographic elements and their use.

Silver Imaging With Silver Halides

The photographic elements can be imagewise exposed with various forms of energy, which encompass the ultraviolet and visible (e.g., actinic) and infrared regions of the electromagnetic spectrum as well as electron beam and beta radiation, gamma ray, X-ray, alpha particle, neutron radiation and other forms of corpuscular and wave-like radiant energy in either noncoherent (random phase) forms or coherent (in phase) forms, as produced by lasers. Exposures can be monochromatic, orthochromatic or panchromatic. Imagewise exposures at ambient, elevated or reduced temperatures and/or pressures, including high or low intensity exposures, continuous or intermittent exposures, exposure times ranging from minutes to relatively short durations in the millisecond to microsecond range and solarizing exposures, can be employed within the useful response ranges determined by conventional sensitometric techniques, as illustrated by T. H. James, *The Theory of the Photographic Process,* 4th Ed., Macmillan, 1977, Chapters 4, 6, 17, 18 and 23.

Referring to photographic element 100 in FIGS. 1A and 1B, in a simple, illustrative form of this invention the support 102 is formed of a reflective material, preferably and hereinafter referred to as a white reflective material, although colored reflective materials are contemplated. The radiation-sensitive material 116 is a silver halide emulsion of the type which is capable of producing a viewable image as a result solely of exposure and, optionally, dry processing. Such silver halide emulsions can be of the printout type—that is, they can produce a visible image by the direct action of light with no subsequent action required—or of the direct-print type—that is, they can form a latent image by high intensity imagewise exposure and produce a visible image by subsequent low intensity light exposure. A heat stabilization step can be interposed between the exposure steps. In still another form the silver halide emulsion can be of a type which is designed for processing solely by heat.

The preferred printout emulsions are characterized by one or a combination of the following features: silver halide grains formed in the presence of metal salts or ions; surface desensitized fogged silver halide grains; halogen acceptors, optionally in combination with aldehydes or development restrainers; gold compounds; acid substituted compounds, especially salt or complex forming dicarboxylic acids and iodide releasing compounds. Printout emulsions including one or a combination of these preferred features are illustrated by U.K. Pat. No. 1,402,794, Bacon U.S. Pat. Nos. 3,547,647, 3,531,291 and 3,574,625, Farmer U.K. Pat. No. 15,727, Marten U.S. Pat. No. 439,021, E. J. Wall, *Photographic Emulsions,* American Photographic Publishing Co., 1929, pp. 106–110, Frankenburger et al U.S. Pat. No. 1,738,530, Thompson et al U.S. Pat. No. 2,888,347, van der Meulen et al U.S. Pat. No. 2,933,389, Roth U.S. Pat. No. 3,042,514, Gilman U.S. Pat. Nos. 3,143,419 and 3,650,758, Berthold German OLS 2,422,320, Farren et al U.S. Pat. Nos. 3,409,436 and 3,840,372, Meyer U.S. Pat Nos. 637,637 and '638, Luttke U.S. Pat. No. 722,238, Schoenfelder U.S. Pat. No. 730,800, Caldwell U.S. Pat. No. 956,567, Fallesen et al U.S. Pat. Nos. 2,030,860, 2,126,318, '319 and 2,129,207, Urbach U.S. Pat. No. 2,449,153, Mees U.S. Pat. No. 1,503,595, Johnson U.S. Pat. No. 1,582,050, Fallesen U.S. Pat. No. 2,369,449, Colt U.S. Pat. No. 3,418,122, Jouy U.S. Pat. No. 3,511,662, Wise et al U.S. Pat. No. 3,615,618, Ikenoue et al U.S. Pat. No. 3,960,566, Bates et al U.S. Pat. No. 3,844,789, Chateau et al U.S. Pat. No. 3,419,396, Bacon et al U.S. Pat. No. 3,447,927 and Bullock U.S. Pat. No. 1,454,209.

Silver halide emulsions particularly adapted to direct-print applications can be prepared in the presence of metal ions (e.g., tin, lead, copper, cadmium bismuth, magnesium, rhodium or iridium) and/or excess halide ions (i.e., bromide, chloride or iodide) and also nitrite ions, as illustrated by U.K. Pat. Nos. 971,677 and 1,250,659, Hunt U.S. Pat. Nos. 3,033,678, 3,033,682, and 3,241,961, Scott U.S. Pat. Nos. 3,039,871, 3,047,392 and 3,109,737, Byrne U.S. Pat. No. 3,123,474, Fix U.S. Pat. No. 3,178,292, Bigelow U.S. Pat. Nos. 3,178,293, 3,449,125, 3,573,919 and 3,615,579, Colt U.S. Pat. No. 3,418,122, Sutherns et al U.K. Pat. No. 1,096,052 and U.S. Pat. No. 3,420,669, Sutherns U.K. Pat. Nos. 1,248,242 and '243, Sprung U.S. Pat. No. 3,436,221, Bacon et al U.S. Pat. Nos. 3,447,927 and 3,690,888, Pestalozzi U.S. Pat. No. 3,501,299 and 3,561,971, Allentoff et al U.S. Pat. No. 3,573,055, Sincius U.S. Pat. No. 3,594,172, Countryman U.S. Pat. No. 3,597,209, Karlson U.S. Pat. No. 3,615,580, Heeks et al Canadian Pat. No. 995,053 and U.S. Pat. Nos. 3,660,100 and 3,725,073 Moore U.K. Pat. No. 1,086,384 and Kitze U.K. Pat. No. 1,250,659.

Improved photodevelopment characteristics can be obtained by forming the silver halide grains in the presence of silver halide solvents, such as thiocyanate and thioethers, as illustrated by Sutherns U.K. Pat. No. 1,096,053 and U.S. Pat. No. 3,260,605, McBride U.S. Pat. Nos. 3,271,157 and 3,582,345, Sincius U.S. Pat. No. 3,507,656, Mason et al U.K. Pat. No. 1,178,446, Walters et al U.S. Pat. No. 3,782,960 and O'Neill et al U.K. Pat. No. 1,247,667 or by adding halogen acceptors (e.g., heterocyclic mercaptans, thiones, molecular iodine, thiourea, imidazolinethiones, thiosemicarbazides, thiosemicarbazones, urazoles, aromatic thiols, thiouracils, thiadiazolidine-2-thiones and thiourazoles) to the emulsions before coating, as illustrated by Jones U.S. Pat. No. 3,364,032, Kitze U.S. Pat. No. 3,241,971, Fix U.S. Pat. No. 3,326,689, Bacon et al U.S. Pat. No. 3,396,017, Heugebaert et al U.S. Pat. No. 3,474,108, Gates et al U.S. Pat. No. 3,641,046, Ikenoue et al U.S. Pat. No. 3,852,071, Van Pee et al U.K. Pat. No. 1,155,958, Baylis et al U.K. Pat. No. 1,165,832, Bacon U.S. Pat. No. 3,547,647, Karlson U.S. Pat. No. 3,563,753, McBride U.S. Pat. No. 3,287,137, Hunt U.S. Pat. No. 3,249,440, Krohn et al U.S. Pat. No. 3,615,614, Takei et al U.S. Pat. No. 3,305,365, and Walters et al U.S. Pat. No. 3,849,146.

The photodeveloped images can be stabilized by adding to the emulsions before coating stabilizers, such as sulfides, disulfides, dithiocarbamates, azaindines plus acid anions, thiazoles, isothiuronium derivatives, secondary, tertiary or quarternized amines and aliphatic hydroxypoly carboxylic acids, as illustrated by Karlson U.S. Pat. No. 3,486,901, Farren et al U.S. Pat. No. 3,409,436, Weber U.S. Pat. No. 3,535,115 and Bigelow U.S. Pat. Nos. 3,418,131, 3,505,069, 3,597,210 and 3,652,287.

The direct-print emulsions can be spectrally sensitized, as illustrated by McBride U.S. Pat. No. 3,287,136, Webster et al U.S. Pat. No. 3,630,749, Hunt U.S. Pat. Nos. 3,183,088 and 3,189,456, Fix et al U.S. Pat. Nos. 3,367,780 and 3,579,348, Van Pee et al U.S. Pat. No. 3,745,015, Seiter U.S. Pat. No. 3,508,922, Lincoln et al U.S. Pat. No. 3,854,956 and Borginon et al U.S. Pat. No. 4,053,315.

Silver halide elements can be designed for recording printout images, as illustrated by Fallesen U.S. Pat. No. 2,369,449, and Bacon et al U.S. Pat. No. 3,447,927, direct print itages, as illustrated by Hunt U.S. Pat. No. 3,033,682 and McBride U.S. Pat. No. 3,287,137, or for processing by heat, such as those elements containing (i) an oxidation-reduction image-forming combination, such as described in Sheppard et al U.S. Pat. No. 1,976,302, Sorensen et al U.S. Pat. No. 3,152,904, Morgan et al U.S. Pat. No. 3,457,075, Sullivan et al U.S. Pat. No. 3,785,830, Evans et al U.S. Pat. No. 3,801,321 and Sullivan U.S. Pat. No. 3,846,136; (ii) at least one silver halide developing agent and an alkaline material and/or alkali release material as described in Stewart et al U.S. Pat. No. 3,312,550, Yutzy et al U.S. Pat. No. 3,392,020; or (iii) a stabilizer or stabilizer precursor as described in Humphlett et al U.S. Pat. No. 3,301,678, Haist et al U.S. Pat. No. 3,531,285 and Costa et al U.S. Pat. No. 3,874,946. Photothermographic silver halide systems that are useful are also described in greater detail in *Research Disclosure,* Vol. 170, June 1978, Item 17029.

It is recognized that silver halide photographic elements can exhibit lateral image spreading solely as a result of lateral reflection of exposing radiation from beneath an emulsion layer. Lateral image spreading of this type is referred to in the art as halation, since the visual effect can be to produce a halo around a bright object, such as an electric lamp, which is photographed. Other objects which are less bright are not surrounded by halos, but their photographic definition is significantly reduced by the reflected radiation. To overcome this difficulty conventional photographic elements commonly are provided with layers, commonly referred to as antihalation layers, of light absorbing materials on a support surface which would otherwise reflect radiation to produce halation in an emulsion layer. Such antihalation layers are commonly recognized to have the disadvantage that they must be entirely removed from the photographic element prior to viewing in most practical applications. A more fundamental disadvantage of antihalation layers which is not generally stated, since it is considered inescapable, is that the radiation which is absorbed by the antihalation layer cannot be available to expose the silver halide grains within the emulsion.

Another approach to reducing lateral image spreading attributable to light scatter in silver halide emulsions is to incorporate intergrain absorbers. Dyes or pigments similar to those described above for incorporation in the second support elements are commonly employed for this purpose. The disadvantage of intergrain absorbers is that they significantly reduce the photographic speed of silver halide emulsions. They compete with the silver halide grains in absorbing photons, and many dyes have a significant desensitizing effect on silver halide grains. Like the absorbing materials in antihalation layers, it is also necessary that the intergrain absorbers be removed from the silver halide emulsions for most practical applications, and this can also be a significant disadvantage.

When light strikes the photographic element 100 so that it enters one of the microvessels 108, a portion of the light can be absorbed immediately by the silver halide grains of the emulsion 116 while the remaining light traverses the reaction microvessel without being absorbed. If a given photon penetrates the emulsion without being absorbed, it will be redirected by the white bottom wall 114 of the support 102 so that the photon again traverses at least a portion of the reaction microvessel. This presents an additional opportunity for the photon to strike and be absorbed by a silver halide grain. Since it is recognized that the average photon strikes several silver halide grains before being absorbed, at least some of the exposing photons will be laterally deflected before they are absorbed by silver halide. The white lateral walls 110 of the support act to redirect laterally deflected photons so that they again traverse a portion of the silver halide emulsion within the same reaction microvessel. This avoids laterally directed photons being absorbed by silver halide in adjacent reaction microvessels. Whereas, in a conventional silver halide photographic element having a continuous emulsion coating on a white support, redirection of photons back into the emulsion by a white support is achieved only at the expense of significant lateral image spreading-e.g., halation, in the photographic element 100 the white support enhances the opportunity for photon absorption by the emulsion contained within the reaction microvessels while at the same time achieving a visually acceptable predefined limit on lateral image spread. The result can be seen photographically both in terms of improved photographic speed and contrast as well as sharper image definition. Thus, the advantages which can be gained by employing antihalation layers and intergrain absorbers in conventional photographic elements are realized in the photographic elements of the present invention without their use and with the additional surprising advantages of speed and contrast increase. Further, none of the disadvantages of antihalation layers and intergrain absorbers are encountered. For reasons which will become more apparent in discussing other forms of this invention, it should be noted, however, that the photographic elements of the present invention can employ antihalation layers and intergrain absorbers, if desired, while retaining distinct advantages.

Most commonly silver halide photographic elements are intended to be processed using aqueous alkaline liquid solutions. When the silver halide emulsion contained in the reaction microvessel 108 of the element 100 is of a developing out type rather than a dry processed printout, direct-print or thermally processed type, as illustrated above, all of the advantages described above are retained. In addition, having the emulsion within reaction microvessels offers protection against lateral image spreading as a result of chemical reactions taking place during processing. For example, microscopic inspection of silver produced by development reveals filaments of silver. The silver image in emulsions of the developing out type can result from chemical (direct) development in which image silver is provided by the silver halide grain at the site of silver formation or from physical development in which silver is provided from adjacent silver halide grains or silver or other metal is provided from other sources. Opportunity for lateral image spreading in the absence of reaction microvessels is particularly great when physical development is occurring. Even under chemical development conditions, such as where development is occurring in the presence of a silver halide solvent, extended silver filaments can be found. Frequently a combination of chemical and physical development occurs during processing. Having the silver developed confined within the reaction microvessels circumscribes the areal extent of silver image spreading.

The light-sensitive silver halide contained in the photographic elements can be processed following exposure to form a visible image by associating the silver halide with an aqueous alkaline medium in the presence of a developing agent contained in the medium or the element. Processing formulations and techniques are described in L. F. Mason, *Photographic Processing Chemistry,* Focal Press, London, 1966; *Processing Chemicals and Formulas,* Publication J-1, Eastman Kodak Company, 1973; *Photo-Lab Index,* Morgan and Morgan, Inc., Dobbs Ferry, New York, 1977, and *Neblette's Handbook of Photography and Reprography—Materials, Processes and Systems,* VanNostrand Reinhold Company, 7th Ed., 1977.

Included among the processing methods are web processing, as illustrated by Tregillus et al U.S. Pat. No. 3,179,517; stabilization processing, as illustrated by Herz et al U.S. Pat. No. 3,220,839, Cole U.S. Pat. No. 3,615,511, Shipton et al U.K. Pat. No. 1,258,906 and Haist et al U.S. Pat. No. 3,647,453; monobath processing as described in Haist, *Monobath Manual,* Morgan and Morgan, Inc., 1966, Schuler U.S. Pat. No. 3,240,603, Haist et al U.S. Pat. Nos. 3,615,513 and 3,628,955 and Price U.S. Pat. No. 3,723,126; infectious development, as illustrated by Milton U.S. Pat. Nos. 3,294,537, 3,600,174, 3,615,519 and 3,615,524, Whiteley U.S. Pat. No. 3,516,830, Drago U.S. Pat. No. 3,615,488, Salesin et al U.S. Pat. No. 3,625,689, Illingsworth U.S. Pat. No. 3,632,340, Salesin U.K. Pat. No. 1,273,030 and U.S. Pat. No. 3,708,303; hardening development, as illustrated by Allen et al U.S. Pat. No. 3,232,761; roller transport processing, as illustrated by Russell et al U.S. Pat. Nos. 3,025,779 and 3,515,556, Masseth U.S. Pat. No. 3,573,914, Taber et al U.S. Pat. No. 3,647,459 and Rees et al U.K. Pat. No. 1,269,268; alkaline vapor processing, as illustrated by *Product Licensing Index,* Vol. 97, May 1972, Item 9711, Goffe et al U.S. Pat. No. 3,816,136 and King U.S. Pat. No. 3,985,564; metal ion development as illustrated by Price, *Photographic Science and Engineering,* Vol. 19, Number 5, 1975, pp. 283–287 and Vought *Research Disclosure,* Vol. 150, October 1976, Item 15034.

The photographic elements and aqueous alkaline media can contain organic or inorganic developing agents or mixtures thereof. Representative developing agents are disclosed by T. H. James, *The Theory of the Photographic Process,* 4th Ed., Macmillan, 1977, Chapter 11, and the references cited therein. Useful classes of organic developing agents include hydroquinones, catechols, aminophenols, pyrazolidones, phenylenediamines, tetrahydroquinolines, bis(pyridone)amines, cycloalkenones, pyrimidines, reductones, and coumarins. Useful inorganic developing agents include compounds of a metal having at least two distinct valence states which compounds are capable of reducing ionic silver to metallic silver. Such metals include iron, titanium, vanadium and chromium, and the metal compounds employed are typically complexes with organic compounds such as polycarboxylic acids or aminopolycarboxylic acids. Included among useful developing agents are the iodohydroquinones of Duennebier et al U.S. Pat. No. 3,297,445, the amino hydroxy cycloalkenones of Gabrielsen et al U.S. Pat. No. 3,690,872, the 5-hydroxy and 5-amino-pyrimidines of Wyand et al U.S. Pat. No. 3,672,891, the N-acyl derivatives of p-aminophenols of Porter et al U.K. Pat. No. 1,045,303, the 3-pyrazolidones of Kendall U.S. Pat. No. 2,289,367, Allen U.S. Pat. No. 2,772,282, Stewart et al U.K. Pat. No. 1,023,701 and DeMarle et al U.S. Pat. Nos. 3,221,023 and 3,241,967, the anhydro dihydro reductones of Gabrielsen et al U.S. Pat. No. 3,672,896, and the 6-hydroxy and 6-aminocoumarins of Oftedahl U.S. Pat. No. 3,615,521. Advantageous results can be obtained with combinations of organic and inorganic developing agents as described in Vought *Research Disclosure,* Vol. 150, October 1976, Item 15034, and with combinations of different types of organic developing agents such as the combination of anhydrodihydroamino reductones and aminomethylhydroquinones of Youngquist U.S. Pat. No. 3,666,457 and the combination of ascorbic acid and 3-pyrazolidine of Sutherns U.K. Pat. No. 1,281,516. Developing agents can be incorporated in photographic elements in the form of precursors. Examples of such precursors include the halogenated acylhydroquinones of Porter et al U.S. Pat. No. 3,246,988, the N-acyl derivatives of aminophenols of Porter et al U.S. Pat. No. 3,291,609, the reaction products of a catechol or hydroquinone with a metal described in Barr U.S. Pat. No. 3,295,978, the quinhydrone dyes of Haefner et al U.S. Pat. No. 3,565,627, the cyclohex-2-ene-1,4-diones and cyclohex-2-ene-1-one-4-monoketals of Chapman et al U.S. Pat. No. 3,586,506, and the Schiff bases of p-phenylenediamines of Pupo et al *Research Disclosure,* Vol. 151, November 1976, Item 15159.

The developing agent can be incorporated in the photographic element 100 in the silver halide emulsion 116. In other forms of the photographic elements, more specifically discussed below, the developing agent can be present in other hydrophilic colloid layers of the element adjacent to the silver halide emulsion. The developing agent can be added to the emulsion and hydrophilic colloid layers in the form of a dispersion with a film-forming polymer in a water immiscible solvent, as illustrated by Dunn et al U.S. Pat. No. 3,518,088, or as a dispersion with a polymer latex, as illustrated by Chen *Research Disclosure,* Vol. 159, July 1977, Item 15930, and Pupo et al *Research Disclosure,* Vol. 148, August 1976, Item 14850.

In a similar manner the photographic elements can contain development modifiers in the silver halide emulsion and other processing solution permeable layers to either accelerate or restrain development.

Development accelerators of the poly(alkylene oxide) type are disclosed by Blake et al U.S. Pat. Nos. 2,400,532 and 2,423,549, Blake U.S. Pat. No. 2,441,389, Chechak et al U.S. Pat. No. 2,848,330, Howe U.K. Pat. No. 805,827, Piper U.S. Pat. Nos. 2,886,437 and 3,017,271, Carroll et al U.S. Pat. Nos. 2,944,900 and 2,944,902, Dersch et al U.K. Pat. No. 1,030,701 and U.S. Pat. Nos. 3,006,760, 3,084,044 and 3,255,013, Beavers U.S. Pat. No. 3,039,873, Popeck et al U.S. Pat. No. 3,044,874, Hart et al U.S. Pat. No. 3,150,977, Willems et al U.S. Pat. Nos. 3,158,484, 3,523,796 and 3,523,797, Beavers et al U.S. Pat. Nos. 3,253,919 and 3,426,029, Goffe U.S. Pat. No. 3,294,540, Milton U.S. Pat. No. 3,615,519, Grabhofer et al U.S. Pat. No. 3,385,708, Mackey et al U.S. Pat. Nos. 3,532,501 and 3,597,214, Willems U.S. Pat. No. 3,552,968, Huckstadt et al U.S. Pat. No. 3,558,314, Sato et al U.S. Pat. No. 3,663,230, Yoneyama et al U.S. Pat. No. 3,671,247 and Pollet et al U.S. Pat. No. 3,947,273 and U.K. Pat. No. 1,455,413.

Representative development accelerators additionally comprise carboxylic and sulfonic acid compounds and their salts, aliphatic amines, carbamates, adducts of a thioamine with an aldehyde, polyamines, polyamides, polyesters, aminophenols, polyhydroxybenzenes, thioethers and thioamides, poly(vinyl lactams), poly(N-vinyl-2-oxazolidone), protamine sulfate, pyrazolidones, dihydropyridine compounds, hydroxyalkyl ether derivatives of starch, sulfite ester polymers, bis-sulfonyl alkanes, 1,4-thiazines and thiocarbamate, as illustrated by U.K. Pat. Nos. 1,019,693 and 1,140,741, Weyerts U.S. Pat. Nos. 2,367,549 and 2,380,280, Dersch et al U.S. Pat. No. 3,446,618, Mowrey U.S. Pat. No. 3,904,413, Jones et al U.S. Pat. Nos. 3,128,183 and 3,369,905, Arai et al U.S. Pat. Nos. 3,782,946, 3,801,323, 3,804,624 and 3,822,130, Nishio et al U.S. Pat. No. 3,163,536, Beavers et al U.S. Pat. Nos. 3,330,661 and 3,305,363, Willems et al U.S. Pat. No. 3,502,472, Huckstadt et al U.S. Pat. No. 3,617,280, Plakunov et al U.S. Pat. No. 3,708,302, Beavers U.S. Pat. No. 3,046,135, Nakajima et al U.S. Pat. No. 3,429,707, Minsk U.S. Pat. Nos. 3,046,132 and '133 and Minsk et al U.S. Pat. No. 3,813,247, Rogers et al U.S. Pat. No. 3,192,044, Janssen et al U.S. Pat. No. 3,718,464, Williams et al U.S. Pat. No. 3,021,215, Dann et al U.S. Pat. Nos. 3,038,805 and 3,046,134, Graham et al U.S. Pat. No. 3,046,129, Thompson U.S. Pat. No. 3,419,392, Lovett et al U.S. Pat. Nos. 3,057,724 and 3,165,552, Thompson et al U.S. Pat. No. 3,419,393, Motter U.S. Pat. No. 3,506,443, Froehlich U.S. Pat. No. 3,574,709, Sato et al U.S. Pat. No. 3,625,697, Timmerman et al U.S. Pat. No. 3,986,877, DeMunck et al U.S. Pat. No. 3,615,516, Dersch U.S. Pat. No. 3,006,762, Warren U.S. Pat. No. 2,740,713, Hood et al U.S. Pat. No. 2,751,297, Kennard et al U.S. Pat. Nos. 2,937,090, 3,192,046 and 3,212,899, Munshi et al U.S. Pat. No.

3,983,862, Holt U.K. Pat. No. 1,352,196, Chiesa et al U.S. Pat. No. 3,068,102 and Stewart et al U.S. Pat. No. 3,625,699.

Representative development accelerators also comprise cationic compounds, disulfides, imidazole derivatives, inorganic salts, surfactants, thiazolidines and triazoles of the type disclosed by Carroll et al U.S. Pat. Nos. 2,271,622, 2,275,727 and 2,288,226, Carroll U.S. Pat. Nos. 2,271,623 and 3,062,645, Allen et al U.S. Pat. No. 2,299,782, Beavers et al U.S. Pat. Nos. 2,940,851, 2,940,855 and 2,944,898, Burness et al U.S. Pat. No. 3,061,437, Randolph et al U.K. Pat. No. 1,067,958, Grabhoefer et al U.S. Pat. No. 3,129,100, Burness U.S. Pat. No. 3,189,457, Willems et al U.S. Pat. No. 3,532,499, Huckstadt et al U.S. Pat. Nos. 3,471,296, 3,551,158, 3,598,590, 3,615,528, 3,622,329 and 3,640,715, Yoneyama et al U.S. Pat. No. 3,772,021, Nishio et al U.S. Pat. No. 3,615,527, Nakajima et al U.S. Pat. No. 4,001,021, Hara et al U.S. Pat. No. 3,808,003, Sainsbury et al U.S. Pat. No. 2,706,157, Beavers U.S. Pat. No. 3,901,712, Milton U.K. Pat. No. 1,201,054, Snellman et al U.S. Pat. No. 3,502,473, van Stappen U.S. Pat. No. 3,923,515, Popeck et al U.S. Pat. No. 2,915,395 and Ebato et al U.S. Pat. No. 3,901,709.

Representative of development retrainers are cationic compounds of the type disclosed by Douglas et al U.K. Pat. No. 946,476 and Becker U.S. Pat. No. 3,502,467; esters of the type disclosed by Staud U.S. Pat. No. 2,119,724; lactams of the type disclosed by DeMunck et al U.K. Pat. No. 1,197,306; mercaptans and thiones, as illustrated by U.K. Pat. No. 854,693, Rogers et al U.S. Pat. No. 3,265,498, Abbott et al U.S. Pat. No. 3,376,310, Greenhalgh et al U.K. Pat. No. 1,157,502, Grasshoff et al U.S. Pat. No. 3,674,478, Salesin U.S. Pat. No. 3,708,303, Luckey U.S. Pat. No. 3,695,881, Stark et al U.K. Pat. No. 1,457,664, Ohyama et al U.S. Pat. No. 3,819,379, Bloom et al U.S. Pat. No. 3,856,520 and Taber et al U.S. Pat. No. 3,647,459; polypeptides, as illustrated by Mueller U.S. Pat. No. 2,699,391; poly(alkylene oxide) derivatives of the type disclosed by Blake et al U.S. Pat. No. 2,400,532, Sprung U.S. Pat. No. 3,471,297, Whiteley U.S. Pat. No. 3,516,830 and Milton U.S. Pat. No. 3,567,458; sulfoxides of the type disclosed by Herz *Research Disclosure,* Vol. 129, January 1975, Item 12927; thiazoles as disclosed by Graham U.S. Pat. No. 3,342,596 and diazoles, triazoles and imidazoles as disclosed by *Research Disclosure,* Vol. 131, March 1975, Item 13118.

The photographic elements can contain or be processed to contain, as by direct development, an imagewise distribution of a physical development catalyst. The catalyst-containing element can be processed by pre- or post-fixation physical development in the presence of an image-forming material, such as a salt or complex of a heavy metal ion (e.g., silver, copper, palladium, tellurium, cobalt, iron and nickel) which reacts with a reducing agent, such as a silver halide developing agent, at the catalyst surface. Either the absorption or solubility of the image-forming material can be altered by physical development. The image-forming material and/or reducing agent can be incorporated in the photographic element, in a separate element associated during processing or, most commonly, in an aqueous processing solution. The processing solution can contain addenda to adjust and buffer pH, ionic surfactants and stabilizers, thickening agents, preservatives, silver halide solvents and other conventional developer addenda.

Such physical development systems are illustrated by Archambault et al U.S. Pat. No. 3,576,631, Silverman U.S. Pat. No. 3,591,609, Yudelson et al U.S. Pat. Nos. 3,650,748, 3,719,490 and 3,598,587, Case U.S. Pat. No. 3,512,972, Charles et al U.S. Pat. No. 3,253,923, Wyman U.S. Pat. No. 3,893,857, Lelental *Research Disclosure,* Vol. 156, April 1977, Item 15631 and U.S. Pat. No. 3,935,013 and Weyde et al U.K. Pat. No. 1,125,646, each particularly illustrating heavy metal salts and complexes; Cole U.S. Pat. No. 3,390,998 and Jonker et al U.S. Pat. No. 3,223,525, particularly illustrating processing solutions containing ionic surfactants and stabilizers and Bloom U.S. Pat. No. 3,578,449, particularly illustrating processing solutions containing silver halide solvents. Physical developers which produce dye images can be employed, as illustrated by Gysling et al U.S. Pat. Nos. 4,042,392 and 4,046,569.

In one specifically preferred form of the invention the photographic element is infectiously developed. The term "infectious" is employed in the art to indicate that silver halide development is not confined to the silver halide grain which provides the latent image site. Rather, adjacent grains which lack latent image sites are also developed because of their proximity to the initially developable silver halide grain.

Infectious development of continuously coated silver halide emulsion layers is practiced in the art principally in producing high contrast photographic images for exposing lithographic plates. However, care must be taken to avoid unacceptable lateral image spreading because of the infectious development. In practicing the present invention the reaction microvessels provide boundaries limiting lateral image spread. Since the vessels control lateral image spreading, the infectiousness or tendency of the developer to laterally spread the image can be as great and is, preferably, greater than in conventional infectious developers. In fact, one of the distinct advantages of infectious development is that it can spread or integrate silver image development over the entire area of the reaction microvessel. This avoids silver image graininess within the reaction microvessel and permits the reaction microvessel to be viewed externally as a uniform density unit rather than a circumscribed area exhibiting an internal range of point densities.

The combination of reaction microvessels and infectious development permits unique imaging results. For example, very high densities can be obtained in reaction microvessels in which development occurs, since the infectious nature of the development drives the development reaction toward completion. At the same time, in other reaction microvessels where substantially no development is initiated, very low density levels can be maintained. The result is a very high contrast photographic image. It is known in the art to read out photographic images electronically by scanning a photographic element with a light source and a photosensor. The density sensed at each scanning location on the element can be recorded electronically and reproduced by conventional means, such as a cathode ray tube, on demand. It is well known also that digital electronic computers employed in recording and reproducing the information taken from the picture employ binary logic. In electronically scanning the photographic element 100, each reaction microvessel can provide one scanning site. By using infectious development to produce high contrast, the photographic image being scanned provides either a substantially uniform dark area or a light area in each reaction microvessel. In other words, the information taken from the photographic element is already in a binary logic form, rather than an analog form produced by continuous tone gradations. The photographic elements are then comparatively simple to scan electronically and are very simple and convenient to record and reproduce using digital electronic equipment.

Techniques for infectious development as well as specific compositions useful in the practice of this invention are disclosed by James, *The Theory of the Photographic Process,* 4th Ed., Macmillan, pp. 420 and 421 (1977); Stauffer et al, *Journal Franklin Institute,* Vol. 238, p. 291 (1944); and Beels et al, *Journal Photographic Science,* Vol. 23, p. 23 (1975). In a preferred form a hydrazine or hydrazide is incorporated in the reaction microvessel and/or in a developer and the developer containing a developing agent having a hydroxy group, such as a hydroquinone. Preferred developers of this type are disclosed in Stauffer et al U.S. Pat. No. 2,419,974, Trivelli et al U.S. Pat. No. 2,419,975 and Takada et al Belgian Pat. No. 855,453.

The foregoing discussion of the use and advantages of the photographic element 100 has been by reference to preferred forms in which the support 102 is a white, reflection print. It can be used to form an image to be scanned electronically as has been described above. The element in this form can be used also as a master for reflection printing.

It is also contemplated that the support 102 can be transparent. In one specifically preferred form the underlying portion 112 of the support is transparent and colorless while the integral lateral walls contain a colorant therein, such as a dye, so that a substantial density is presented to light transmission through the lateral walls between the major surfaces 104 and 106 and between adjacent reaction microvessels. In this form, the dyed walls perform the function of an intergrain absorber or antihalation layer, as described above, while avoiding certain disadvantages which these present. For example, since the dye is in the lateral walls and not in the emulsion, dye desensitization of the silver halide emulsion is minimized, if not eliminated. At the same time, it is unnecessary to decolorize or remove the dye, as is normally undertaken when an antihalation layer is provided.

In addition, this form of the support element 102 has unique advantages in use that have no direct counterpart in photographic elements having continuous silver halide emulsion layers. The photographic element when formed with a transparent underlying portion and dyed lateral walls is uniquely suited for use as a master in transmission printing. That is, after processing to form a photographic image, the photographic element can be used to control exposure of a photographic print element, such as a photographic element according to this invention having a white support, as described above, or a conventional photographic element, such as a photographic paper. In exposing the print element through the image bearing photographic element 100 the density of the lateral walls confines light transmission during exposure to the portions of the support 102 underlying the reaction microvessels. Where the reaction microvessels are relatively transparent—i.e., minimum density areas, the print exposure is higher and in maximum density areas of the master, print exposure is lowest. The effect is to give a print in which highly exposed areas of the print element are confined to dots or spaced microareas. Upon subsequent processing to form a viewable print image the eye can fuse adjacent dots or micro-areas to give the visual effect of a continuous tone image. The effects of the nontransmission of exposing light through the lateral walls has been adequately described further above in connection with the support elements and the materials from which they can be formed. Since the eye is quite sensitive to small differences in minimum density, it is generally preferred that the lateral walls be substantially opaque. However, it is contemplated that some light can be allowed to penetrate the lateral walls during printing. This can have the useful effect, for instance, of bringing up the overall density in the print image. As mentioned above, it is also contemplated to displace the print element with respect to the master during printing so that a continuous print image is produced and any reduced density effect due to reduced transmission through the lateral walls is entirely avoided. Similarly, when the photographic element in this form is used to project an image, the lateral spreading of light during projection will fuse adjacent microvessel areas so that the lateral walls are not seen.

To illustrate still another variant form of the invention, advantages can be realized when the support element is entirely transparent and colorless. In applications where the silver halide emulsion is a developing out emulsion and is intended to be scanned pixel by pixel, as in the infectiously developed electron beam scanned application described above, control of lateral image spreading during development is, of course, independent of the transparency or coloration of the support element. However, even when the lateral walls are transparent and colorless, the protection against light scattering between adjacent microvessels can still be realized in some instances, as discussed below in connection with photographic element 200.

The photographic elements 200 through 1000 share structural similarities with photographic elements 100 and are similar in terms of both uses and advantages. Accordingly, the uses of these elements are discussed only by reference to differences which further illustrate the invention.

The photographic element 200 differs from the element 100 in that the reaction microvessels 208 have curved walls rather than separate bottom and side walls. This wall configuration is more convenient to form by certain fabrication techniques. It also has the advantage of being more efficient in redirecting exposing radiation back toward the center of the reaction microvessel. For example, when the photographic element 200 is exposed from above (in the orientation shown), light striking the curved walls of the reaction microvessels can be reflected inwardly so that it again traverses the emulsion 216 contained in the microvessel. When the support is transparent and the element is exposed from below, a higher refraction index for the emulsion as compared to the support can cause light to bend inwardly. This directs the light toward the emulsion 216 within the microvessel and avoids scattering of light to adjacent microvessels.

A second significant difference in the construction of the photographic element 200 as compared to the photographic element 100 is that the upper surface of the emulsion 216 lies substantially below the second major surface 206 of the support 202. The recessed position of the emulsion within the support provides it with mechanical protection against abrasion, kinking, pressure induced defects and matting. Although the emulsion up to the second major surface 106, it also affords protection for the emulsion 116. In all forms of the photographic elements of this invention, at least one component of the radiation-sensitive portion of the element is contained within the reaction microvessels and additional protection is afforded against at least abrasion. It is specifically contemplated that the lateral walls of the support can perform the function of matting agents and that these agents can therefore be omitted without encountering disadvantages to use, such as blocking. However, conventional matting agents, such as illustrated by Paragraph XIII, *Product Licensing Index,* Vol. 92, Dec. 1971, Item 9232, can be employed, particularly in those forms of the photographic elements more specifically discussed below containing at least one continuous hydrophilic colloid layer overlying the support and the reaction microvessels thereof.

The photographic element 300 differs from photographic element 100 in two principal respects. First, relatively thin extensions 314 of emulsion can extend between and connect adjacent pixels. Second, the support is made up of two separate support elements 302 and 306. The photographic element 300 can be employed identically as photographic element 100. The imaging effect of the extensions 314 are in most instances negligible and can be ignored in use. In the form of the element 300 in which the first support element 302 is transparent and the second support element 308 is substantially light impenetrable exposure of the element through the first support element avoids exposure of the extensions 314. Where the emulsion is negative-working, this results in no silver density being generated between adjacent reaction microvessels. Where the extensions are not of negligible thickness and no steps are taken to avoid their exposure, the performance of the photographic element combines the features of a continuously coated silver halide emulsion layer and an emulsion contained within a reaction microvessel.

The photographic element 400 differs from photographic element 100 in two principal respects. First, the reaction microvessel 408 is of relatively extended depth as compared with the reaction microvessels 108, and, second, the radiation-sensitive portion of the element is divided into two separate components 416 and 418. These two differences can be separately employed. That is, the photographic element 100 could be modified to provide a second component like 418 overlying the second major surface 106 of the support, or the depth of the reaction microvessels could be increased. These two differences are shown and discussed together, since in certain preferred embodiments they are particularly advantageous when employed in combination.

While silver halide absorbs light, many photons striking a silver halide emulsion layer pass through without being absorbed. Where the exposing radiation is of a more energetic form, such as X-rays, the efficiency of silver halide in absorbing the exposing radiation is even lower. While increasing the thickness of a silver halide emulsion layer increases its absorption efficiency, there is a practical limit to the thickness of silver halide emulsion layers, since thicker layers cause more lateral scattering of exposing radiation and generally result in greater lateral image spreading.

In a preferred form a radiation-sensitive silver halide emulsion forms the component confined within the reaction microvessel 408. Thus lateral spreading is controlled not by the thickness of the silver halide or the depth of the microvessel, but by the lateral walls of the microvessel. It is then possible to extend the depth of the microvessel and the thickness of the silver halide emulsion that is presented to the exposing radiation as compared to the thickness of continuously coated silver halide emulsion layers without encountering a penalty in terms of lateral image spreading. For example, the depth of the reaction microvessels and the thickness of the silver halide emulsion can both be substantially greater than the width of the microvessels. In the case of a radiographic element intended to be exposed directly by X-rays it is then possible to provide relatively deep reaction microvessels and to improve the absorption efficiency—i.e., speed, of the radiographic element. As discussed above, microvessel depths and silver halide emulsion thicknesses can be up to 1000 microns or more. Microvessel depths of from about 20 to 100 microns preferred for this application are convenient to form by the same general techniques employed in forming shallower microvessels.

In one preferred form, the component 418 is an internally fogged silver halide emulsion. In this form, the components 416 and 418 can correspond to the surface-sensitive and internally fogged emulsions, respectively, disclosed by Luckey et al U.S. Pat. Nos. 2,996,382, 3,397,987 and 3,705,858; Luckey U.S. Pat. No. 3,695,881; *Research Disclosure,* Vol. 134, June 1975, Item 13452; Millikan et al Defensive Publication T-0904017, April 1972 and Kurz *Research Disclosure,* Vol. 122, June 1974, Item 12233, all cited above. In a preferred form, the surface-sensitive silver halide emulsion contains at least 1 mole percent iodide, typically from 1 to 10 mole percent iodide, based on total halide present as silver halide. The surface-sensitive silver halide is preferably a silver bromoiodide and the internally fogged silver halide is an internally fogged converted-halide which is at least 50 mole percent bromide and up to 10 mole percent iodide (the remaining halide being chloride) based on total halide. Upon exposure and development of the iodide containing surface-sensitive emulsion forming the component 416 with a surface developer, a developer substantially incapable of revealing an internal latent image (quantitatively defined in the Luckey et al patents), iodide ions migrate to the component 418 and render the internally fogged silver halide grains developable by the surface developer. In unexposed pixels surface-sensitive silver halide is not developed, therefore does not release iodide ions, and the internally fogged silver halide emulsion component in these pixels cannot be developed by the surface developer. The result is that the silver image density produced by the radiation-sensitive emulsion component 416 is enhanced by the additional density produced by the development of the internally fogged silver halide grains without any significant effect on minimum density areas. It is, of course, unnecessary that the component 416 be of extended thickness in order to achieve an increase in density using the component 418, but when both features are present in combination a particularly fast and efficient photographic element is provided which is excellently suited to radiographic as well as other photographic applications. In variant forms of the invention the surface-sensitive and internally fogged emulsions can be blended rather than coated in separate layers. When blended, it is preferred that the emulsions be located entirely within the reactive microvessels.

In one preferred form of the photographic element 500, the first support element 502 is both transparent and colorless. The second support element 508 is relatively deformable and contains a dye, such as a yellow dye. The components 516 and 518 can correspond to the surface-sensitive and internally fogged silver halide emulsion components 416 and 418, respectively, described above. For this specific embodiment only, the spectral sensitivity of the surface-sensitive emulsion is limited to the blue region of the visible spectrum. The layer 515 can be one or a combination of transparent, colorless conventional subbing layers. Conventional subbing layers and materials are disclosed in the various patents cited above in connection with conventional photographic support materials.

In one exemplary use the radiation-sensitive emulsion component 516 can be exposed through the transparent first support element 502 and the underlying portion 512 of the second support element 508. While the second support element contains a dye to prevent lateral light scattering through the lateral walls 510, the thickness of the underlying portion of the second support element is sufficiently thin that it offers only negligible absorption of incident light. As another alternative the element in this form can be exposed through the second emulsion component 518 instead of the support, if desired.

In an alternative form of the photographic element 500 the emulsion component 516 can correspond to the emulsion component 418 and the emulsion component 518 can correspond to the emulsion component 416. In this form the radiation-sensitive silver halide emulsion is coated as a continuous layer while the internally fogged silver halide emulsion is present in the microvessel 514. Exposure through the support exposes only the portion of the radiation-sensitive emulsion component 518 overlying the microvessel, since the dye in the lateral walls 510 of the second support element effectively absorbs light while the underlying portion 512 of the second support element is too thin to absorb light effectively. Lateral image spreading in the continuous emulsion component is controlled by limiting its exposure to the area subtended by the microvessel. Lateral image spreading by the internally fogged emulsion is limited by the walls of the microvessel.

In still another form of the photographic element 500 the first and second support elements can be formed from any of the materials, including colorless transparent, white and absorbing materials. The layer 515 can be chosen to provide a reflective surface, such as a mirror surface. For example, the layer 515 can be a vacuum vapor deposited layer of silver or another photographically compatible metal which is preferably overcoated with a thin transparent layer, such as a hydrophilic colloid or a film-forming polymer. The components 516 and 518 correspond to the components 416 and 418, respectively, so that the only radiation-sensitive material is confined within the microvessel 514.

In exposing the element in this form from the emulsion side the reflective surface redirects light within the microvessel so that light is either absorbed by the emulsion component 516 on its first pass through the microvessel or is redirected so that it traverses the microvessel one or more additional times, thereby increasing its chances of absorption. Upon development image areas appear as dark areas on a reflective background. If a dye image is produced, as discussed below, the developed silver and silver mirror can be concurrently removed by bleaching so that a dye image on a typical white reflective or colorless transparent support is produced.

A very high contrast photographic element can be achieved by employing as layer 515 a reactive material, such as a metal or metal compound capable of forming a high density metal sulfide—e.g., silver oxide, thereby selectively converting the reflecting surface within the reaction microvessels to a light absorbing form. For instance, if a developer inhibitor releasing (DIR) coupler of the type which releases an organic sulfide is incorporated in the emulsion within the reaction microvessels and development is undertaken with a color developing agent, the color developing agent can react with exposed silver halide to form silver and oxidized color developing agent. The oxidized color developing agent can then couple with the DIR coupler to release an organic sulfide which is capable of reacting with oxidized silver provided by the reactive material layer 515 in the microvessels to convert silver oxide to a black silver sulfide. This increases the maximum density obtainable in the microvessels while leaving the reactive material unaffected in minimum density areas. Thus, an increased contrast can be achieved by this approach. Specific DIR couplers and color developing agents are described below in connection with dye imaging. Metals and metal compounds other than silver oxide which will react with the released organic sulfide to form a metal sulfide can be alternatively employed.

In the foregoing discussion of elements 400 and 500 two component radiation-sensitive means 416 and 418 or 516 and 518 are described in which the components work together to increase the maximum density obtainable. In another form the components can be chosen so that they work together to minimize the density obtained in areas where silver halide is the radiation-sensitive component developed. For example, if one of the components is a light-sensitive silver halide emulsion which contains a DIR coupler and the other component is a spontaneously developable silver halide emulsion (e.g., a surface or internally fogged emulsion) imagewise exposure and processing causes the light-sensitive emulsion to begin development as a function of light exposure. As this emulsion is developed it produces oxidized developing agent which couples with the DIR coupler, releasing development inhibitor. The inhibitor reduces further development of adjacent portions of the otherwise spontaneously developable emulsion. The spontaneously developable emulsion develops to a maximum density in areas where development inhibitor is not released. By using a relatively low covering power light-sensitive emulsion (e.g., a relatively coarse, high-speed emulsion) and a high covering power spontaneously developable emulsion, it is possible to obtain images of increased contrast. The DIR coupler can be advantageously coated in the microvessels or as a continuous layer overlying the microvessels along with the radiation-sensitive emulsion, and the spontaneously developable emulsion can be located in the alternate position. In this arrangement the layer 515 is not one which is darkened by reaction with an inhibitor, but can take the form, if present, of a subbing layer, if desired. The radiation-sensitive emulsion can be either a direct-positive or negative-working emulsion. The developer chosen is one which is a developer for both the radiation-sensitive and spontaneously developable emulsions. Instead of being coated in a separate layer, the two emulsions can be blended, if desired, and both coated in the reaction microvessels.

It is conventional to form photographic elements with continuous emulsion coatings on opposite surfaces of a planar transparent film support. For example, radiographic elements are commonly prepared in this form. In a typical radiographic application fluorescent screens are associated with the silver halide emulsion layers on opposite surfaces of the support. Part of the X-rays incident during exposure are absorbed by one of the fluorescent screens. This stimulates emission by the screen of light capable of efficiently producing a latent image in the adjacent emulsion layer. A portion of the incident X-rays pass through the element and are absorbed by the remaining screen causing light exposure of the adjacent emulsion layer on the opposite surface of the support. Thus two superimposed latent images are formed in the emulsion layers on the opposite surfaces of the support. When light from a screen causes exposure of the emulsion layer on the opposite surface of the support, this is referred to in the art as crossover. Crossover is generally minimized since it results in loss of image definition.

The photographic element 900 is well suited for applications employing silver halide emulsion layers on opposite surfaces of a transparent film support. The alignment of the reaction microvessels 908A and 908B allows two superimposed photographic images to be formed.

As an optional feature to reduce crossover, selective dying of the lateral walls 910A and 910B can be employed as described above. This can be relied upon to reduce scattering of light from one reaction microvessel to adjacent reaction microvessels on the same side of the support and adjacent, nonaligned reaction microvessels on the opposite side of the support. Another technique to reduce crossover is to color the entire support 902 with a dye which can be bleached after exposure and/or processing to render the support substantially transparent and colorless. Bleachable dyes suited to this application are illustrated by Sturmer U.S. Pat. No. 4,028,113 and Krueger U.S. Pat. No. 4,111,699. A conventional approach in the radiographic art is to undercoat silver halide emulsion layers to reduce crossover. For instance Stappen U.S. Pat. No. 3,923,515 teaches to undercoat faster silver halide emulsion layers with slower silver halide emulsion layers to reduce crossover. In applying such an approach to the present invention a slower silver halide emulsion 916 can be provided in the reaction microvessels. A faster silver halide emulsion layer can be positioned in an overlying relationship either in the reaction microvessels or continuously coated over the reaction microvessels on each major surface 904 and 906 of the support. Instead of employing a slower silver halide emulsion in the reaction microvessels an internally fogged silver halide emulsion can be placed in the reaction microvessels as is more specifically described above. The internally fogged silver halide emulsion is capable of absorbing crossover exposures while not being affected in its photographic performance, since it is not responsive to exposing radiation.

To illustrate a diverse photographic application, the photographic element 900 can be formed so that the silver halide emulsion in the reaction microvessels 908B as an imaging emulsion while another silver halide emulsion can be incorporated in the reaction microvessels 908A. The two emulsions can be chosen to be oppositely working. That is, if the emulsion in the microvessels 908B is negative-working, then the emulsion in the microvessels 908A is positive-working. Using an entirely transparent support element 902, exposure of the element from above, in the orientation shown in FIG. 9, results in forming a primary photographic latent image in the emulsion contained in the microvessels 908B. The emulsion contained in the microvessels 908A is also exposed, but to some extent the light exposing it will be scattered in passing through the overlying emulsion, microvessels and support portions. Thus, the emulsion in the microvessels 908B in this instance can be used to form an unsharp mask for the overlying emulsion. In one optional form specifically contemplated an agent promoting infectious development can be incorporated in the emulsion providing the unsharp mask. This allows image spreading within the microvessels, but the lateral walls of the microvessels limits lateral image spreading. Misalignment of the microvessels 908A and 908B can also be relied upon to decrease sharpness in the underlying emulsion. An additional approach is to size the microvessels 908A so that they are larger than the microvessels 908B. Any combination of these three approaches can, if desired, be used. Instead of employing oppositely working emulsions in the microvessels 908A and 908B, the emulsions can both be negatively working, for example. The emulsion in the microvessels 908A and B differ in speed (or spectral sensitivity), however, so that the emulsion in microvessels 908B is imagewise exposed and processed without producing an image in the microvessels 908A. Thereafter exposure of the emulsion in microvessels 908A through the image present in the microvessels 908B, followed by processing produces an unsharp mask in the microvessels 908A. It is recognized in the art that unsharp masking can have the result of increasing image sharpness, as discussed in Mees and James, *The Theory of the Photographic Process,* 3rd Ed., Macmillan, 1966, p. 495. Where the photographic element is used as a printing master, any increase in minimum density attributable to masking can be eliminated by adjustment of the printing exposure.

In the photographic element 1000 the lenticular surface 1004 can have the effect of obscuring the lateral walls 1010 separating adjacent reaction microvessels 1008. Where the lateral walls are relatively thick, as where very small pixels are employed, the lenticular surface can laterally spread light passing through the microvessel portion of each pixel so that the walls are either not seen or appear thinner than they actually are. In this use the support 1002 is colorless and transparent, although the lateral walls 1010 can be dyed, if desired. It is, of course, recognized that the use of lenticular surfaces on supports of photographic elements having continuously coated radiation-sensitive layers have been employed to obtain a variety of effects, such as increased speed, color separation, restricted exposure and stereography, as illustrated by Cary U.S. Pat. No. 3,316,805, Brunson et al U.S. Pat. No. 3,148,059, Schwan et al U.S. Pat. No. 2,856,282, Gretener U.S. Pat. No. 2,794,739, Stevens U.S. Pat. No. 2,543,073 and Winnek U.S. Pat. No. 2,562,077. The photographic element 1000 can also provide such conventional effects produced by lenticular surfaces, if desired.

The foregoing description of employing this invention to form silver images using silver halide emulsions is believed adequate to suggest to those skilled in the art variant element forms and imaging techniques which are too numerous to discuss individually.

Dye Imaging With Silver Halide

The photographic elements and the techniques described above for producing silver images can be readily adapted to provide a colored image through the use of dyes. In perhaps the simplest approach to obtaining a projectable color image a conventional dye can be incorporated in the support of the photographic element, and silver image formation undertaken as described above. In areas where a silver image is formed the element is rendered substantially incapable of transmitting light therethrough, and in the remaining areas light is transmitted corresponding in color to the color of the support. In this way a colored image can be readily formed. The same effect can also be achieved by using a separate dye filter layer or element with a transparent support element. Where the support element or portion defining the lateral walls is capable of absorbing light used for projection, an image pattern of a chosen color can be formed by light transmitted through microvessels in inverse proportion to the silver present therein.

The silver halide photographic elements can be used to form dye images therein through the selective destruction or formation of dyes. The photographic elements described above for forming silver images can be used to form dye images by employing developers containing dye image formers, such as color couplers, as illustrated by U.K. Pat. No. 478,984, Yager et al U.S. Pat. No. 3,113,864, Vittum et al U.S. Pat. Nos. 3,002,836, 2,271,238 and 2,362,598, Schwan et al U.S. Pat. No. 2,950,970, Carroll et al U.S. Pat. No. 2,592,243, Porter et al U.S. Pat. Nos. 2,343,703, 2,376,380 and 2,369,489, Spath U.K. Pat . No. 886,723 and U.S. Pat. No. 2,899,306, Tuite U.S. Pat. No. 3,152,896 and Mannes et al U.S. Pat. Nos. 2,115,394, 2,252,718 and 2,108,602, and Pilato U.S. Pat. No. 3,547,650. In this form the developer contains a color-developing agent (e.g., a primary aromatic amine) which in its oxidized form is capable of reacting with the coupler (coupling) to form the image dye.

The dye-forming couplers can be incorporated in the photographic elements, as illustrated by Schneider et al, Die Chemie, Vol. 57, 1944, p. 113, Mannes et al U.S. Pat. No. 2,304,940, Martinez U.S. Pat. No. 2,269,158, Jelley et al U.S. Pat. No. 2,322,027, Frolich et al U.S. Pat. No. 2,376,679, Fierke et al U.S. Pat. No. 2,801,171, Smith U.S. Pat. No. 3,748,141, Tong U.S. Pat. No. 2,772,163, Thirtle et al U.S. Pat. No. 2,835,579, Sawdey et al U.S. Pat. No. 2,533,514, Peterson U.S. Pat. No. 2,353,754, Seidel U.S. Pat. No. 3,409,435 and Chen *Research Disclosure*, Vol. 159, July 1977, Item 15930.

The dye-forming couplers are commonly chosen to form subtractive primary (i.e., yellow, magenta and cyan) image dyes and are nondiffusible, colorless couplers, such as two and four equivalent couplers of the open chain ketomethylene, pyrazolone, pyrazolotriazole, pyrazolobenzimidazole, phenol and naphthol type hydrophobically ballasted for incorporation in high-boiling organic (coupler) solvents. Such couplers are illustrated by Salminen et al U.S. Pat. Nos. 2,423,730, 2,772,162, 2,895,826, 2,710,803, 2,407,207, 3,737,316 and 2,367,531, Loria et al U.S. Pat. Nos. 2,772,161, 2,600,788, 3,006,759, 3,214,437 and 3,253,924, McCrossen et al U.S. Pat. No. 2,875,057, Bush et al U.S. Pat. No. 2,908,573, Gledhill et al U.S. Pat. No. 3,034,892, Weissberger et al U.S. Pat. Nos. 2,474,293, 2,407,210, 3,062,653, 3,265,506 and 3,384,657, Porter et al U.S. Pat. No. 2,343,703, Greenhalgh et al U.S. Pat. No. 3,127,269, Feniak et al U.S. Pat. Nos. 2,865,748, 2,933,391 and 2,865,751, Bailey et al U.S. Pat. No. 3,725,067, Beavers et al U.S. Pat. No. 3,758,308, Lau U.S. Pat. No. 3,779,763, Fernandez U.S. Pat. No. 3,785,829, U.K. Pat. No. 969,921, U.K. Pat. No. 1,241,069, U.K. Pat. No. 1,011,940, Vanden Eynde et al U.S. Pat. No. 3,762,921, Beavers U.S. Pat. No. 2,983,608, Loria U.S. Pat. Nos. 3,311,476, 3,408,194, 3,458,315, 3,447,928, 3,476,563, Cressman et al U.S. Pat. No. 3,419,390, Young U.S. Pat. No. 3,419,391, Lestina U.S. Pat. No. 3,519,429, U.K. Pat. No. 975,928, U.K. Pat. No. 1,111,554, Jaeken U.S. Pat. No. 3,222,176 and Canadian Pat. No. 726,651, Schulte et al U.K. Pat. No. 1,248,924 and Whitmore et al U.S. Pat. No. 3,227,550.

The dye-forming couplers upon coupling can release photographically useful fragments, such as development inhibitors or accelerators, bleach accelerators, developing agents, silver halide solvents, toners, hardeners, fogging agents, antifoggants, competing couplers, chemical or spectral sensitizers and desensitizers. Development inhibitor-releasing (DIR) couplers are illustrated by Whitmore et al U.S. Pat. No. 3,148,062, Barr et al U.S. Pat. No. 3,227,554, Barr U.S. Pat. No. 3,733,201, Sawdey U.S. Pat. No. 3,617,291, Groet et al U.S. Pat. No. 3,703,375, Abbott et al U.S. Pat. No. 3,615,506, Weissberger et al U.S. Pat. No. 3,265,506, Seymour U.S. Pat. No. 3,620,745, Marx et al U.S. Pat. No. 3,632,345, Mader et al U.S. Pat. No. 3,869,291, U.K. Pat. No. 1,201,110, Oishi et al U.S. Pat. No. 3,642,485, Verbrugghe U.K. Pat. No. 1,236,767, Fujiwhara et al U.S. Pat. No. 3,770,436 and Matsuo et al U.S. Pat. No. 3,808,945. DIR compounds which do not form dye upon reaction with oxidized color-developing agents can be employed, as illustrated by Fujiwhara et al German OLS No. 2,529,350 and U.S. Pat. Nos. 3,928,041, 3,958,993 and 3,961,959, Odenwalder et al German OLS No. 2,448,063, Tanaka et al German OLS No. 2,610,546, Kikuchi et al U.S. Pat. No. 4,049,455 and Credner et al U.S. Pat. No. 4,052,213. DIR compounds which oxidatively cleave can be employed, as illustrated by Porter et al U.S. Pat. No. 3,379,529, Green et al U.S. Pat. No. 3,043,690, Barr U.S. Pat. No. 3,364,022, Duennebier et al U.S. Pat. No. 3,297,445 and Rees et al U.S. Pat. No. 3,287,129.

The photographic elements can incorporate colored dye-forming couplers, such as those employed to form integral masks for negative color images, as illustrated by Hanson U.S. Pat. No. 2,449,966, Glass et al U.S. Pat. No. 2,521,908, Gledhill et al U.S. Pat. No. 3,034,892, Loria U.S. Pat. No. 3,476,563, Lestina U.S. Pat. No. 3,519,429, Friedman U.S. Pat. No. 2,543,691, Puschel et al U.S. Pat. No. 3,028,238, Menzel et al U.S. Pat. No. 3,061,432 and Greenhalgh U.K. Pat. No. 1,035,959, and/or competing couplers, as illustrated by Murin et al U.S. Pat. No. 3,876,428, Sakamoto et al U.S. Pat. No. 3,580,722, Puschel U.S. Pat. No. 2,998,314, Whitmore U.S. Pat. No. 2,808,329, Salminen U.S. Pat. No. 2,742,832 and Weller et al U.S. Pat. No. 2,689,793.

The photographic elements can include image dye stabilizers. Such image dye stabilizers are illustrated by U.K. pat. No. 1,326,889, Lestina et al U.S. Pat. Nos. 3,432,300 and 3,698,909, Stern et al U.S. Pat. No. 3,574,627, Brannock et al U.S. Pat. No. 3,573,050, Arai et al U.S. Pat. No. 3,764,337 and Smith et al U.S. Pat. No. 4,042,394.

Dye images can be formed or amplified by processes which employ in combination with a dye-image-generating reducing agent an inert transition metal ion complex oxidizing agent, as illustrated by Bissonette U.S. Pat. Nos. 3,748,138, 3,826,652, 3,862,842 and 3,989,526 and Travis U.S. Pat. No. 3,765,891, and/or a peroxide oxidizing agent, as illustrated by Matejec U.S. Pat. No. 3,674,490, *Research Disclosure,* Vol. 116, December 1973, Item 11660, and Bissonette *Research Disclosure,* Vol. 148, August 1976, Items 14836, 14846 and 14847. The photographic elements can be particularly adapted to form dye images by such processes, as illustrated by Dunn et al U.S. Pat. No. 3,822,129, Bissonette U.S. Pat. Nos. 3,834,907 and 3,902,905, Bissonette et al U.S. Pat. No. 3,847,619 and Mowrey U.S. Pat. No. 3,904,413.

The photographic elements can produce dye images through the selective destruction of dyes or dye precursors, such as silver-dye-bleach processes, as illustrated by A. Meyer, *The Journal of Photographic Science,* Vol. 13, 1965, pp. 90–97. Bleachable azo, azoxy, xanthene, azine, phenylmethane, nitroso complex, indigo, quinone, nitro-substituted, phthalocyanine and formazan dyes, as illustrated by Stauner et al U.S. Pat. No. 3,754,923, Piller et al U.S. Pat. No. 3,749,576, Yoshida et al U.S. Pat. No. 3,738,839, Froelich et al U.S. Pat. No. 3,716,368, Piller U.S. Pat. No. 3,655,388, Williams et al U.S. Pat. No. 3,642,482, Gilman U.S. Pat. No. 3,567,448, Loeffel U.S. Pat. No. 3,443,953, Anderau U.S. Pat. Nos. 3,443,952 and 3,211,556, Mory et al U.S. Pat. Nos. 3,202,511 and 3,178,291 and Anderau et al U.S. Pat. Nos. 3,178,285 and 3,178,290, as well as their hydrazo, diazonium and tetrazolium precursors and leuco and shifted derivatives, as illustrated by U.K. Pat. Nos. 923,265, 999,996 and 1,042,300, Pelz et al U.S. Pat. No. 3,684,513, Watanabe et al U.S. Pat. No. 3,615,493, Wilson et al U.S. Pat. No. 3,503,741, Boes et al U.S. Pat. No. 3,340,059, Gompf et al U.S. Pat. No. 3,493,372 and Puschel et al U.S. Pat. No. 3,561,970, can be employed.

It is common practice in forming dye images in silver halide photographic elements to remove the silver which is developed by bleaching. In some instances the amount of silver formed by development is small in relation to the amount of dye produced, particularly in dye image amplification, as described above, and silver bleaching is omitted without substantial visual effect. In still other applications the silver image is retained and the dye image is intended to enhance or supplement the density provided by the image silver. In the case of dye enhanced silver imaging it is usually preferred to form a neutral dye. Neutral dye-forming couplers useful for this purpose are disclosed by Pupo et al *Research Disclosure,* Vol. 162, October 1977, Item 16226. The enhancement of silver images with dyes in photographic elements intended for thermal processing is disclosed in *Research Disclosure,* Vol. 173, September 1973, Item 17326, and Houle U.S. Pat. No. 4,137,079.

In the photographic elements described above the dye image supplements or replaces the silver image by employing in combination with the photographic elements conventional color photographic element components and/or processing steps. For example, dye images can be produced in the microvessels of the elements 100 through 1000 or in the imaging components 418 and 518 by modifying the procedures for use described above in view of current knowledge in the field of color photography. Accordingly, the following detailed description of dye image formation is directed to certain unique, illustrative combinations, particularly those in which the radiation-sensitive portion of the photographic element is divided into two components.

In one highly advantageous form of the invention having unique properties the photographic element 400 can be formed so that a radiation-sensitive silver halide emulsion component 416 is contained within the reaction microvessel while a dye image providing component 418 overlies the reaction microvessel. The dye image providing component is chosen from among conventional components capable of forming or destroying a dye in proportion to the amount of silver developed in the microvessel. Preferably the dye image providing component contains a bleachable dye useful in a silver-dye-bleach process or an incorporated dye-forming coupler. In an alternative form the bleachable dye or dye-forming coupler can be present in the emulsion component 416, and the separate imaging component 418 can be omitted.

When a photon is absorbed by a silver halide grain a hole-electron pair is created. Both the electron and hole can migrate through the crystal lattice, but they are generally precluded in an emulsion from migrating to an adjacent silver halide grain. While holes are employed in surface fogged emulsions to provide direct-positive images, in the more typical negative-working silver halide emulsions which are initially unfogged the electrons generated by the absorbed photons are relied upon to produce an image. The electrons provide the valence electrons given up by silver in the crystal lattice to form metallic silver. It has been postulated that when four or more metallic silver atoms are formed at one location within the crystal a developable latent image site is created.

It is known in silver halide photography and is apparent from the mechanism of latent image formation described above that the speed of silver halide emulsions generally increases as a function of the average silver halide grain size. It is also known that larger silver halide grains produce images exhibiting greater graininess. Ordinary silver halide photographic elements employ silver halide grains whose size is chosen to strike the desired balance between speed and graininess for the intended end use. For example, in forming photographic images intended to be enlarged many times, graininess must be low. On the other hand, radiographic elements generally employ coarse silver halide grains in order to achieve the highest possible speeds consistent with necessary image resolution. It is further known in the photographic arts that techniques which increase the speed of a photographic element without increasing image graininess can be used to decrease image graininess or can be traded off in element design to improve some combination of speed and graininess. Conversely, techniques which improve image graininess without decreasing photographic speed can be used to improve speed or to improve a combination of speed and graininess.

It has been recognized and reported in the art that some photodetectors exhibit detective quantum efficiencies which are superior to those of silver halide photographic elements. A study of the basic properties of conventional silver halide photographic elements shows that this is largely due to the binary, on-off nature of individual silver halide grains, rather than their low quantum sensitivity. This is discussed, for example, by Shaw, "Multilevel Grains and the Ideal Photographic Detector", *Photographic Science and Engineering,* Vol. 16, No. 3, May/June 1972, pp. 192–200. What is meant by the on-off nature of silver halide grains is that once a latent image site is formed on a silver halide grain, it becomes entirely developable. Ordinarily development is independent of the amount of light which has struck the grain above a threshold, latent image forming amount. The silver halide grain produces exactly the same product upon development whether it has absorbed many photons and formed several latent image sites or absorbed only the minimum number of photons to produce a single latent image site.

The silver halide emulsion component 416 can employ very large, very high speed silver halide grains. Upon exposure by light or X-rays, for instance, latent image sites are formed in and on the silver halide grains. Some grains may have only one latent image site, some many and some none. However, the number of latent image sites formed within a single reaction microvessel 408 is related to the amount of exposing radiation. Because the silver halide grains are relatively coarse, their speed is relatively high. Because the number of latent image sites within each microvessel is directly related to the amount of exposure that the microvessel has received, the potential is present for a high detective quantum efficiency, provided this information is not lost in development.

In a preferred form each latent image site is then developed to increase its size without completely developing the silver halide grains. This can be undertaken by interrupting silver halide development at an earlier than usual stage, well before optimum development for ordinary photographic applications has been achieved. Another approach is to employ a DIR coupler and a color developing agent. The inhibitor released upon coupling can be relied upon to prevent complete development of the silver halide grains. In a preferred form of practicing this step selfinhibiting developers are employed. A self-inhibiting developer is one which initiates development of silver halide grains, but itself stops development before the silver halide grains have been entirely developed. Preferred developers are self-inhibiting developers containing p-phenylenediamines, such as disclosed by Neuberger et al, "Anomalous Concentration Effect: An inverse Relationship Between the Rate of Development and Developer Concentration of Some p-Phenylenediamines", *Photographic Science and Engineering,* Vol. 19, No. 6, Nov.-Dec. 1975, pp. 327-332. Whereas with interrupted development and development in the presence of DIR couplers silver halide grains having a longer development induction period than adjacent developing grains can be entirely precluded from development, the use of a self-inhibiting developer has the advantage that development of an individual silver halide grain is not inhibited until after some development of that grain has occurred.

After development enhancement of the latent image sites, there is present in each microvessel a plurality of silver specks. These specks are proportional in size and number to the degree of exposure of each microvessel. The specks, however, present a random pattern within each microvessel and are further too small to provide a high density. The next objective is to produce in each pixel a dye density which is substantially uniform over the entire area of its microvessel. Inasmuch as the preferred self-inhibiting developers contain color developing agents, the oxidized developing agent produced can be reacted with a dye-forming coupler to create the dye image. However, since only a limited amount of silver halide is developed, the amount of dye which can be formed in this way is also limited. An approach which removes any such limitation on maximum dye density formation, but which retains the proportionality of dye density in each pixel to the degree of exposure is to employ a silver catalyzed oxidation-reduction reaction using a peroxide or transition metal ion complex as an oxidizing agent and a dye-image-generating reducing agent, such as a color developing agent, as illustrated by the patents cited above of Bissonette, Travis, Dunn et al, Matejec and Mowrey and the accompanying publications. In these patents it is further disclosed that where the silver halide grains form surface latent images the latent images can themselves provide sufficient silver to catalyze a dye image amplification reaction. Accordingly, the step of enhancing the latent image by development is not absolutely essential, although it is preferred. In the preferred form any visible silver remaining in the photographic element after forming the dye image is removed by bleaching, as is conventional in color photography.

The resulting photographic image is a dye image in which each pixel in the array exhibits a dye density which is internally uniform and proportional to the amount of exposing radiation which has been supplied to the pixel. The regular arrangement of the pixels serves to reduce the visual sensation of graininess. The pixels further supply more information about the exposing radiation than can be obtained by completely developing the silver halide grains containing latent image sites. The result is that the detective quantum efficiency of the photographic element is quite high. Both high photographic speeds and low graininess are readily obtainable. Where the dye is formed in the microvessels rather than in an overcoat, as shown, further protection against lateral image spreading is obtained. All of the advantages described above in connection with silver imaging are, of course, also obtained in dye imaging and need not be described again in detail. Further, while this preferred process of dye imaging has been discussed referring specifically to the photographic element 400, it is appreciated that it can be practiced with any of the photographic elements shown and described above.

Referring to the photographic element 500, in one preferred form the component 518 can be a silver halide emulsion layer and the component 516 can be a dye image-forming component. In conventional color photographic elements the radiation-sensitive portion of the element is commonly formed of layer units, each comprised of a silver halide emulsion layer and an adjacent hydrophilic colloid layer containing an incorporated dye-forming coupler or bleachable dye. The components 518 and 516 in terms of composition can be identical to these two conventional color photographic element layer unit coatings.

A significant difference between the photographic element 500 and a photographic element having a continuously coated dye image component is that the reaction microvessel 514 limits lateral image spreading of the imaging dye. That is, it can laterally limit the chemical reaction which is forming the dye, where a coupler is employed, or bleaching the dye, in the case of a silver-dye-bleach process. Since the silver image produced by exposing and developing the element can be bleached from the element, it is less important to image definition that silver development is not similarly laterally restrained. Further, it is recognized by those skilled in the art that greater lateral spreading typically occurs in dye imaging than when forming a silver image in a silver halide photographic element. It is apparent that the advantages of this component relationship is also applicable to photographic element 400.

Additive Multicolor Imaging

It has been recognized in the art that additive multicolor images can be formed using a continuous, panchromatically sensitized silver halide emulsion layer which is exposed and viewed through an array of additive primary (blue, green and red) filter areas. Exposure through an additive primary filter array allows silver halide to be selectively developed, depending upon the pattern of blue, green and red light passing through the overlying filter areas. If a negative-working silver halide emulsion is employed, the multicolor image obtained is a negative of the exposure image, and if a direct-positive emulsion is employed, a positive of the exposure image is obtained. Additive primary multicolor images can be reflection viewed, but are best suited for projection viewing, since they require larger amounts of light than conventional subtractive primary multicolor images to obtain comparable brightness.

Dufay U.S. Pat. No. 1,003,720 teaches forming an additive multicolor filter by alternately printing two-thirds of a filter element with a greasy material to leave uncovered an array of areas. An additive primary dye is imbibed into the filter element in the uncovered areas. By repeating the sequence three times the entire filter area is covered by an interlaid pattern of additive primary filter areas. Rogers U.S. Pat. No. 2,681,857 illustrates an improvement on the Dufay process of forming an additive primary multicolor filter by printing. Rheinberg U.S. Pat. No. 1,191,034 obtains essentially a similar effect by using subtractive primary dyes (yellow, magenta and cyan) which are allowed to laterally diffuse so that two subtractive primaries are fused in each area to produce an additive primary dye filter array.

More recently, in connection with semiconductor sensors, additive primary multicolor filter layers have been developed which are capable of defining an interlaid pattern of areas of less than 100 microns on an edge and areas of less than $10^{-4}$ $cm^2$. One approach is to form the filter layer so that it contains a dye mordant. In this way when an interlaid pattern of additive primary dyes is introduced to complete the filter, mordanting of the dyes reduces lateral dye spreading. Filter layers comprised of mordanted dyes and processes for their preparation are disclosed by Horak et al U.S. Ser. No. 867,841, filed Jan. 9, 1978, and *Research Disclosure,* Vol. 157, May 1977, Item 15705, here incorporated by reference. Examples of mordants and mordant layers useful in preparing such filters are described in the following: Sprague et al U.S. Pat. No. 2,548,564; Weyerts U.S. Pat. No. 2,548,575; Carroll et al U.S. Pat. No. 2,675,316; Yutzy et al U.S. Pat. No. 2,713,305; Saunders et al U.S. Pat. No. 2,756,149; Reynolds et al U.S. Pat. No. 2,768,078; Gray et al U.S. Pat. No. 2,839,401; Minsk U.S. Pat. Nos. 2,882,156 and 2,945,006; Whitmore et al U.S. Pat. No. 2,940,849; Condax U.S. Pat. No. 2,952,566; Mader et al U.S. Pat. No. 3,016,306; Minsk et al U.S. Pat. Nos. 3,048,487 and 3,184,309; Bush U.S. Pat. No. 3,271,147; Whitmore U.S. Pat. No. 3,271,148; Jones et al U.S. Pat. No. 3,282,699; Wolf et al U.S. Pat. No. 3,408,193; Cohen et al U.S. Patents 3,488,706, 3,557,066, 3,625,694; 3,709,690, 3,758,445, 3,788,855, 3,898,088 and 3,944,424; Cohen U.S. Pat. No. 3,639,357; Taylor U.S. Pat. No. 3,770,439; Campbell et al U.S. Pat. No. 3,958,995; and Ponticello et al *Research Disclosure,* Vol. 120, April 1974, Item 12045. Preferred mordants for forming filter layers are more specifically disclosed by *Research Disclosure,* Vol. 167, March 1978, Item 16725.

Another approach to forming an additive primary multicolor filter array is to incorporate photobleachable dyes in a filter layer. By exposure of the element with an image pattern corresponding to the filter areas to be formed dye can be selectively bleached in exposed areas leaving an interlaid pattern of additive primary filter areas. The dyes can thereafter be treated to avoid subsequent bleaching. Such an approach is disclosed by *Research Disclosure,* Vol. 177, January 1979, Item 17735.

In addition to any one or combination of the various additive primary materials described above, virtually any known additive primary dye or pigment can, if desired, be selected for use in the multicolor filters. For example, the additive primary dyes and pigments mentioned in the *Colour Index,* Volumes I and II, Second Edition, are generally useful in the practice of at least one form of the present invention.

While it is recognized that conventional additive primary multicolor filter layers can be employed in connection with the photographic elements 100 through 1000 to form additive multicolor images in accordance with this invention, it is preferred to form additive primary multicolor filters comprised of an interlaid pattern of additive primary dyes or pigments in an array of microvessels. The microvessels offer the advantages of providing a physical barrier between adjacent additive primary dye areas thus avoiding lateral spreading, edge comingling of the dyes and similar disadvantages. The microvessels can be identical in size and configuration to those which have been described above.

Figure 11A:
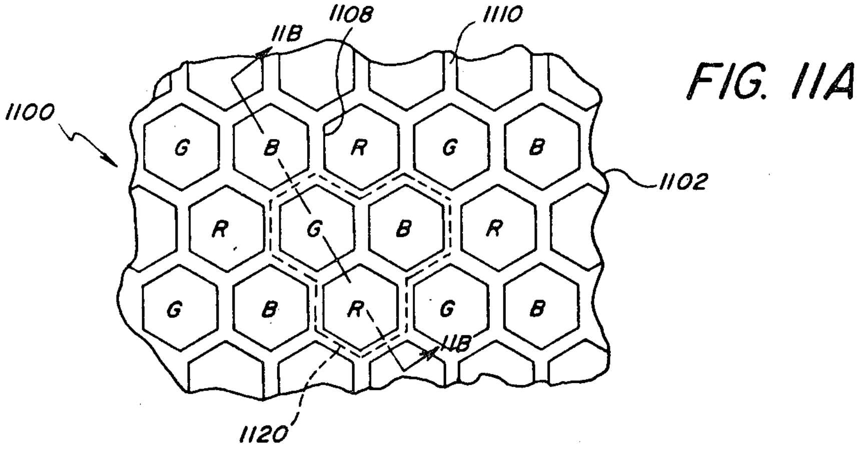
FIG. 11A is a plan view of an element portion according to this invention.
Figure 11B:
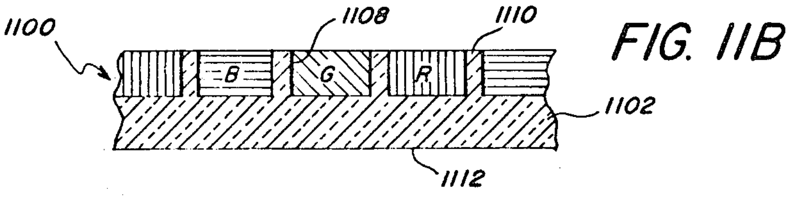

In FIGS. 11A and 11B an exemplary filter element 1100 of this type is illustrated which is similar to the photographic element 100 shown in FIGS. 1A and 1B, except that instead of radiation-sensitive material being contained in the microvessels 1108, an interlaid pattern of green, blue and red dyes or pigments is provided, indicated by the letters G, B and R, respectively. The dashed line 1120 surrounding an adjacent triad of green, blue and red containing microvessels defines a single pixel of the filter element which is repeated to make up the interlaid pattern of the element. It can be seen that each microvessel of a single pixel is equidistant from the two remaining microvessels thereof. Looking at an area somewhat larger than a pixel, it can be seen that each microvessel containing one color is surrounded by microvessels containing the remaining two colors. Thus, it is easy for the eye to fuse the colors of the adjacent microvessels or, during projection, for light passing through adjacent microvessels to fuse. The underlying portion 1112 of the support 1102 must be transparent to permit projection viewing. While the lateral walls 1110 of the support can be transparent also, they are preferably opaque (e.g., dyed), particularly for projection viewing, as has been discussed above in connection with element 100. Placing the red, green and blue additive primary dyes in microvessels offers a distinct advantage in achieving the desired lateral relationship of individual filter areas. Although lateral dye spreading can occur in an individual microvessel which can be advantageous in providing a uniform dye density within the microvessel, gross dye spreading beyond the confines of the microvessel lateral walls is prevented.

An exemplary filter element has been illustrated as a variant of photographic element 100, but it is appreciated that corresponding filter element variants of photographic elements 200 through 1000 are also contemplated. It is, of course, recognized that other interlaid patterns of microvessels are possible. For example, instead of being interlaid in the manner shown, the blue, green and red filter areas can form separate rows of microvessels. For instance, a row of filter areas of one color can be interposed between two filter area rows, one of each of the two remaining additive primary colors. Different interlaid patterns can also occur as a result of devoting unequal numbers of microvessels to the different filter colors. For example, it is recognized that the human eye obtains most of its information from the green portion of the spectrum. Less information is obtained from the red portion of the spectrum, and the least amount of information is obtained from the blue portion of the spectrum. Bayer U.S. Pat. No. 3,971,065 discloses an interlaid additive primary multicolor filter area pattern in which the green areas occupy half of the total filter area, with red and blue filter areas each occupying one half of the remaining area of the filter. Still other filter area patterns can be employed, if desired.

In FIG. 11C the use of filter element 1100 in combination with photographic element 100 is illustrated. The photographic element contains in the reaction microvessels 108 a panchromatically responsive radiation-sensitive imaging means 116, such as a panchromatically sensitized silver halide emulsion. The microvessels 1108 of the filter element are aligned (registered) with the microvessels of the photographic element. Exposure of the photographic element occurs through the blue, green and red filter areas of the aligned filter element. The filter element and the photographic element can be separated for processing and subsequently realigned for viewing or further use, as in forming a photographic print. The second alignment can be readily accomplished by viewing the image during the alignment procedure. It is possible to join the filter element and photographic element by attachment along one or more edges so that, once positioned, the alignment between the two elements is subsequently preserved. Where the filter and photographic elements remain in alignment, processing fluid can be dispensed between the elements in the same manner as incamera image transfer processing. In order to render less exacting the process of initial alignment of the filter and photographic element microvessels, the microvessels of the filter element can be substantially larger in area than those of the photographic element and can, if desired, overlie more than one of the microvessels of the photographic element. Complementary edge configurations, not shown, can be provided on the photographic and filter elements to facilitate alignment. A variant form which insures alignment of the silver halide and the additive primary filter microvessels is achieved by modifying element 900 so that silver halide remains in microvessels 908A, but additive primary dyes or pigments are present in microvessels 908B.

By combining the functions of the filter and photographic elements in a single element any inconveniences of registering separate filter and photographic element microvessels can be entirely obviated. Photographic elements 1200, 1300 and 1400 illustrate forms of the invention in which both radiation-sensitive imaging (hereinafter described by references to a preferred imaging material, a silver halide emulsion) and filter materials are positioned in the same element microvessels. These elements appear in plan view identical to element 1100 in FIG. 11A. The views of elements 1200, 1300 and 1400 shown in FIGS. 12, 13 and 14, respectively, are sections of these elements which correspond to the section shown in FIG. 11B of the element 1100.

The photographic element 1200 is provided with microvessels 1208. In the bottom of each microvessel is provided a filter portion, indicated by the letters B, G and R. A panchromatically sensitized silver halide emulsion 1216 is located in the microvessels so that it overlies the filter portion contained therein.

The photographic element 1300 is provided with microvessels 1308. In the microvessels designated B a blue filter material is blended with a blue sensitized silver halide emulsion. Similarly in the microvessels designated G and R a green filter material is blended with a green sensitized silver halide emulsion and a red filter material is blended with a red sensitized silver halide emulsion, respectively. In this form the silver halide emulsion is preferably chosen so that it has negligible native blue sensitivity, since the blended green and red filter materials offer substantial, but not complete, filter protection against exposure by blue light of the emulsions with which they are associated. In a preferred form silver chloride emulsions are employed, since they have little native sensitivity to the visible spectrum.

The photographic element 1400 is provided with a transparent first support element 1402 and a yellow second support element 1408. The microvessels B extend from the outer major surface 1412 of the second support element to the first support element. The microvessels G and R have their bottom walls spaced from the first support element. The contents of the microvessels can correspond to those of the photographic element 1300, except that the silver halide emulsions need not be limited to those having negligible blue sensitivity in order to avoid unwanted exposure of the G and R microvessels. For example, iodide containing silver halide emulsions, such as silver bromoiodides, can be employed. The yellow color of the second support element allows blue light to be filtered so that it does not reach the G and R microvessels in objectionable amounts when the photographic element is exposed through the support. The yellow color of the support can be imparted and removed for viewing using materials and techniques conventionally employed in connection with yellow filter layers, such as Carey Lea silver and bleachable yellow filter dye layers, in multilayer multicolor photographic elements. The yellow color of the support can also be incorporated by employing a photobleachable dye. Photobleaching is substantially slower than imaging exposure so that the yellow color remains presentuduring imagewise exposure, but after processing handling in room-light or intentional uniform light exposure can be relied upon to bleach the dye. Photobleachable dyes which can be incorporated into supports are disclosed, for example, by Jenkins et al U.S. Pat. No. Re. 28,225 and the Sturmer and Kruegor U.S. Patents cited above. The optimum approach for imparting and removing yellow color varies, of course, with the specific support element material chosen.

While the elements 1100 and 1400 illustrated in connection with additive primary multicolor imaging confine both the imaging and filter materials to the microvessels, it is appreciated that continuous layers can be used in combination in various ways. For example, the filter element 1100 can be overcoated with a panchromatically radiation-sensitive imaging means of any of the various types described above, such as a panchromatically sensitized silver halide emulsion layer. Although the advantages of having the radiation-sensitive imaging material in the microvessels are not achieved, the advantages of having the filter elements in microvessels are retained. In the photographic elements 1200, 1300 and 1400 it is specifically contemplated that the radiation-sensitive portion of the photographic element can be present as two components, one contained in the microvessels and one in the form of a layer overlying the microvessels, as has been specifically discussed above in connection with photographic elements 400 and 500. In the interest of succinctness element features are not discussed which are identical or clearly analogous to features which have been previously discussed in detail.

In one preferred additive primary multicolor imaging application one or a combination of bleachable leuco dyes are incorporated in the silver halide emulsion or a contiguous component. Suitable bleachable leuco dyes useful in silver-dye-bleach processes have been identified above in connection with dye imaging. The leuco dye or combination of leuco dyes are chosen to yield a substantially neutral density. In a specifically preferred form the leuco dye or dyes are located in the reaction microvessels. The silver halide emulsion that is employed in combination with the leuco dyes is a negative-working emulsion.

Upon exposure of the silver halide emulsion through the filter element silver halide is rendered developable in areas where light penetrates the filter elements. The silver halide emulsion can be developed to produce a silver image which can react with or catalyze a separate reaction with the dye to destroy it using silver-dye-bleach processes, described above. Upon contact with alkaline developer solution, the leuco dyes are converted to a colored form uniformly within the element. The silver-dye-bleach step causes the colored dyes to be bleached selectively in areas where exposed silver halide has been developed to form silver. The developed silver which reacts with dye is reconverted into silver halide and thereby removed. In every case subsequent silver bleaching can be undertaken, if desired. The colored dye which is not bleached is of sufficient density to prevent light from passing through the filter elements with which it is aligned.

When exposure and viewing occur through an additive primary filter array, the result is a positive additive primary multicolor dye image. It is surprising and advantageous that a direct-positive multicolor image is obtained with a single negative-working silver halide emulsion. Having the dye in its leuco form during silver halide exposure avoids any reduction of emulsion speed by reason of competing absorption by the dye. Further, the use of a negative-working emulsion permits very high emulsion speeds to be readily obtained. By placing both the imaging and filter dyes in the microvessels registration is assured and lateral image spreading is entirely avoided.

Another preferred approach to additive primary multicolor imaging is to use as a redox catalyst an imagewise distribution of silver made available by silver halide emulsion contained in the reaction microvessels to catalyze a neutral dye image producing redox reaction in the microvessels. The formation of dye images by such techniques are described above in connection with dye imaging. This approach has the advantage that very low silver coverages are required to produce dye images. The silver catalyst can be sufficiently low in concentration that it does not limit transmission through the filter elements. An advantage of this approach is that the redox reactants can be present in either the photographic element or the processing solutions or some combination thereof. So long as redox catalyst is confined to the microvessels lateral image spreading can be controlled, even though the dye-forming reactants are coated in a continuous layer overlying the microvessels. In one form a blend of three different subtractive primary dye-forming reactants are employed. However, only a single subtractive primary dye need be formed in a microvessel in order to limit light transmission through the filter and microvessel. For example, forming a cyan dye in a microvessel aligned with a red filter element is sufficient to limit light transmission.

To illustrate a specific application, in any one of the arrangements illustrated in FIGS. 11C, 12, 13 and 14, the silver halide emulsion contained in the microvessels is exposed through the filter elements. Where the silver halide emulsion forms a surface latent image, this can be enough silver to act as a redox catalyst. It is generally preferred to develop the latent image to form additional catalytic silver. The silver, acting as a redox catalyst, permits the selective reaction of a dye-image-generating reducing agent and an oxidizing agent at its surface. If the emulsion or an adjacent component contains a coupler, for example, reaction of a color developing agent, acting as a dye-imaging-generating reducing agent, with an oxidizing agent, such as a peroxide oxidizing agent (e.g., hydrogen peroxide) or transition metal ion complex (e.g., cobalt(III) hexammine), at the silver surface can result in a dye-forming reaction occurring. In this way a dye can be formed in the microvessels. Dye image formation can occur during and/or after silver halide development. The transition metal ion complexes can also cause dye to be formed in the course of bleaching silver, if desired. In one form the microvessels each contain a yellow, magenta or cyan dye-image-generating reducing agent and the blue, green and red filter areas are aligned with the microvessels so that subtractive and additive primary color pairs can be formed in alignment capable of absorbing throughout the visible spectrum.

In the foregoing discussion additive primary multicolor imaging is accomplished by employing blue, green and red filter dyes or pigments preferably contained in microvessels. It is also possible to produce additive multicolor images according to the present invention by employing subtractive primary dyes or pigments in combination. For example, it is known that if any two subtractive primary colors are mixed the result is an additive primary color. In the present invention, if two microvessels in transparent supports are aligned, each containing a different subtractive primary, only light of one additive primary color can pass through the aligned microvessels. For example, a filter which is the equivalent of filter 1100 can be formed by employing in the microvessels 908A and 908B of the element 900 subtractive primary dyes rather than silver halide. Only two subtractive primary dyes need to be supplied to a side to provide a multicolor filter capable of transmitting red, green and blue light in separate areas. By modifying the elements 1100, 1200, 1300 and 1400 so that aligned microvessels are present on opposite surfaces of the support, it is possible to obtain additive primary filter areas with combinations of subtractive primary colors.

Subtractive Multicolor Imaging

Multicolor images formed by laterally displaced green, red and blue additive primary pixel areas can be viewed by reflection or, preferably, projection to reproduce natural image colors. This is not possible using the subtractive primaries-yellow, magenta and cyan. Multicolor subtractive primary dye images are most commonly formed by providing superimposed silver halide emulsion layer units each capable of forming a subtractive primary dye image.

Photographic elements according to the present invention capable of forming multicolor images employing subtractive primary dyes can be in one form similar in structure to corresponding conventional photographic elements, except that in place of at least the image-forming layer unit nearest the support, at least one image-forming component of the layer unit is located in the reaction microvessels, as described above in connection with dye imaging. The microvessels can be overcoated with additional image-forming layer units according to conventional techniques.

It is possible in practicing the present invention to form each of the three subtractive dye images which together form the multicolor dye image in the reaction microvessels. By one preferred approach this can be achieved by employing three silver halide emulsions, one sensitive to blue exposure, one sensitive to green exposure and one sensitive to red exposure. Silver halide emulsions can be employed which have negligible native sensitivity in the visible portion of the spectrum, such as silver chloride, and which are separalely spectrally sensitized. It is also possible to employ silver halide emulsions which have substantial native sensitivity in the blue region of the spectrum, such as silver bromoiodide. Red and green spectral sensitizers can be employed which substantially desensitize the emulsions in the blue region of the spectrum. The native blue sensitivity can be relied upon to provide the desired blue response for the one emulsion intended to respond to blue exposures or a blue sensitizer can be relied upon. The blue, green and red responsive emulsions are blended, and the blended emulsion introduced into the reaction microvessels. The resulting photographic element can, in one form, be identical to photographic element 100. The silver halide emulsion 116 can be a blend of three emulsions, each responsive to one third of the visible spectrum. By employing spectral sensitizers which are absorbed to the silver halide grain surfaces and therefore nonwandering any tendency of the blended emulsion to become panchromatically sensitized is avoided.

Following imagewise exposure, the photographic element is black-and-white developed. No dye is formed. Thereafter the photographic element is successively exposed uniformly to blue, green and red light, in any desired order. Following monochromatic exposure and before the succeeding exposure, the photographic element is processed in a developer containing a color developig agent and a soluble coupler capable of forming with oxidized color developing agent a yellow, magenta or cyan dye. Developed silver is removed by bleaching. The result is that a multicolor image is formed by subtractive primary dyes confined entirely to the microvessels. Suitable processing solutions, including soluble couplers, are illustrated by Mannes et al U.S. Pat. No. 2,252,718, Schwan et al U.S. Pat. No. 2,950,970 and Pilato U.S. Pat. No. 3,547,650, cited above. In the preferred form negative-working silver halide emulsions are employed and positive multicolor dye images are obtained.

In another form of the invention mixed packet silver halide emulsions can be placed in the reaction microvessels to form subtractive primary dye multicolor images. In mixed packet emulsions blue responsive silver halide is contained in a packet also containing a yellow dye-forming coupler, green responsive silver halide in a packet containing a magenta dye-forming coupler and red resonsive silver halide in a packet containing a cyan dye-forming coupler. Imaging exposure and processing with a black-and-white developer is performed as described above with reference to the blended emulsions. However, subsequent exposure and processing is comparatively simpler. The element is uniformly exposed with a white light source or chemically fogged and then processed with a color developer. In this way a single color developing step is required in place of the three successive color developing steps employed with soluble couplers. A suitable process is illustrated by the Ektachrome E4 and E6 and Agfa processes described in *British Journal of Photography Annual,* 1977, pp. 194–197, and *British Journal of Photography,* August 1974, pp. 668–669. Mixed packet silver halide emulsions which can be employed in the practice of this invention are illustrated by Godowsky U.S. Pat. Nos. 2,698,974 and 2,843,488 and Godowsky et al U.S. Pat. No. 3,152,907, the disclosures of which are here incorporated by reference.

Silver Transfer Imaging

It is well recognized in the art that transferred silver images can be formed. This is typically accomplished by developing an exposed silver halide photographic element with a developer containing a silver halide solvent. The silver halide which is not developed to silver is solubilized by the solvent. It can then diffuse to a receiver bearing a uniform distribution of physical development nuclei or catalysts. Physical development occurs in the receiver to form a transferred silver image. Conventional silver image transfer elements and processes (including processing solutions) are generally discussed in Chapter 12, "One Step Photography", *Neblette's Handbook of Photography and Reprography Materials, Processes and Systems,* 7th Ed. (1977) and in Chapter 16, "Diffusion Transfer and Monobaths," T. H. James, *The Theory of the Photographic Process,* 4th Ed. (1977), the disclosures of which are here incorporated by reference.

The photographic elements 100 through 1000 described above in connection with silver imaging can be readily employed for producing transferred silver images. Illustrative of silver halide solvent containing processing solutions useful in providing a transferred silver image in combination with these photographic elements are those disclosed by Rott U.S. Pat. No. 2,352,014, Land U.S. Pat. Nos. 2,543,181 and 2,861,885, Yackel et al U.S. Pat. No. 3,020,155 and Stewart et al U.S. Pat. No. 3,769,014. The receiver to which the silver image is transferred is comprised of a conventional photographic support (or cover sheet) onto which is coated a reception layer comprised of silver halide physical developing nuclei or other silver precipitating agents. In a preferred form the receiver and photographic element are initially related so that the emulsion and silver image-forming surfaces of the photographic element and receiver, respectively, are juxtaposed and the processing solution is contained in a rupturable pod to be released between the photographic element and receiver after imagewise exposure of the silver halide emulsion. The photographic element and receiver can be separate elements or can be joined along one or more edges to form an integral element. In a common preferred separate element or peel-apart form the photographic element support is initially transparent and the receiver is comprised of a reflective (e.g., white) support. In a common integral format both the receiver and photographic element supports are transparent and a reflective (e.g., white) background for viewing the silver image is provided by overcoating the silver image-forming reception layer of the receiver with a reflective pigment layer or incorporating the pigment in the processing solution.

A wide variety of nuclei or silver precipitating agents can be utilized in the reception layers used in silver halide solvent transfer processes. Such nuclei are incorporated into conventional photographic organic hydrophilic colloid layers such as gelatin and polyvinyl alcohol layers and include such physical nuclei or chemical precipitants as (a) heavy metals, especially in colloidal form and salts of these metals, (b) salts, the anions of which form silver salts less soluble than the silver halide of the photographic emulsion to be processed, and (c) nondiffusible polymeric materials with functional groups capable of combining with and insolubilizing silver ions.

Typical useful silver precipitating agents include sulfides, selenides, polysulfides, polyselenides, thiourea and its derivatives, mercaptans, stannous halides, silver, gold, platinum, palladium, mercury, colloidal silver, aminoguanidine sulfate, aminoguanidine carbonate, arsenous oxide, sodium stannite, substituted hydrazines, xanthates, and the like. Poly(vinyl mercaptoacetate) is an example of a suitable nondiffusing polymeric silver precipitant. Heavy metal sulfides such as lead, silver, zinc, aluminum, cadmium and bismuth sulfides are useful, particularly the sulfides of lead and zinc alone or in an admixture or complex salts of these with thioacetamide, dithiooxamide or dithiobiuret. The heavy metals and the noble metals particularly in colloidal form are especially effective. Other silver precipitating agents will occur to those skilled in the present art.

Instead of forming the receiver with a hydrophilic colloid layer containing the silver halide precipitating agent, it is specifically contemplated to form the receiver alternatively with microvessels. The microvessels can be formed of the same size and configuration as described above. For example, referring to FIG. 11C, if instead of employing red, green and blue filter areas in the microvessels 1108, silver precipitating agent suspended in a hydrophilic colloid is substituted, an arrangement useful in silver image transfer results. The same alignment considerations discussed above in connection with FIG. 11C also apply. In this form the support 1102 is preferably reflective (e.g., white) rather than transparent as shown, although both types of supports are useful. By confining silver image-forming physical development to the microvessels protection against lateral image spreading is afforded.

In another variation of the invention it is contemplated that a conventional photographic element containing at least one continuous silver halide emulsion layer can be employed in combination with a receiver as described above in which the silver precipitating agent is confined within microvessels. Where the silver precipitating agent is confined in the microvessels, their depth can be the same as or significantly less than the depth of microvessels which contain a silver halide emulsion, since the peptizers, binders and other comparatively bulky components characteristic of silver halide emulsions can be greatly reduced in amount or eliminated. Generally reaction microvessel depths as low as those contemplated for vacuum vapor deposited imaging materials, such as silver halide, described above, can be usefully employed also to contain the silver precipitating agents.

Dye Transfer Imaging

A variety of approaches are known in the art for obtaining transferred dye images. The approaches can be generally categorized in terms of the initial mobility of the dyes or dye precursors, hereinafter also referred to as dye image providing compounds. (Initial mobility refers to the mobility of the dye image providing compounds when they are contacted by the processing solution. Initially mobile dye image providing compounds as coated do not migrate prior to contact with processing solution). Dye image providing compounds are classified as either positive-working or negative-working. Positive-working dye image providing compounds are those which product a positive transferred dye image when employed in combination with a conventional, negative-working silver halide emulsion. Negative-working dye image providing compounds are those which produce a negative transferred dye image when employed in combination with conventional, negative-working silver halide emulsions. Image transfer systems, which include both the dye image providing compounds and the silver halide emulsions, are positive-working when the transferred dye image is positive and negative-working when the transferred dye image is negative. When a retained dye image is formed, it is opposite in sense to the transferred dye image. (The foregoing definitions assume the absence of special image reversing techniques, such as those referred to in *Research Disclosure,* Vol. 176, December 1978, Item 17643, paragraph XXIII-E).

A variety of dye image transfer systems have been developed and can be employed in the practice of this invention. One approach is to employ ballasted dye-forming (chromogenic) or nondye-forming (nonchromogenic) couplers having a mobile dye attached at a coupling-off site. Upon coupling with an oxidized color developing agent, such as a para-phenylenediamine, the mobile dye is displaced so that it can transfer to a receiver. The use of such negative-working dye image providing compounds is illustrated by Whitmore et al U.S. Pat. No. 3,227,550, Whitmore U.S. Pat. No. 3,227,552 and Fujiwhara et al U.K. Pat. No. 1,445,797, the disclosures of which are here incorporated by reference.

In a preferred image transfer system employing as negative-working dye image providing compounds redox dye-releasers, a cross-oxidizing developing agent (electron transfer agent) develops silver halide and then cross-oxidizes with a compound containing a dye linked through an oxidizable sulfonamido group, such as sulfonamidophenol, sulfonamidoaniline, sulfonamidoanilide, sulfonamidopyrazolobenzimidazole, sulfonamidoindole or sulfonamidopyrazole. Following cross-oxidation hydrolytic deamidation cleaves the mobile dye with the sulfonamido group attached. Such systems are illustrated by Fleckenstein U.S. Pat. Nos.

3,928,312 and 4,053,312, Fleckenstein et al U.S. Pat. No. 4,076,529, Melzer et al U.S. Pat. No. 4,110,113, Degauchi U.S. Pat. No. 4,199,892, Koyama et al U.S. Pat. No. 4,055,428, Vetter et al U.S. Pat. No. 4,198,235 and Kestner et al *Research Disclosure,* Vol. 151, November 1976, Item 15157. Also specifically contemplated are otherwise similar systems which employ an immobile, dye-releasing (a) hydroquinone, as illustrated by Gompf et al U.S. Pat. No. 3,698,897 and Anderson et al U.S. Pat. No. 3,725,062, (b) para-phenylenediamine, as illustrated by Whitmore et al Canadian Pat. No. 602,607, or (c) quaternary ammonium compound, as illustrated by Becker et al U.S. Pat. No. 3,728,113.

Another specifically contemplated dye image transfer system which employs negative-working dye image providing compounds reacts an oxidized electron transfer agent or, specifically, in certain forms, an oxidized para-phenylenediamine with a ballasted phenolic coupler having a dye attached through a sulfonamido linkage. Ring closure to form a phenazine releases mobile dye. Such an imaging approach is illustrated by Bloom et al U.S. Pat. Nos. 3,443,939 and 3,443,940.

In still another image transfer system employing negative-working dye image providing compounds, ballasted sulfonylamidrazones, sulfonylhydrazones or sulfonylcarbonylhydrazides can be reacted with oxidized para-phenylenediamine to release a mobile dye to be transferred, as illustrated by Puschel et al U.S. Pat. Nos. 3,628,952 and 3,844,785. In an additional negative-working system a hydrazide can be reacted with silver halide having a developable latent image site and thereafter decompose to release a mobile, transferable dye, as illustrated by Rogers U.S. Pat. No. 3,245,789, Kohara et al *Bulletin Chemical Society of Japan,* Vol. 43, pp. 2433–37, and Lestina et al *Research Disclosure,* Vol. 28, December 1974, Item 12832.

The foregoing image transfer systems all employ negative-working dye image providing compounds which are initially immobile and contain a preformed dye which is split off during imaging. The released dye is mobile and can be transferred to a receiver. Positive-working, initially immobile dye image providing compounds which split off mobile dyes are also known. For example, it is known that when silver halide is imagewise developed the residual silver ions associated with the undeveloped silver halide can react with a dye substituted ballasted thiazolidine to release a mobile dye imagewise, as illustrated by Cieciuch et al U.S. Pat. No. 3,719,489 and Rogers U.S. Pat. No. 3,443,941.

Preferred positive-working, initially immobile dye image providing compounds are those which release mobile dye by intramolecular nucleophilic displacement reactions. The compound in its initial form is hydrolyzed to its active form while silver halide development with an electron transfer agent is occurring. Cross-oxidation of the active dye-releasing compound by the oxidized electron transfer agent prevents intramolecular nucleophilic release of the dye moiety. Benzisoxazolone precursors of hydroxylamine dye-releasing compounds are illustrated by Hinshaw et al U.S. Pat. No. 4,199,354 and *Research Disclosure,* Vol. 144, April 1976, Item 14447. N-Hydroquinonyl carbamate dye-releasing compounds are illustrated by Fields et al U.S. Pat. No. 3,980,479. It is also known to employ an immobile reducing agent precursor (electron donor precursor) in combination with an immobile ballasted electron-accepting nucleophilic displacement (BEND) compound which, on reduction, anchimerically displaces a diffusible dye. Hydrolysis of the electron donor precursor to its active form occurs simultaneously with silver halide development by an electron transfer agent. Cross-oxidation of the electron donor with the oxidized electron transfer agent prevents further reaction. Cross-oxidation of the BEND compound with the residual, unoxidized electron donor then occurs. Intramolecular nucleophilic displacement of mobile dye from the reduced BEND compound occurs as part of a ring closure reaction. An image transfer system of this type is illustrated by Chasman et al U.S. Pat. No. 4,139,379.

Other positive-working systems employing initially immobile, dye-releasing compounds are illustrated by Rogers U.S. Pat. No. 3,185,567 and U.K. Pat. Nos. 880,233 and '234.

A variety of positive-working, initially mobile dye image providing compounds can be imagewise immobilized by reduction of developable silver halide directly or indirectly through an electron transfer agent. Systems which employ mobile dye developers, including shifted dye developers, are illustrated by Rogers U.S. Pat. Nos. 2,774,668 and 2,983,606, Idelson et al U.S. Pat. No. 3,307,947, Dershowitz et al U.S. Pat. No. 3,230,085, Cieciuch et al U.S. Pat. No. 3,579,334, Yutzy U.S. Pat. No. 2,756,142 and Harbison Def. Pub. T889,017 and Bush et al U.S. Pat. No. 3,854,945. In a variant form a dye moiety can be attached to an initially mobile coupler. Oxidation of a para-phenylenediamine or hydroquinone developing agent can result in a reaction between the oxidized developing agent and the dye containing a coupler to form an immobile compound. Such systems are illustrated by Rogers U.S. Pat. Nos. 2,774,668 and 3,087,817, Greenhalgh et al U.K. Pat. Nos. 1,157,501-506, Puschel et al U.S. Pat. No. 3,844,785, Stewart et al U.S. Pat. No. 3,653,896, Gehin et al French Pat. No. 2,287,711 and *Research Disclosure,* Vol. 145, May 1976, Item 14521.

Other image transfer systems employing positive-working dye image providing compounds are known in which varied immobilization or transfer techniques are employed. For example, a mobile developer-mordant can be imagewise immobilized by development of silver halide to imagewise immobilize an initially mobile dye, as illustrated by Haas U.S. Pat. No. 3,729,314. Silver halide development with an electron transfer agent can produce a free radical intermediate which causes an initially mobile dye to polymerize in an imagewise manner, as illustrated by Pelz et al U.S. Pat. No. 3,585,030 and Oster U.S. Pat. No. 3,019,104. Tanning development of a gelatino-silver halide emulsion can render the gelatin impermeable to mobile dye and thereby imagewise restrain transfer of mobile dye as illustrated by Land U.S. Pat. No. 2,543,181. Also gas bubbles generated by silver halide development can be used effectively to restrain mobile dye transfer, as illustrated by Rogers U.S. Pat. No. 2,774,668. Electron transfer agent not exhausted by silver halide development can be transferred to a receiver to imagewise bleach a polymeric dye to a leuco form, as illustrated by Rogers U.S. Pat. No. 3,015,561.

A number of image transfer systems employing positive-working dye image providing compounds are known in which dyes are not initially present, but are formed by reactions occurring in the photographic element or receiver following exposure. For example, mobile coupler and color developing agent can be imagewise reacted as a function of silver halide development to produce an immobile dye while residual developing agent and coupler are transferred to the receiver and the developing agent is oxidized to form on coupling a transferred immobile dye image, as illustrated by Yutzy U.S. Pat. No. 2,756,142, Greenhalgh et al U.K. Pat. Nos. 1,157,501-506 and Land U.S. Pat. Nos. 2,559,643, 2,647,049, 2,661,293, 2,698,244 and 2,698,798. In a variant form of this system the coupler can be reacted with a solubilized diazonium salt (or azosulfone precursor) to form a diffusible azo dye before transfer, as illustrated by Viro et al U.S. Pat. No. 3,837,852. In another variant form a single, initially mobile coupler-developer compound can participate in intermolecular self-coupling at the receiver to form an immobile dye image, as illustrated by Simon U.S. Pat. No. 3,537,850 and Yoshiniobu U.S. Pat. No. 3,865,593. In still another variant form a mobile amidrazone is present with the mobile coupler and reacts with it at the receiver to form an immobile dye image, as illustrated by Janssens et al U.S. Pat. No. 3,939,035. Instead of using a mobile coupler, a mobile leuco dye can be employed. The leuco dye reacts with oxidized electron transfer agent to form an immobile product, while unreacted lecuo dye is transferred to the receiver and oxidized to form a dye image, as illustrated by Lestina et al U.S. Pat. Nos. 3,880,658, 3,935,262 and 3,935,263, Cohler et al U.S. Pat. No. 2,892,710, Corley et al U.S. Pat. No. 2,992,105 and Rogers U.S. Pat. Nos. 2,909,430 and 3,065,074. Mobile quinoneheterocyclammonium salts can be immobilized as a function of silver halide development and residually transferred to a receiver where conversion to a cyanine or merocyanine dye occurs, as illustrated by Bloom U.S. Pat. Nos. 3,537,851 and '852.

Image transfer systems employing negative-working dye image providing compounds are also known in which dyes are not initially present, but are formed by reactions occurring in the photographic element or receiver following exposure. For example, a ballasted coupler can react with color developing agent to form a mobile dye, as illustrated by Whitmore et al U.S. Pat. No. 3,227,550, Whitmore U.S. Pat. No. 3,227,552, Bush et al U.S. Pat. No. 3,791,827 and Viro et al U.S. Pat. No. 4,036,643. An immobile compound containing a coupler can react with oxidized para-phenylenediamine to release a mobile coupler which can react with additional oxidized para-phenylenediamine before, during or after release to form a mobile dye, as illustrated by Figueras et al U.S. Pat. No. 3,734,726 and Janssens et al German OLS No. 2,317,134. In another form a ballasted amidrazone reacts with an electron transfer agent as a function of silver halide development to release a mobile amidrazone which reacts with a coupler to form a dye at the receiver, as illustrated by Ohyama et al U.S. Pat. No. 3,933,493.

Where mobile dyes are transferred to the receiver any conventional image dye immobilizing material can be present, such as a mordant, an oxidant, or a chelating agent, is commonly present in a dye image providing layer. The mordants and mordant containing layers can be identical to those described above in connection with Additive Multicolor Imaging (but with the difference that no filter dye is present). Where oxidation at the receiver is relied upon to produce an immobile transferred dye image, the receiver can contain as a continuous layer or in microvesels an oxidizing agent. Exemplary useful oxidants for such applications include borates, persulfates, ferricyanides, periodates, perchlorates, triiodides, permanganates, dichromates, manganese dioxide, silver halides, benzoquinones, naphthoquinones, disulfides, nitroxyl compounds, heavy metal oxidants, heavy metal oxidant chelates, N-bromo-succinimides, nitroso compounds, ether peroxides, and the like. The oxidants are preferably chosen from among those of sufficient molecular bulk to be substantially immobile and thereby confined during processing to the receiver. Exemplary preferred immobile oxidants are the immobile nitroxyl compounds disclosed by Ciurca et al U.S. Pat. No. 4,088,488. Other useful immobile oxidants can be chosen from among those described in the patents cited above disclosing oxidation at a receiver to form a dye. Where oxidation does not in itself result in the formation of an immobile dye, as where the oxidant's primary function is to facilitate the formation of a dye, rather than immobilization, a combination of oxidant and a mordant or other immobilizing agent can be present in the dye image providing layer.

The disclosures of the patents and publications cited above as illustrating image transfer systems employing positive and negative-working dye image providing compounds are here incorporated by reference. Any one of these systems for forming transferred dye images can be readily employed in the practice of this invention. Photographic elements according to this invention capable of forming transferred dye images are comprised of at least one image-forming layer unit having at least one component located in the reacion microvessels, as described above in connection with dye imaging. The receiver can be in a conventional form with a dye image providing layer coated continuously on a planar support surface, or the dye image providing layer of the receiver can be segmented and located in microvessels, similarly as described in connection with silver image transfer. The dye not transferred to the receiver can, of course, also be employed in most of the systems identified to form a retained dye image, regardless of whether an image is formed by transfer. For instance, once an imagewise distribution of mobile and immobile dye is formed in the element, the mobile dye can be washed and/or transferred from the element to leave a retained dye image. It is also specifically contemplated to form multiple transferred dye images employing a single microcellular support containing an imagewise distribution of mobile dye or dye precursor. The microvessels can act as wells providing more transferable image dye or dye precursor than is needed for a single transferred image.

Multicolor Transfer Imaging

It is known in the art to form multicolor transferred dye images using an additive primary multicolor imaging photographic element in combination with transferable subtractive primary dyes. Such arrangements are illustrated by Land U.S. Pat. No. 2,968,554 and Rogers U.S. Pat. Nos. 2,983,606 and 3,019,124. According to these patents an additive primary multicolor imaging photographic element is formed by successively coating onto a support three at least partially laterally displaced imaging sets each comprised of a silver halide emulsion containing an additive primary filter dye and a selectively transferable subtractive primary dye or dye precursor. One set is comprised of a red-sensitized silver halide emulsion containing a red filter dye and a mobile cyan dye providing component, another set is comprised of a green-sensitized silver halide emulsion containing a green filter dye and a mobile magenta dye providing component, and a third set is comprised of a blue sensitive silver halide emulsion containing a blue filter dye and a mobile yellow dye providing component. Upon imagewise exposure the spectral sensitization and filter dyes limit response of each set to one of the additive primary colors—blue, green or red. Upon subsequent development mobile subtractive primary dyes are transferred selectively to a receiver as a function of silver halide development. In passing to the receiver the subtractive primary dye being transferred from each set laterally diffuses so that it can overlap subtractive primary dyes migrating from adjacent regions of the remaining two sets. The result is a viewable transferred subtractive primary multicolor image.

Conventional photographic elements of this type suffer a number of disadvantages. First, protection against lateral image spreading between sets, before transfer, is at best incomplete. In the configurations disclosed by Land and Rogers at least one imaging set overlies in its entirety one or more additional imaging sets. Further, at least one of the imaging sets is laterally extended in at least one areal dimension. In one form a first imaging set is in the form of a continuous coating covering the entire imaging area. In other forms at least one imaging set takes the form of continuous stripes. Second, the thickness of the silver halide emulsion portion of the photographic elements is inherently variable, presenting disadvantages in an otherwise planar element format. Since in some areas as many as three sets are superimposed while in other areas only one set is present, either the emulsion portion surface nearest the receiver is nonplanar (leading to nonuniformity in diffusion distances and possible nonuniformities in the receiver and other element portions), or the support is embossed to render the receiver surface of the emulsion portion planar. If the support is embossed, a disadvantage is presented in registering the embossed pattern of the support surface with the set patterns. Third, to the extent that the sets overlap, the silver halide emulsions are not efficiently employed. Finally, the retained dye image is of limited utility. Where the emulsion sets overlap black areas are formed because of the additive primary filter dyes present. The dye retained after transfer therefore cannot form a projectable image, nor would it form an acceptable or useful image by reflection. Also, the dye retained is wrong-reading. The photographic elements then fail to provide a retained multicolor dye negative which can be conveniently transmission printed or enlarged corresponding to a transferred multicolor dye positive image.

Figure 15:
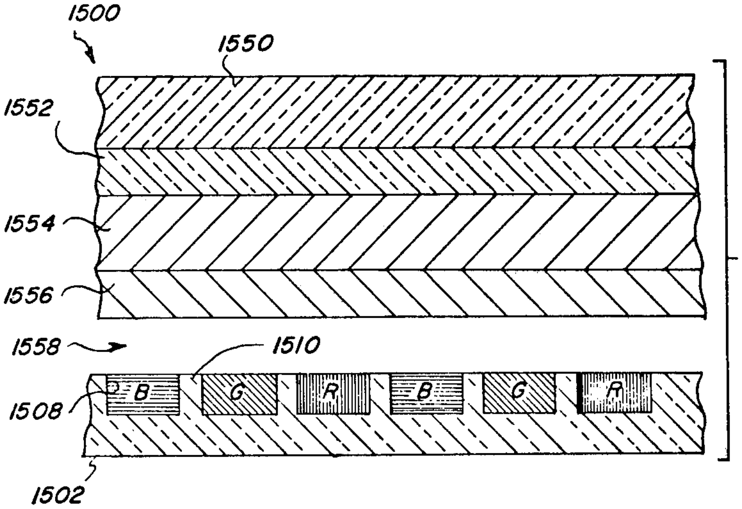

A preferred photographic element capable of forming multicolor transferred dye images according to the present invention is illustrated in FIG. 15. The photographic element 1500 preferably is of the integral format type. A transparent support 1502 is provided which can be identical to transparent support 1102 described above. The support is provided with reaction microvessels 1508 separated by lateral walls 1510. The lateral walls are preferably dyed or opaque for reasons which have been discussed above. In each microvessel there is provided a negative-working silver halide emulsion containing a filter dye. The reaction microvessels form an interlaid pattern, preferably identical to that shown in FIG. 11A, of a first set of reaction microvessels containing red-sensitized silver halide and a red filter dye, a second set of reaction microvessels containing green-sensitized silver halide and a green filter dye and a third set of reaction microvessels containing blue-sensitized or blue sensitive silver halide and a blue filter dye. (In an alternative form, not shown, a panchromatically sensitized silver halide emulsion can be coated over the microvessels rather than incorporating silver halide within the microvessels.) In each of the emulsions there is also provided an initially mobile subtractive primary dye precursor. In the red-sensitized emulsion containing microvessels R, the green-sensitized emulsion containing microvessels G and the blue-sensitized emulsion containing microvessels B are provided mobile cyan, magenta and yellow dye precursors, respectively. The support 1502 and emulsions together form the image-generating portion of the photographic element.

An image-receiving portion of the photographic element is comprised of a transparent support (or cover sheet) 1550 on which is coated a conventional dye immobilizing layer 1552. A reflection and spacing layer 1554, which is preferably white, is coated over the immobilizing layer. A silver reception layer 1556, which can be identical to that described in connection with silver image transfer, overlies the reflection and spacing layer.

In the preferred integral construction of the photographic element the image-generating and image-receiving portions are joined along their edges and lie in face-to-face relationship. After imagewise exposure a processing solution is released from a rupturable pod, not shown, integrally joined to the image-generating and receiving portions along one edge thereof. A space 1558 is indicated between the image-generating and receiving portions to indicate the location of the processing solution when present after exposure. The processing solution contains a silver halide solvent, as has been described above in connection with silver image transfer. A silver halide developing agent is contained in either the processing solution or a processing solution permeable layer which is contacted by the processing solution upon its release from the rupturable pod, for example. The developing agent or agents can be incorporated in the silver halide emulsions. Incorporation of developing agents has been described above.

The photographic element 1500 is preferably a positive-working image transfer system in which dyes are not initially present (other than the filter dyes), but are formed by reactions occurring in the image generating portion or receiver of the photographic element during processing following exposure, described above in connection with Dye Image Transfer.

The photographic element 1500 is imagewise exposed through the transparent support 1502. The red, green and blue filters do not interfere with imagewise exposure, since they absorb in each instance primarily only outside that portion of the spectrum to which the emulsion with which they are associated is sensitized. The filters can, however, perform a useful function in protecting the emulsions from exposure outside the intended portion of the spectrum. For instance, where the emulsions exhibit substantial native blue sensitivity, the red and green filters can be relied upon to absorb light so that the red- and green-sensitized emulsions are not imaged by blue light. Other approaches which have been discussed above for minimizing blue sensitivity of silver halide emulsions can also be employed, if desired.

Upon release of processing solution between the image-forming and receiving portions of the element, silver halide development is initiated in the reaction microvessels containing exposed silver halide. Silver halide development within a reaction microvessel results in a selective immobilization of the initially mobile dye precursor present. In a preferred form the dye precursor is both immobilized and converted to a subtractive primary dye. The residual mobile imaging dye precursor, either in the form of a dye or a precursor, migrates through the silver reception layer 1556 and the reflection and spacing layer 1554 to the immobilizing layer 1552. In passing through the silver reception and spacing layers the mobile subtractive primary dyes or precursors are free to and do spread laterally. Referring to FIG. 11A, it can be seen that each reaction microvessel containing a selected subtractive primary dye precursor is surrounded by microvessels containing precursors of the remaining two subtractive primary dyes. It can thus be seen that lateral spreading results in overlapping transferred dye areas in the immobilizing layer of the receiver when mobile dye or precursor is being transferred from adjacent microvessels. Where three subtractive primary dyes overlap in the receiver, black image areas are formed, and where no dye is present, white areas are viewed due to the reflection from the spacing layer. Where two of the subtractive primary dyes overlap at the receiver an additive primary image area is produced. Thus, it can be seen that a positive multicolor dye image can be formed which can be viewed through the transparent support 1550. The positive multicolor transferred dye image so viewed is righ-treading.

The present invention offers a distinct advantage over conventional multicolor transfer systems in terms of reduced diffusion times required to permit a transferred image to be seen. The three color forming units forming the multicolor transferred image are not superimposed, as in most color image transfer systems, and therefore permit a shorter diffusion path for all mobile dyes or dye precursors.

It is recognized in forming multicolor dye images in conventional photographic elements having superimposed color forming layer units that oxidized color developing agent produced in one layer can, unless restrained, wander to an adjacent layer unit to produce undesirable interimage effects. Accordingly, it is conventional practice to incorporate oxidized developing agent scavengers in interlayers between adjacent color-forming layer units. Such scavengers include ballasted or otherwise nondiffusing (immobile) antioxidants, as illustrated by Weissberger et al U.S. Pat. No. 2,336,327, Loria et al U.S. Pat. No. 2,728,659, Vittum et al U.S. Pat. No. 2,360,290, Jelley et al U.S. Pat. No. 2,403,721 and Thirtle et al U.S. Pat. No. 2,701,197. To avoid autooxidation the scavengers can be employed in combination with other antioxidants, as illustrated by Knechel et al U.S. Pat. No. 3,700,453.

In the multicolor photographic elements according to this invention the risk of unwanted wandering of oxidized developing agent is substantially reduced, since the lateral walls of the support element prevent direct lateral migration between adjacent reaction microvessels. Nevertheless, the oxidized developing agent in some systems can be mobile and can migrate with the mobile dye or dye precursor toward the receiver. It is also possible for the oxidized developing agent to migrate back to an adjacent microvessel. To minimize unwanted dye or dye precursor immobilization prior to its transfer to the immobilizing layer of the receiver, it is preferred to incorporate in the silver reception layer 1556 a conventional oxidized developing agent scavenger. Specific oxidized developing agent scavenger as well as appropriate concentrations for use are set forth in the patents cited above as illustrating conventional oxidized developing agent scavengers, the disclosures of which are here incorporated by reference.

Since the processing solution contains silver halide solvent, the residual silver halide not developed in the reaction microvessels is solubilized and allowed to diffuse to the adjacent silver reception layer. The dissolved silver is physically developed in the silver reception layer. In addition to providing a useful transferred silver image this performs an unexpected and useful function. Specifically, solubilization and transfer of the silver halide from the reaction microvessels operates to limit direct or chemical development of silver halide occurring therein. It is well recognized by those skilled in the art that extended contact between silver halide and a developing agent under development conditions (e.g., at an alkaline pH) can result in an increase in fog levels. By solubilizing and transferring the silver halide a mechanism is provided for terminating silver halide development in the reaction microvessels. In this way production of oxidized developing agent is terminated and immobilization of dye in the microvessels is also terminated. Thus, a very simple mechanism is provided for terminating silver halide development and dye immobilization.

It is, of course, recognized that other conventional silver halide development termination techniques can be employed in lieu of or in combination with that described above. For example, a conventional polymeric acid layer can be overcoated on the cover sheet 1550 and then overcoated with a timing layer prior to coating the dye immobilizing layer 1552. Illustrative acid and timing layer arrangements are disclosed by Cole U.S. Pat. No. 3,635,707 and Abel et al U.S. Pat. No. 3,930,684. In variant forms of this invention it is contemplated that such conventional development termination layers can be employed as the sole means of terminating silver halide development, if desired.

In addition to obtaining a viewable transferred multicolor positive dye image a useful negative multicolor dye image is obtained. In reaction microvessels where silver halide development has occurred an immobilized subtractive primary dye is present. This immobilized imaging dye together with the additive primary filter offers a substantial absorption throughout the visible spectrum, thereby providing a high neutral density to these reaction microvessels. For example, where an immobilized cyan dye is formed in a microvessel also containing a red filter, it is apparent that the cyan dye absorbs red light while the red filter absorbs in the blue and the green regions of the spectrum. The developed silver present in the reaction microvessel also increases the neutral density. In reaction microvessels in which silver halide development has not occurred, the mobile dye precursor, either before or after conversion to a dye, has migrated to the receiver. The sole color present then is that provided by the filter. It is a distinct advantage in reducing minimum density to employ the silver reception layer 1556 to terminate silver halide development as described above rather than to relie on other development termination alternatives. If the image-generating portion of the photographic element 1500 is separated from the image-receiving portion, it is apparent that the image-generating portion forms in itself an additive primary multicolor negative of the exposure image. The additive primary negative image can be used for either transmission or reflection printing to form right-reading multicolor positive images, such as enlargements, prints and transparencies, by conventional photographic techniques. By obtaining a useful multicolor negative, the transferred multicolor image need not be of the usual large size, since the negative is available to produce an enlarged print, if desired. Accordingly, the format of the image transfer element can be small and less expensive, also permitting a smaller, more compact camera to be employed than is needed when the transferred print is the primary photographic product obtained.

It is apparent that transferred multicolor subtractive primary positive images and retained multicolor additive primary negative images can also be obtained as described above by employing direct-positive silver halide emulsions in combination with negative-working dye image providing compounds. Dye precursors are initially present in the reaction microvessels, and dyes are formed by reactions occurring in the image-forming or image-receiving portion following exposure, as described above in connection with dye image transfer.

As can be readily appreciated from the foregoing description, the photographic element 1500 possesses a number of unique and unexpected advantages. In comparing the image-generating portion of the photographic element to those of Land and Rogers discussed above it can be seen that this portion of the photographic element is of a simple construction and thinner than the image-receiving portion of the element, which is the opposite of conventional integral receiver multicolor image transfer photographic elements. The emulsions contained in the microvessels all lie in a common plane and they do not present an uneven or nonplanar surface configuration either to the support or the image-receiving portion of the element. The emulsions are not wasted by being in overlapping arrangements, and they are protected against lateral image spreading by being uniformly laterally confined. Further, the microvessels confining the emulsions can be of identical configuration so that any risk of dye imbalances due to differing emulsion configurations are avoided. Whereas Land and Rogers obtain a wrong-reading retained dye pattern which is at best of questionable utility for reflection imaging, the image-generating portion of the photographic element of this invention provides a right-reading multicolor additive primary retained image which can be conveniently used for either reflective or transmission photographic applications.

Instead of incorporating subtractive primary dye precursors in the reaction microvessels, as described above, it is possible to use subtractive primary dyes directly. If the dye is blended with the emulsion, a photographic speed reduction can be expected, since the subtractive primary dye is competing with the silver halide grains is absorbing red, green or blue light. This disadvantage can be obviated, however, by forming the image-generating portion of the photographic element so that the filter material and silver halide emulsion are blended together and located in the lower portion of the reaction microvessels while the subtractive primary dye, preferably distributed in a suitable vehicle, such as a hydrophilic colloid, is located in the reaction microvessels to overlie the silver halide emulsion. In this way when the photographic element is exposed through the support 1502, exposing radiation is received by the emulsion and competitive absorption by the subractive primary dye or direct incident radiation is not possible. It is also specifically contemplated that instead of mixing the filter material with the emulsion the filter material can be placed in the reaction microvessels before the emulsion, as is illustrated in FIG. 12. The advantages of such an arrangement have been discussed in connection with photographic element 1200. Finally, it is contemplated that the reaction microvessels can be filled in three distinct tiers, with the filter dyes being first introduced, the emulsions next and the subtractive primary dyes overlying the emulsions. It is recognized that preformed image dyes can in still another variant form be shifted in hue so that they do not compete with silver halide in absorbing light to which silver halide in the same microvessel is responsive. The dyes can shift back to their desired image hue upon contact with processing solution. It is thus apparent that any of the conventional positive-working or negative-working image transfer systems which employ preformed subtractive primary dyes, described above in connection with dye image transfer, can be employed in the photographic element 1500. If the filter materials are omitted, no retained image is produced which can be directly viewed.

Figure 16:
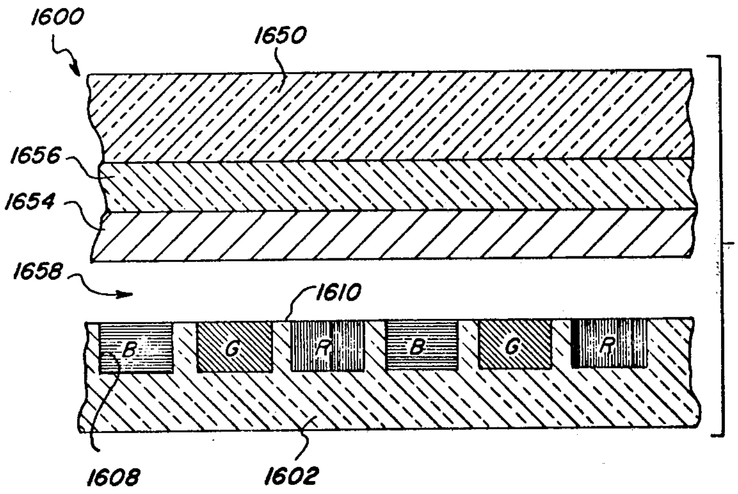

FIG. 16 illustrates a photographic element 1600 which can be substantially simpler in construction than the photographic element 1500. The image-generating portion of the photographic element 1600 can be identical to the image-generating portion of the photographic element 1500. Reference numerals 1602, 1608 and 1610 identify structural features which correspond to those identified by reference numerals 1502, 1508 and 1510, respectively. In a simple preferred form the reaction microvessels 1608 contain silver halide emulsions and filter materials as described in connection with photographic element 1500, but they do not contain an imaging dye or dye precursor.

The image-receiving portion of the photographic element 1600 is comprised of a transparent support 1650 onto which is coated a silver reception layer 1656 which can be identical to silver reception layer 1556. A reflective layer 1654 is provided on the surface of the silver reaction layer remote from the support 1650. The reflection layer is preferably thinner than the imaging and spreading layer 1554, since it is not called upon to perform an intentional spreading function. The reflection layer is preferably white.

Upon exposure through the support 1602 negative-working silver halide is rendered developable in the exposed microvessels. Upon introducing a processing solution containing a silver halide developing agent and a silver halide solvent in the space 1658 indicated between the image-receiving and image-generating portions, silver halide development is initiated in the exposed reaction microvessels and silver halide solubilization is initiated in the unexposed microvessels. The solubilized silver halide is transferred through the reflection layer 1654 and forms a silver image at the silver reception layer 1656. In viewing the silver image in the silver reception layer through the support 1650 against the background provided by the reflection layer a right-reading positive silver image is provided. The photographer is thus able to judge the photographic result obtained, although a multicolor positive image is not immediately viewable. The image-generating portion of the photographic element, however, contains a multicolor additive primary negative image. This image can be used to provide multicolor positive images by known photographic techniques when the image-generating portion is separated from the image-receiving portion. The photographic element 1600 offers the user advantage of rapid information as to the photographic result obtained, but avoids the complexities and costs inherent in multicolor dye image transfer.

As described above the photographic element 1600 relies upon silver halide development in the reaction microvessels to provide the required increase in neutral density to form a multicolor additive primary negative image in the image-generating portion of the element. Since it is known that silver reception layers can produce silver images of higher density than those provided by direct silver halide development, it is possible that at lower silver halide coating coverages a satisfactory transferred silver image can be obtained, but a less than desired silver density obtained in the reaction microvessels. The neutral density of the reaction microvessels can be increased by employing any one of a variety of techniques. For example redox processing of the image-generating portion of the photographic element after separation from the image-receiving portion can be undertaken. In redox processing the silver developed in the reaction microvessels acts as a catalyst for dye formation which can increase the neutral density of the microvessels containing silver or can be employed as a catalyst for physical development to enhance the neutral density of the silver containing microvessels. These techniques have been discussed above in greater detail in connection with multicolor additive primary imaging.

In the foregoing discussion of the photographic element 1500 silver halide emulsion is positioned in the reaction microvessels 1508 and silver precipitating agent is located in the silver reception layers 1556. Unique and unexpected advantages can be achieved by reversing this relationship. For example, the layer 1556 can be comprised of a panchromatically sensitized silver halide emulsion while the microvessels 1508 (or a layer overlying the microvessels, not shown) can contain a silver precipitating agent, the remaining components of the microvessels being unchanged.

Assuming for purposes of illustration a negative-working silver halide emulsion in a positive-working image transfer system, upon imagewise exposure through the support 1502, silver halide is rendered developable in the lightstruck areas of the emulsion layer. Upon release of the aqueous alkaline processing solution containing silver halide solvent, unexposed silver halide is solubilized and migrates to the adjacent microvessels where silver precipitation occurs. In the photographic element 1500 a projectable positive additive primary image is obtained in the support 1502 (which is now an image-receiving rather than the image-generating portion of the element). A portion of the imaging dye can be retained in the microvessels to supplement the precipitated silver in providing a neutral density in the unexposed microvessels. The portion of the imaging dye not retained in the microvessels is, of course, immobilized by the layer 1552 and forms a multicolor subtractive primary positive transferred dye image. Oxidized developing agent scavenger is preferably located in the microvessels 1508 to reduce dye stain and facilitate dye transfer. The emulsion layer 1556, the support 1502 and the contents of the microvessels together form the image-generating portion of the element.

One advantage of continuously coating the silver halide emulsion is that a single, panchromatically sensitized silver halide emulsion can be employed since the emulsion is entirely located behind the filter dyes during exposure. Another important advantage is that the microvessels in the support 1502 contain no light-sensitive materials in this form. This allows the relatively more demanding steps of filling the microvessels to be performed in roomlight while the more conventional fabrication step of coating the emulsion as a continuous layer is performed in the dark. It is also apparent that the reaction microvessels can be shallower when they do not contain silver halide emulsion, although this is not essential.

Numerous additional structural modifications of the photographic elements 1500 and 1600 are possible. For example, while the supports 1502 and 1602 have been shown, it is appreciated that specific features of other support elements described above containing microvessels can also be employed in combination, particularly pixels of the type shown in FIGS. 2, 3, 4 and 5, microvessel arrangements as shown in FIGS. 6 and 7 and lenticular support surfaces, as shown in FIG. 10. Instead of the image-receiving portion disclosed in connection with element 1500 any conventional image-receiving portion can be substituted which contains a spacing layer to permit lateral diffusion of mobile subtractive primary dyes, such as those of the Land and Rogers patents, cited above. Instead of the image-receiving portion disclosed in connection with element 1600 an image-receiving portion from any conventional silver image transfer photographic element can be substituted. The dye immobilizing layer 1552 and the silver reception layer 1656 can both be modified so that the materials thereof are located in microvessels, if desired. In one specific form the layers 1552 and 1554 can both be present in microvessels formed by the support 1550. These microvessels can be sized to overlie a plurality of the microvessels 1508, thereby concurrently allowing limited lateral image spreading while preventing uncontrolled lateral image spreading from occurring. For example the microvessels in the support 1550 can correspond to the configuration of pixels 1120. The aqueous alkaline processing solution can be introduced at any desired location between the supports 1502 and 1550 or 1602 and 1650, and one or more the layers associated with support 1550 or 1650 can be associated with support 1502 or 1602 instead. Any of the photographic elements discussed above in connection with Dye Transfer Imaging can be adapted to transfer multicolor dye images by overcoating the one image-forming layer unit required and specifically described with one or, preferably, two additional image-forming layer units each capable of transferring a different subtractive primary dye. Any of the image transfer systems described above in connection with Dye Transfer Imaging can be employed in Multicolor Transfer Imaging, as herein described. The patents cited in connection with Dye Transfer Imaging generally describe Multicolor Transfer Imaging as well. Finally, it is recognized that numerous specific features well known in the photographic arts can be readily applied or adapted to the practice of this invention and for this reason are not specifically redescribed.

The multicolor image transfers systems of this invention can be further illustrated by reference to certain preferred dye image transfer systems. In one specific, illustrative form the photographic element 1500 can contain (1) in a first set of microvessels a blue filter dye or pigment and an initially colorless, mobile yellow dye-forming coupler, (2) in a second, interlaid set of microvessels a green filter dye or pigment and an initially colorless, mobile magenta dye-forming coupler and (3) in a third, interlaid set of microvessels a red filter dye or pigment and an initially colorless, mobile cyan dye-forming coupler. The filter dyes and pigments can be selected from among any of those described above. The initially colorless, mobile dye-forming couplers can be selected from those disclosed by Yutzy U.S. Pat. No. 2,756,142, Greenhalgh et al U.K. Pat. Nos. 1,157,501-'506 and Land U.S. Pat. Nos. 2,559,643, 2,647,049, 2,661,293, 2,698,244 and 2,698,798, cited above. In a preferred form a panchromatically sensitized negative-working silver halide emulsion (not shown in FIG. 15) is coated over the microvessels. The layer 1556 contains a silver precipitating agent and an oxidized developing agent scavenger, the composition of which can take any of the forms described above. The reflection and spacing layer 1554 can be a conventional titanium oxide pigment containing layer. The dye immobilizing layer 1552 contains an immobile oxidizing agent of the type described above.

The photographic element 1500 so constituted is first exposed imagewise through the transparent support 1502. Thereafter a processing composition containing a color developing agent and a silver halide solvent is released and uniformly spread in the space 1558. In exposed areas silver halide is developed producing oxidized color developing agent which couples with the dye forming coupler present to form an immobile dye. The filter dye or pigment, the immobile dye formed, and the developed silver thus together increase the optical density of the microvessels which are exposed.

In areas not exposed, the undeveloped silver halide is solubilized by the silver halide solvent and migrates to the layer 1556 where it is reduced to silver. Any oxidized developing agent produced in reducing the silver halide to silver immediately cross-oxidizes with the scavenger which is present with the silver precipitating agent in the layer 1556.

At the same time mobile coupler is wandering from microvessels which were not exposed. The mobile coupler does not react with oxidized color developing agent in the layer 1556, since any oxidized color developing agent present preferentially reacts with the scavenger. The coupler thus migrates through layer 1556 unaffected and enters reflection and spreading layer 1554. Because of the thickness of this layer, the mobile coupler is free to wander laterally to some extent. Upon reaching the immobilizing layer 1552, the coupler reacts with oxidized color developing agent. The oxidized color developing agent is produced uniformly in this layer by interaction of oxidizing agent with the color developing agent. Due to lateral diffusion in the spreading layer, superimposed immobile yellow, magenta and cyan dye images are formed in the immobilizing layer and can be viewed as a multicolor image through the transparent support (or cover sheet) 1550 with the layer 1554 providing a white reflective background. At the same time, since only filter dye or pigment remains in the unexposed microvessels, a useable additive primary negative transparency is formed by the support 1502.

To illustrate a variant system, a photographic element as described immediately above can be modified by substituting for the initially colorless, mobile dye forming couplers initially mobile dye developers. The dye developers are shifted in hue, so that the dye developer present in the microvessels containing red, green and blue filters do not initially absorb light in the red, green and blue regions of the spectrum, respectively. Suitable shifted dye developers can be selected from among those disclosed by Rogers U.S. Pat. Nos. 2,774,668 and 2,983,606, Idelson et al U.S. Pat. No. 3,307,947, Dershowitz et al U.S. Pat. No. 3,230,085, Cieciuch et al U.S. Pat. No. 3,579,334, Yutzy U.S. Pat. No. 2,756,142, Harison Defensive Publication T-889,017 and Bush et al U.S. Pat. No. 3,854,945, cited above. A dye mordant as well as an oxidant can be present in the dye immobilizing layer 1552. Since the dye image forming material is itself a silver halide developing agent, a conventional activator solution can be employed (preferably containing an electron transfer agent). The remaining features can be identical to those described in the preceding embodiment.

Upon imagewise exposure and release of the activator solution, dye developer reacts with exposed silver halide to form an immobile subtractive primary dye which is a complement of the additive primary filter material in the exposed microvessel. Thus the optical density of exposed microvessels is increased, and a negative multicolor additive primary image can be formed in the support 1502 by the filter materials. Silver halide development is terminated by transfer of solubilized silver halide as has already been described. In unexposed areas unoxidized dye developer migrates to the immobilizing layer 1552 where it is immobilized to form a multicolor positive image. During processing the dye developers shift in hue so that they form subtractive primaries complementary in hue to the additive primary filter materials with which they are initially associated in the microvessels. That is, the red, green and blue filter material containing microvessels contain dye developers which ultimately form cyan, magenta and yellow image dyes. Hue shifts can be brought about by the higher pH of processing, mordanting or by associating the image dye in the receiver with a chelating material.

Instead of using shifted dye developers as described above, initially mobile leuco dyes can be employed in combination with electron transfer agents to produce essentially similar results. Since the leuco dyes are initially colorless, hue shifting does not have to be undertaken to avoid competing light absorption during imagewise exposure. The leuco dyes are converted to subtractive primary imaging dyes upon oxidation in the dye immobilizing layer. Mordant in the layer 1552 holds the dyes in place. Suitable initially mobile leuco dyes can be selected from among those disclosed by Lestina et al U.S. Pat. Nos. 3,880,658, 3,935,262 and 3,935,263, Cohler et al U.S. Pat. No. 2,892,719, Corley et al U.S. Pat. No. 2,992,105 and Rogers U.S. Pat. Nos. 2,909,430 and 3,065,074, cited above. The remaining features can be identical to those described in the preceding embodiment.

Instead of employing initially mobile dyes or dye precursors as described above, it is possible to employ initially immobile materials. In one specific preferred form benzisoxazolone precursors of hydroxylamine dye-releasing compounds are employed of the type disclosed by Hinshaw et al U.K. Pat. No. 1,464,104 and *Research Disclosure*, Vol. 144, April 1976, Item 14447. Upon cross-oxidation in the microvessels with oxidized electron transfer agent produced by development of exposed silver halide, release of mobile dye is prevented. In areas in which silver halide is not exposed and no oxidized electron transfer agent is produced mobile dye release occurs. The dye image providing compounds are preferably initially shifted in hue to avoid competing absorption during imagewise exposure. Mordant immobilizes the dyes in the layer 1552.

No oxidant is required in this layer in this embodiment. Except as indicated, this element and its function is similar to the illustrative embodiments described above.

Each of the illustrative embodiments described above employ positive-working dye image providing compounds. To illustrate a specific embodiment employing negative-working dye image providing compounds, a first set of microvessels 1508 can contain a blue filter dye or pigment, a silver precipitating agent and a redox dye-releaser containing a yellow dye which is shifted in hue to avoid absorption in the blue region of the spectrum prior to processing. In like manner a second, interlaid set of microvessels contain a green filter dye or pigment, the silver precipitating agent and a redox dye-releaser containing an analogously shifted magenta dye, and a third, interlaid set of microvessels containing a red filter dye or pigment, the silver precipitating agent and a redox dye-releaser containing an analogously shifted cyan dye. The microvessels are overcoated with a panchromatically sensitized silver halide emulsion layer containing an oxidized developing agent scavenger (not shown in FIG. 15). The silver precipitating layer 1556 shown in FIG. 15 is not present. The reflection and spreading layer is a white titanium oxide pigment layer. The dye immobilizing layer 1552 contains a mordant. In a preferred form the redox dye-releasers are compounds containing a dye linked through an oxidizable sulfonamido group, such as those illustrated by Fleckenstein U.S. Pat. Nos. 3,928,312 and 4,053,312, Fleckenstein et al U.S. Pat. No. 4,076,529, Melzer et al U.S. Pat. No. 4,100,113, Degauchi U.S. Pat. No. 4,199,892, Koyama et al U.S. Pat. No. 4,055,428, Vetter et al U.S. Pat. No. 4,198,235 and Kestner et al *Research Disclosure,* Vol. 151, November 1976, Item 15157, cited above. Any of the techniques described above for shifting the hue of the dye can be employed.

The photographic element is imagewise exposed through the transparent support 1502. A processing solution containing an electron transfer agent and a silver halide solvent is spread between the image generating and the image receiving portions of the element. In a preferred form the pH of the processing solution causes the redox dye-releasers to shift to their desired image-forming hues. In areas in which silver halide is exposed oxidized electron transfer agent produced by development of exposed silver halide immediately cross-oxidizes with the scavenger. Thus, in microvessels corresponding to exposed silver halide the redox dye-releasers remain in their initially immobile form. In areas in which silver halide is not exposed, silver halide solvent present in the processing solution solubilizes silver halide allowing it to wander into the underlying microvessels. In the microvessels physical development of solubilized silver halide occurs producing silver and oxidized electron transfer agent. The oxidized electron transfer agent interacts with the redox dye-releaser to release mobile dye which is transferred to the layer 1552 and immobilized by the mordant. A multicolor positive transferred image is produced in the layer 1552 comprised of yellow, magenta and cyan transferred dyes. A multicolor positive retained image can also be produced, since (1) the silver density produced by chemical development in the emulsion layer is small compared to the silver density produced by physical development in the microvessels and (2) with the image-generating portion separated from the image-receiving portion on the redox dye-releasers remaining in their initial condition in the microvessels can be uniformly reacted with an oxidizing agent to release mobile dye which can be removed from the microvessels by washing.

In presently commercially available color image transfer photographic elements, the photographic element is ejected from the camera before formation of the color image is completed. The photographic elements 1500 and 1600 in the variant forms disclosed above can be ejected from a camera before internal processing is complete only if they are protected from room light. For example, the transparent supports 1502 and 1602 can have a black layer associated therewith to permit early room light handling. The layers 1554 and 1654, which prevent light exposure from occurring through the transparent cover sheets 1550 and 1650, can optionally be supplemented by a black layer located behind the white reflecting layer. When so protected, the elements can produce transferred multicolor images which are accessible in very short time periods, since the dye diffusion paths are short as compared with conventional image transfer element diffusion paths. The transferred image can in one form be viewed through a window provided in a camera while protecting the support containing the microvessels from light exposure while processing is being completed.

Whereas presently commercially available color image transfer photographic elements are of comparatively large format, thereby requiring that the cameras be rather large and bulky, the present photographic elements, though useful in these large formats, are particularly suited for smaller formats, such as the 110 and 135 film sizes. In employing the photographic elements of this invention in small formats, the retained image, which is preferably a negative image, is the primary photographic image of interest. The retained negative image can be readily employed to produce multicolor enlarged positive prints. The small format transferred multicolor positive image can be employed primarily to give the photographer instant assurance that he or she has obtained the desired photographic image. Because of the small format, the added cost of providing transferred multicolor image in addition to a useful negative multicolor image is relatively small.

The multicolor image transfer elements of this invention can be employed in either peel apart or integral forms. In one specifically contemplated form, the image receiving portion of each element can be peeled from the image generating portion in the camera. The image generating portion is retained for later use and/or silver reclamation. The image receiving portion can have the appearance of a conventional color print. For instance, the receiving portion support can be white resin coated paper support bearing a mordant or oxidant containing layer which provides the multicolor dye image. The image generating portion will then contain any required silver reception layer and any lateral image spreading layer as well as the support containing the microvessels and any overcoated radiation-sensitive emulsion layer.

While the foregoing is intended to point out certain illustrative embodiments of the invention, it is appreciated that numerous additional variant forms of the invention will readily occur to those skilled in the art.

Preparation Techniques

One preferred technique according to this invention for preparing microvessel containing supports is to expose a photographic element having a transparent support in an imagewise pattern, such as illustrated in FIGS. 1A, 6, 7 and 8. In a preferred form the photographic element is negative-working and exposure corresponds to the areas intended to be subtended by the microvessel areas while the areas intended to be subtended by the lateral walls are not exposed. By conventional photographic techniques a pattern is formed in the element in which the areas to be subtended by the microvessels are of a substantially uniform maximum density while the areas intended to be subtended by the lateral walls are of a substantially uniform minimum density.

The photographic element bearing the image pattern is next coated with a radiation-sensitive composition capable of forming the lateral walls of the support element and thereby defining the side walls of the microvessels. In a preferred form the radiation-sensitive coating is a negative-working photoresist or dichromated gelatin coating. The coating can be on the surface of the photographic element bearing the image pattern or on the opposite surface—e.g., for a silver halide photographic element, the photoresist or dichromated gelatin can be coated on the support or emulsion side of the element. The photoresist or dichromated gelatin coating is next exposed through the pattern in the photographic element, so that the areas corresponding to the intended lateral walls are exposed. This results in hardening to form the lateral wall structure and allowing the unexposed material to be removed according to conventional procedures well known to those skilled in the art. For instance, these procedures are fully described in the patents cited above in connection with the description of photoresist and dichromated gelatin support materials.

The image pattern is preferably removed before the element is subsequently put to use. For example, where a silver halide photographic element is exposed and processed to form a silver image pattern, the silver can be bleached by conventional photographic techniques after the microvessel structure is formed by the radiation-sensitive material.

If a positive-working photoresist is employed, it is initially in a hardened form, but is rendered selectively removable in areas which receive exposure. Accordingly, with a positive-working photoresist or other radiation-sensitive material either a positive-working photographic element is employed or the sense of the exposure pattern is reversed. If an exposure blocking pattern is present in or on the support corresponding to the lateral walls forming the microvessels, this pattern need not be removed for many applications and can even take the place of increasing the optical density of the lateral walls forming the microvessels in many instances. Instead of coating the radiation-sensitive material onto a support bearing an image pattern, such as an image-bearing photographic element, the radiation-sensitive material can be coated onto any conventional support and imagewise exposed directly rather than through an image pattern. It is, of course, a simple matter to draw the desired pixel pattern on an enlarged or macro-scale and then to photoreduce the pattern to the desired scale of the microvessels for purposes of exposing the photoresist.

Another technique which can be used to form the microvessels in the support is to form a plastic deformable material as a planar element or as a coating on a relatively nondeformable support element and then to form the microvessels in the relatively deformable material by embossing. An embossing tool is employed which contains projections corresponding to the desired shape of the microvessels. The projections can be formed on an initially plane surface by conventional techniques, such as coating the surface with a photoresist, imagewise exposing in a desired pattern and removing the photoresist in the areas corresponding to the spaces between the intended projections (which also correspond to the configuration of the lateral walls to be formed in the support). The areas of the embossing tool surface which are not protected by photoresist are then etched to leave the projections. Upon removal of the photoresist overlying the projections and any desired cleaning step, such as washing with a mild acid, base or other solvent, the embossing tool is ready for use. In a preferred form the embossing tool is formed of a metal, such as copper, and is given a metal coating, such as by vacuum vapor depositing chromium or silver. The metal coating results in smoother walls being formed during embossing.

Still another technique for preparing supports containing microvessels is to form a planar element, such as a sheet or film, of a material which can be locally etched by radiation. The material can form the entire element, but is preferably present as a continuous layer of a thickness corresponding to the desired depth of the microvessels to be formed, coated on a support element which is formed of a material which is not prone to radiation etching. By irradiation etching the planar element surface in a pattern corresponding to the microvessel pattern, the unexposed material remaining between adjacent microvessel areas forms a pattern of interconnecting lateral walls. It is known that many dielectric materials, such as glasses and plastics, can be radiation etched. Cellulose nitrate and cellulose esters (e.g., cellulose acetate and cellulose acetate butyrate) are illustrative of plastics which are particularly preferred for use. For example, coatings of cellulose nitrate have been found to be virtually insensitive to ultraviolet and visible light as well as infrared, beta, X-ray and gamma radiation, but cellulose nitrate can be readily etched by alpha particles and similar fission fragments. Techniques for forming cellulose coatings for radiation etching are known in the art and disclosed, for example, by Sherwood U.S. Pat. No. 3,501,636, here incorporated by reference.

The foregoing techniques are well suited to forming transparent microvessel containing supports, a variety of transparent materials being available satisfying the requirements for use. Where a white support is desired, white materials can be employed or the transparent materials can be loaded with white pigment, such as titania, baryta and the like. Any of the whitening materials employed in conjunction with conventional reflective photographic supports can be employed. Pigments to impart colors other than white to the support can, of course, also be employed, if desired. Pigments are particularly well suited to forming opaque supports which are white or colored. Where it is desired that the support be transparent, but tinted, dyes of a conventional nature are preferably incorporated in the support forming materials. For example, in one form of the support described above the support is preferably yellow to absorb blue light while transmitting red and green.

In various forms of the supports described above the portion of the support forming the bottom walls of at least one set of microvessels, generally all of the microvessels, is transparent, and the portion of the support forming the lateral walls is either opaque or dyed to intercept light transmission therethrough. As has been discussed above, one technique for achieving this result is to employ different support materials to form the bottom and lateral walls of the supports.

A preferred technique for achieving dyed lateral walls and transparent bottom walls in a support formed of a single material is as follows: A transparent film is employed which is initially unembossed and relatively nondeformable with an embossing tool. Any of the transparent film-forming materials more specifically described above and known to be useful in forming conventional photographic film supports, such as cellulose nitrate or ester, polyethylene, polystyrene, poly(ethylene terephthalate) and similar polymeric films, can be employed. One or a combination of dyes capable of imparting the desired color to the lateral walls to be formed is dissolved in a solution capable of softening the transparent film. The solution can be a conventional plasticizing solution for the film. As the plasticizing solution migrates into the film from one major surface, it carries the dye along with it, so that the film is both dyed and softened along one major surface. Thereafter the film can be embossed on its softened and therefore relatively deformable surface. This produces microvessels in the film support which have dyed lateral walls and transparent bottom walls.

Once the support with microvessels therein is formed, material forming the radiation-sensitive portion of the photographic element, or at least one component thereof, can be introduced into the microvessels by doctor blade coating, solvent casting or other conventional coating techniques. Identical or analogous techniques can be used in forming receiver or filter elements containing microvessels. Other, continuous layers, if any, can be coated over the microvessels, the opposite support surface or other continuous layers, employing conventional techniques, including immersion or dip coating, roller coating, reverse roll coating, air knife coating, doctor blade coating, gravure coating, spray coating, extrusion coating, bead coating, stretch-flow coating and curtain coating. High speed coating using a pressure differential is illustrated by Beguin U.S. Pat. No. 2,681,294. Controlled variation in the pressure differential to facilitate coating starts is illustrated by Johnson U.S. Pat. No. 3,220,877 and to minimize splicing disruptions is illustrated by Fowble U.S. Pat. No. 3,916,043. Coating at reduced pressures to accelerate drying is illustrated by Beck U.S. Pat. No. 2,815,307. Very high speed curtain coating is illustrated by Greiller U.S. Pat. No. 3,632,374. Two or more layers can be coated simultaneously, as illustrated by Russell U.S. Pat. No. 2,761,791, Wynn U.S. Pat. No. 2,941,898, Miller et al U.S. Pat. No. 3,206,323, Bacon et al U.S. Pat. No. 3,425,857, Hughes U.S. Pat. No. 3,508,947, Herzhoff et al U.K. Pat. No. 1,208,809, Herzhoff et al U.S. Pat. No. 3,645,773 and Dittman et al U.S. Pat. No. 4,001,024. In simultaneous multilayer coating varied coating hoppers can be used, as illustrated by Russell et al U.S. Pat. No. 2,761,417, Russell U.S. Pat. Nos. 2,761,418 and 3,474,758, Mercier et al U.S. Pat. No. 2,761,419, Wright U.S. Pat. No. 2,975,754, Padday U.S. Pat. No. 3,005,440, Mercier U.S. Pat. No. 3,627,564, Timson U.S. Pat. Nos. 3,749,053 and 3,958,532, Jackson U.S. Pat. No. 3,993,019 and Jackson et al U.S. Pat. No. 3,996,885. Silver halide layers can also be coated by vacuum evaporation, as illustrated by Lu Valle et al U.S. Pat. Nos. 3,219,444 and 3,219,451. Materials to facilitate coating and handling can be employed in accordance with conventional techniques, as illustrated by *Product Licensing Index,* Vol. 92, December 1971, Item 9232, paragraphs XI and XII and *Research Disclosure,* Vol. 176, December 1978, Item 17643, paragraphs XI and XII.

In some of the embodiments of the invention described above a multicolor photographic element or filter element is to be formed which requires an interlaid pattern of microvessels which are filled to differ one from the other. Usually it is desired to form an interlaid pattern of at least three different microvessel confined materials. In order to fill one microvessel population with one type of material while filling another remaining microvessel population with another type of material at least two separate coating steps are usually employed and some form of masking is employed to avoid filling the remaining microvessel population with material intended for only the first microvessel population.

A preferred technique for selectively filling microvessels to form an interlaid pattern of two or more differing microvessel populations is to fill the microvessels on at least one major surface of the support with a material which can be selectively removed by localized exposure without disturbing the material contained in adjacent microvessels. A preferred material for this purpose is one wich will undergo a phase change upon exposure to light and/or heating, preferably a material which is readily sublimed upon moderate heating to a temperature well below that at which any damage to the support occurs. Sublimable organic materials, such as naphthalene, and para-dichlorobenzene are well suited for this use. Certain epoxy resins are also recognized to be suitable. However, it is not necessary that the material sublime. For example, the support microvessels can be initially filled with water which is frozen and selectively thawed. It is also possible to fill the microvessels with a positive-working photoresist which is selectively softened by exposure. Thus, a wide range of materials which sublime, melt or exhibit a marked reduction in viscosity upon exposure can be employed.

According to a preferred exposure technique a laser beam is sequentially aimed at the microvessels forming one population of the interlaid pattern. This is typically done by known laser scanning techniques, such as illustrated by Marcy U.S. Pat. No. 3,732,796, Dillon et al U.S. Pat. No. 3,864,697 and Starkweather et al U.S. published patent application B309,860. According to one specific, preferred technique two lasers are employed. One of the lasers is of sufficient intensity to provide the desired alteration with the microvessels. The second laser is used only to position accurately the first laser and can differ in wavelength and can be of lesser intensity. The first and second laser beams are laterally displaced in the plane of the support by an accurately determined distance. By employing a photodetector to receive light transmitted through or reflected from the support from the second laser, it can be determined when a microvessel or a lateral wall is aligned with the second laser beam. In one preferred form, in which the support bottom walls are substantially transparent and the lateral walls are dyed, a substantial change in light intensity sensed by the photodetector will occur as a function of the relative position of the support and laser beam. In other instances differences in reflection or refraction between the bottom and lateral walls forming the microvessels can be relied upon to provide information to the photodetector. Once the position of the second laser with respect to a microvessel is ascertained, the position of the first laser with respect to a microvessel can also be ascertained, since the spacing between the lasers and the center-to-center widths of the microvessels are known. Depending upon the pattern and accuracy of exposure desired, indexing with the second laser can be undertaken before exposing each microvessel with the first laser, only once at the beginning of exposure of one microvessel population, or at selected intermediate intervals, such as before each row of microvessels of one population is exposed.

When a first laser scan is completed, the support is left with one exposed microvessel population while the remaining microvessels are substantially undisturbed. Instead of sequentially laser exposing the microvessels in the manner indicated, exposure through a mask can be undertaken, as is well known. Laser scanning exposure offers the advantages of eliminating any need for mask preparation and alignment with respect to the support prior to exposure.

Where sublimable material is employed as an initial filler, the microvessels are substantially emptied during their exposure. Where the filler material is converted to a liquid form, the exposed microvessels can be emptied after exposure with a vacuum pickup. The empty microvessel population can be filled with imaging and/or filter materials using conventional coating techniques, as have been described above. The above exposure and emptying procedure is then repeated at least once, usually twice, on different microvessels. Each time the microvessels emptied are filled with a different material. The result is two, usually three, or more poulations of microvessels arranged in an interlaid pattern of any desired configuration. An illustrative general technique, applied to filling cells in a gravure plate, is described in an article by D. A. Lewis, "Laser Engraving of Gravure Cylinders," *Technical Association of the Graphic Arts,* 1977, pp. 34–42, here incorporated by reference.

Other conventional approaches to forming photographic elements according to this invention will be readily apparent to those skilled in the art.

The practice of this invention can be better appreciated by reference to the following examples.

EXAMPLE 1

Sample reaction microvessels were prepared in the following manner:

A. A pattern of hexagons 20 microns in width and approximately 10 microns high was formed on a copper plate by etching. Using the etched plate having hexagon projections, dichloromethane and ethanol (80:20 volume ratio) solvent containing 10 grams per 100 ml of Genacryl Orange-R, a yellow azo dye, was placed in contact with a cellulose acetate photographic film support for six seconds. Hexagonal depressions were embossed in the softened support, forming reaction microvessels. The yellow dye was absorbed in the cellulose acetate film support areas laterally surrounding, but not beneath, the reaction microvessels, giving a blue density.

B. Using an alternative technique, the desired hexagon pattern for the reaction microvessels was developed in a fine grain silver bromoiodide emulsion coated on a cellulose acetate photographic film support. The pattern was spin overcoated first with a very thin layer of a negative photoresist comprised of a cyclized polyisoprene solubilized in 2-ethoxyethanol and sensitized with diazobenzilidene-4-methylcyclohexanone. The pattern was then spin overcoated with an approximately 10 micron layer of a positive photoresist comprised of a cresylformaldehyde resin esterified with 6-diazo-5,6-dihydro-5-oxo-1-naphthalene sulfonyl chloride solubilized in 2-ethoxyacetate together with a copolymer of ethyl acrylate and methacrylic acid, the resist being stabilized with glacial acetic acid. The thin layer of negative photoresist provided a barrier between the incompatible gelatin and positive photoresist layers. To prevent nitrogen bubble formation in the negative photoresist, an overall exposure was given before the positive photoresist layer was added. Exposure through the film pattern and development produced reaction microvessels in the positive photoresist.

C. Using still another method, an aqueous mixture of 12½ by weight percent bone gelatin plus 12 percent by weight of a 2 by weight percent aqueous solution of ammonium dichromate (to which was added 1½ ml conc. $NH_4OH$/100 ml of the aqueous mixture) was coated on a cellulose acetate photographic film support with a 200 micron doctor coating blade. Exposure was made with a positive hexagon pattern using a collimated ultraviolet arc source. Development was for 30 minutes with a hot (41° C.) water spray. Reaction microvessels with sharp, well defined walls were obtained.

By each of the above techniques, reaction microvessels were formed ranging from 10 to 20 microns in average diameter and from 7 to 10 microns in depth with 2 micron lateral walls separating adjacent microvessels.

EXAMPLE 2

A fast, coarse grain gelatino-silver bromoiodide emulsion was doctor-coated onto a sample of an embossed film support having reaction microvessels prepared according to Example 1A and dried at room temperature. A comparison coating sample was made with the same blade on an unembossed film support. Identical test exposures of the embossed and unembossed elements were processed for 3 minutes in a surface black-and-white developer, as set forth in Table 1.

TABLE I

| Black-and-White Developer | |
|---|---|
| Water (50° C.) | 500 cc |
| p-Methylaminophenol sulfate | 2.0 g |
| Sodium sulfite, desiccated | 90.0 g |
| Hydroquinone | 8.0 g |
| Sodium carbonate, monohydrated | 52.5 g |
| Potassium bromide | 5.0 g |
| Water to 1 liter | |

In a composition of 7× enlarged prints made from the embossed and unembossed elements, the image made from the embossed element was visibly sharper.

EXAMPLE 3

A coarse grain gelatino-silver bromoiodide emulsion was doctor-coated onto a sample of an embossed film support having reaction microvessels prepared according to Example 1A. The silver bromoiodide emulsion was then overcoated with an emulsion of fine grain, internally fogged converted halide silver bromide grains. Exposure and development of the coarse grains released iodide which diffused to the fine grain emulsion, disrupting the grains and masking them imagewise developable in the surface developer.

EXAMPLE 4

A coarse grain silver bromoiodide emulsion was doctor-coated onto a sample of an embossed film support having reaction microvessels prepared according to Example 1A and dried at room temperature. After exposure the sample was developed in a lith-type developer of the composition set forth in Table II in which parts A and B were mixed in a volume ratio of 1:1 just prior to use. Extreme contrast was obtained without loss of sharpness.

TABLE II

| Lith Developer | | |
|---|---|---|
| (A) | Hydroquinone | 28.6 g |
| | Sodium sulfite, desiccated | 8.0 g |
| | Sodium formaldehyde bisulfite | 134 g |
| | Potassium bromide | 2.4 g |
| | Water to 1 liter | |
| (B) | Sodium carbonate.$H_2O$ | 160 g |
| | Water to 1 liter | |

EXAMPLE 5

A high speed, coarse grain gelatino-silver bromoiodide emulsion was doctor-coated onto a sample of the film support having reaction microvessels prepared according to Example 1B. A first sample of the element was imagewise exposed and was then developed in a black-and-white developer, as set forth in Table III.

TABLE III

| Black-and-White Developer | |
|---|---|
| Water | 970 ml |
| Sodium sulfite | 2 g |
| 1-Phenyl-3-pyrazolidone | 1.5 g |
| Sodium carbonate | 20 g |
| Potassium bromide | 2 g |
| 6-Nitro (as 1/10 percent solution) | 40 mg |
| Water to 1 liter | |

The first sample was washed in water and immersed in a fix bath of the composition set forth in Table IV.

TABLE IV

| Fix Bath | |
|---|---|
| Water (50° C.) | 600 cc |
| Sodium thiosulfate | 360.0 g |
| Ammonium chloride | 50.0 g |
| Sodium sulfite, desiccated | 15.0 g |
| Acetic acid, 28 percent | 48.0 cc |
| Boric acid, crystals | 7.5 g |
| Potassium alum | 15.0 g |
| Water to 1 liter | |

The first sample was washed in water and allowed to dry. The sample was then immersed in a rehalogenizing bath of the composition set forth in Table V.

TABLE V

| Rehalogenizing Bath | |
|---|---|
| Potassium ferricyanide | 50 g |
| Potassium bromide | 20 g |
| Water to 1 liter | |

The first sample was washed in water and was then developed in the color developer set forth in Table VI.

TABLE VI

| Color Developer | |
|---|---|
| Sodium sulfite | 2.0 g |
| 4-(p-Toluenesulfonamido)-ω-benzoyl acetanilide (dissolved in alcoholic sodium hydroxide) | 0.8 g |
| N,N—diethyl-p-phenylenediamine.HCl | 2.5 g |
| Sodium carbonate.$H_2O$ | 20 g |
| 2,5-Dihydroxy-p-benzene disulfonic acid (dissolved in alcoholic sodium hydroxide) | 7.5 g |
| Water to 1 liter, pH 11.2 | |

The first sample was washed in water and immersed in a bleach bath of the composition set forth in Table VII.

TABLE VII

| Bleach Bath | |
|---|---|
| Potassium ferricyanide | 50 g |
| Potassium bromide | 20 g |
| Water to 1 liter | |

The first sample was immersed in a fix bath of the composition set forth above in Table IV after which it was washed in water.

A second sample was similarly exposed and processed through the step of immersion in the fix bath (first occurrence). The images obtained using the first and second samples were enlarged 10× onto a light-sensitive commercial black-and-white photographic paper. Graininess, due to the silver grain, was very apparent in the enlargement prepared from the second sample but was not visible in the enlargement prepared from the first sample. In the first sample, no grain was evident within the individual microvessels. Rather, a substantially uniform intramicrovessel dye density was observed.

EXAMPLE 6

Coatings were made as follows: A magenta coupler, 1-(2,4-dimethyl-6-chlorophenyl)-3-[(3-m-pentadecylphenoxy)-butyramide]-5-pyrazolone, was dispersed in tricresyl phosphate at a weight ratio of 1:½. This dispersion was mixed with a fast gelatino-silver bromoiodide emulsion and doctor-coated onto a sample of a film support having a pattern of 20 micron average diameter reaction microvessels prepared as discussed in Example 1A. For comparison, a coating with the same mixture, but without reaction microvessels was made. Identical line test exposures on each coating were processed in the following manner:

The coating was developed for 3 minutes in a black-and-white developer of the composition set forth in Table VIII.

TABLE VIII

| Black-and-White Developer | |
|---|---|
| Water (50° C.) | 500 cc |
| p-Methylaminophenol sulfate | 2.0 g |
| Sodium sulfite, desiccated | 90.0 g |
| Hydroquinone | 8.0 g |
| Sodium carbonate, monhydrated | 52.5 g |
| Potassium bromide | 5.0 g |
| Water to 1 liter | |

The coating was immersed in a fix bath of the composition set forth in Table IX.

TABLE IX

| Fix Bath | |
|---|---|
| Water (50° C.) | 600 cc |
| Sodium thiosulfate | 360.0 g |
| Ammonium chloride | 50.0 g |
| Sodium sulfite, desiccated | 15.0 g |
| Acetic acid, 28 percent | 48.0 cc |
| Boric acid, crystals | 7.5 g |
| Potassium alum | 5.0 g |
| Water to 1 liter | |

The coating was washed in water. It was then reactivated 15 minutes in 25 weight percent aqueous potassium bromide and was washed for 10 minutes in running water, followed by development for 3 minutes in a peroxide oxidizing agent containing color developer of the composition set forth in Table X.

TABLE X

| Color Developer | |
|---|---|
| Potassium carbonate | 20 g |
| Potassium sulfite, desiccated | 2 g |
| 4-Amino-3-methyl-N—ethyl-N—β-(methanesulfonamido)ethyl aniline sulfate hydrate | 5 g |
| Sodium hexametaphosphate | 1.5 g |
| Hydrogen peroxide (40 percent) | 10 ml |
| Water to 1 liter | |

The coating was then washed in water.

Large amounts of dye were formed in both coatings. The comparison coating without the reaction microvessels showed gross spreading of dye and image degradation. The reaction micro-vessel coating spread was confined by the reaction micro-vessels and showed no signs of inter-vessel spreading.

EXAMPLE 7

A cellulose acetate photographic film support was embossed with a pattern of reaction microvessels approximately 20 microns in average diameter and 8 microns deep prepared according to Example 1A. A fast gelatino-silver bromoiodide emulsion was doctor-coated onto the film support having reaction microvessels and dried at room temperature. An image of a line object was developed for two minutes in a black-and-white developer of the composition set forth in Table XI.

TABLE XI

| Black-and-White Developer | |
|---|---|
| Water (50° C.) | 500 cc |
| p-Methylaminophenol sulfate | 2.0 g |
| Sodium sulfite, desiccated | 90.0 g |
| Hydroquinone | 8.0 g |
| Sodium carbonate, monohydrated | 52.5 g |
| Potassium bromide | 5.0 g |
| Water to 1 liter | |

The sample was immersed in a fix bath of the composition set forth in Table XII.

TABLE XII

| Fix Bath | |
|---|---|
| Water (50° C.) | 600 cc |
| Sodium thiosulfate | 360.0 g |
| Ammonium chloride | 50.0 g |
| Sodium sulfite, desiccated | 15.0 g |
| Acetic acid, 28 percent | 48.0 cc |
| Boric acid, crystals | 7.5 g |
| Potassium alum | 15.0 g |

TABLE XII-continued

| Fix Bath |
|---|
| Water to 1 liter |

The sample was washed in water and dried. It was overcoated with a dispersion of 2-[α-(2,4-di-tert-amylphenoxy)butyramido]-4,6-dichloro-5-methylphenol, hardened for two minutes in formalin hardener and was then washed in water. The sample was activated for 15 minutes in 25 percent by weight aqueous solution of potassium bromide and was washed for 10 minutes in water, followed by development for 5 minutes in a peroxide color developer of the composition set forth in Table XIII.

TABLE XIII

| Color Developer | |
|---|---|
| Potassium carbonate | 20 g |
| Potassium sulfite, desiccated | 2 g |
| 4-Amino-3-methyl-N—ethyl-N—β-(methanesulfonamido)ethyl aniline sulfate hydrate | 5 g |
| Sodium hexametaphosphate | 1.5 g |
| Hydrogen peroxide (40 percent) | 10 ml |
| Water to 1 liter | |

Within the exposed microvessels a random pattern of silver specks were formed by development in the black-and-white developer. Subsequent development in the color developer produced a cyan dye within areas subtended by the microvessels containing the silver specks. The cyan dye was uniformly distributed within these microvessel subtended areas and produced greater optical density than the silver specks alone. The result was to convert a random distribution of silver specks within the microvessels into a uniform dye pattern.

EXAMPLE 8

Two donor elements for image transfer were provided, each having an imagewise distribution of an alkali diffusible cyan coupler, 2,6-dibromo-1,5-naphthalenediol on a film support.

A receiving element was prepared by coating a cellulose acetate film support embossed according to Example 1, paragraph A, so that the microvessels in the support were filled with gelatin. To provide a control-receiving element, a second, planar cellulose acetate film support was coated with the same gelatin to provide a continuous planar coating having a thickness corresponding to that of the gelatin in the microvessels.

Each of the receiving elements was immersed in the color developer of Table XIV and then laminated to one of the donor sheets.

TABLE XIV

| Color Developer | |
|---|---|
| Benzyl alcohol | 12 ml |
| Sodium sulfite, desiccated | 2.0 gm |
| 4-Amino-3-methyl-N,N—diethyl-aniline monohydrochloride | 2.5 gm |
| Sodium hydroxide | 5.0 gm |
| Water to 1 liter | |

After diffusion of the cyan coupler to the receiving elements, the receiving and donor elements were peeled apart. The receivers were then treated with a saturated aqueous solution of potassium periodate to form the cyan dye.

The cyan dye image formed in the receiving element having the microvessels was perceptably sharper than the one formed in the control receiving element with the planar support and continuous gelatin layer.

Subsequent to the filing of my copending parent patent application Ser. No. 008,819, coworkers have been engaged in the further investigation and improvement of my invention. Examples 9 and 10, which illustrate multicolor image transfer according to this invention, incorporate recent improvements that are not my specific discoveries, but are the subject matter of Blazey et al Ser. No. 193,065, filed Oct. 2, 1980, titled *PLURAL IMAGING COMPONENT MICROCELLULAR ARRAYS, PROCESSES FOR THEIR FABRICATION, AND ELECTROSCOPIC COMPOSITIONS*, now U.S. Pat. No. 4,307,165, issued Dec. 22, 1981.

EXAMPLE 9

A. Nine grams of a finely divided immobile particulate green pigment, Monolite Green GN, was mixed with 4.5 grams of a copolymer of tert-butylstyrene and lithium methacrylate along with 85.5 grams of Solvesso 100° (an isoparaffinic hydrocarbon liquid having a boiling point in the range of from 145° to 185° C., sold commercially by Exxon). The concentrate was ball-milled for two weeks at room temperature.

B. Four grams of a finely divided immobile particulate red pigment, Red Violet MR° (Hoechst), was mixed with 4.0 grams of a copolymer of tert-butylstyrene, lauryl methacrylate, lithium methacrylate, and methacrylic acid in the weight ratio of 60:36:3.6:0.4 (hereinafter designated TBS) and 36.0 grams of Solvesso 100°. The concentrate was ball-milled for two weeks at room temperature.

C. Ten grams of a finely divided immobile particulate blue pigment, Monolite Blue° (ICI), was mixed with 14.0 grams of TBS and 126.0 grams of Solvesso 100°. The concentrate was ball-milled for two weeks at room temperature.

D. Four and one-half grams of a mobile magenta dye-forming coupler, 1-(2-benzothiazolyl)-3-amino-5-pyrazolone, was mixed with 4.5 grams of TBS and 40.5 grams of Solvesso 100°. The concentrate was ball-milled for two weeks at room temperature.

E. The procedure of Paragraph D was repeated, except a mobile cyan dye-forming coupler, 2,6-dibromo-1,5-naphthalenediol, was substituted for the magenta dye-forming coupler.

F. A mobile yellow dye-forming coupler, α-(4-carboxyphenoxy)-α-pivalyl-2,4-dichloroacetanilide, in the amount of 3.14 grams was mixed with 3.14 grams of TBS and 28.3 grams of Solvesso 100°. The concentrate was ball-milled for two weeks at room temperature.

G. The green pigment concentrate of Paragraph A and the magenta dye-forming coupler concentrate of Paragraph D were mixed in equal weights of 3.85 grams each with 4.55 grams of a 10 percent by weight solution of a copolymer of ethyl acrylate, ethyl methacrylate, lauryl methacrylate, and lithium sulfoethyl methylacrylate in Solvesso 100°. To this mixture was added Isopar G° (an isoparaffinic hydrocarbon liquid having a boiling point in the range of 145° to 185° C. commercially available from Exxon) at the rate of 6 ml per minute for the first 50 ml and then at the rate of 15 ml per minute until the volume of the developer reached 500 ml.

H. The procedure of Paragraph G was repeated, except the red pigment concentrate of Paragraph B was substituted for the green pigment concentrate of Paragraph A and the cyan dye-forming coupler concentrate of Paragraph E was substituted for the magenta dye-forming coupler concentrate of Paragraph D.

I. The procedure of Paragraph G was repeated, except the blue pigment concentrate of Paragraph C was substituted for the green pigment concentrate of Paragraph A and the yellow dye-forming coupler concentrate of Paragraph F was substituted for the magenta dye-forming coupler concentrate of Paragraph D.

J. A conventional planar photoconductive element consisting of a transparent 102 micron thick poly(ethylene terephthalate) film base coated with a transparent 0.2 micron cuprous iodide electrically conductive layer which was in turn overcoated with an 8 micron organic photoconductive layer was employed as a starting material. The photoconductive element is commercially available as a recording film under the trademark Kodak Ektavolt SO-101. The recording film and its characteristics are generally described in *A Mini-Textbook—KODAK Products for Electrophotography*, Kodak Publication No. G-95, Standard Book Number 0-87985-233-X, Eastman Kodak Company, 1979. The conductive layer and film base extend laterally beyond the photoconductive layer along one edge to allow convenient electrical contact with the conductive layer.

An array of hexagonal projections 20 microns in width and approximately 7 microns high was formed on a copper plate by etching in generally the same manner described in the Whitmore patent application cited above. An embossing solvent was placed on the plate between one edge of the array of projections and a strip of pressure-sensitive tape employed to restrain migration of the solvent away from the projections. A sheet of the recording film was placed on the plate with the photoconductive layer adjacent the projections, and the resulting sandwich was advanced beneath a roller with the edge bearing the embossing solvent passing beneath the roller first. The pressure exerted by the roller and the softening action of the embossing solvent being spread laterally at the roller nip resulted in a hexagonal array of microvessels being formed on the photoconductive layer having lateral and bottom walls corresponding to the walls of the hexagonal projections. The embossing solvent was a roughly equal volume mixture of methanol and dichloromethane containing 0.51 parts by volume per 100 parts of solvent Sundan Black B (Color Index No. 26150). As a result, the lateral walls of the microvessels were dyed black, since the dye entered the photoconductive layer along with the embossing solvent. The bottom walls of the microvessels remained transparent, however.

K. The embossed photoconductive portion of the support was given a charge of +500 volts by being passed through a corona discharge. The conductive electrode was attached to ground. Except as stated the support was not intentionally exposed to light to which the photoconductive portion was responsive. The positively charged support was scanned with a laser having a wavelength of 482 nm. In one area of the support every third row of microvessels was scanned. In another area all of the microvessels were scanned. For selected row scanning an indexing laser was employed in combination with the scanning laser. The indexing laser was of a red wavelength to which the photoconductive portion was not responsive. The indexing laser was employed in combination with a photosensor to detect the position of the lateral walls of the microvessels. Thus, three interruptions of the indexing laser beam detected by the photosensor in advancing the support provided a positive indication that the support had been advanced three rows of microvessels. The dyed lateral walls of the microvessels facilitated indexing as well as obviating light scatter to adjacent microvessels.

After the laser scan was completed the support was electrophotographically developed using the electrophotographic developer of Paragraph G using a development time of 10 seconds and a general development technique and apparatus of the type described in Beyer et al U.S. Pat. No. 3,407,786. A development electrode biased to +200 volts was employed.

The procedure was twice repeated using the electrophotographic developers of Paragraphs H and I. The result was an element having in one area interlaid rows of microvessels containing the electroscopic imaging compositions of Paragraphs G, H and I. Under microscopic examination there was no evidence of any overlap of the imaging compositions. In three separate areas all of the microvessels were filled with one of the three electroscopic imaging compositions.

L. The element produced by Paragraph K was employed to form a multicolor screened positive using additive primary pigments and a transferred multicolor negative using subtractive primary dyes formed by the mobile couplers.

The filled microvessels were overcoated with a mixed silver sulfide and silver iodide silver precipitating agent dispersed in 2 percent by weight gelatin using a 50 micron coating doctor blade spacing. A commercially available black-and-white photographic paper having a panchromatically sensitized gelatino-silver chlorobromide emulsion layer was attached along an edge to the support with the emulsion layer of the photographic paper facing the microvessel containing surface of the support. The photographic paper was imagewise exposed through the support (and therefore through the filters formed by the pigments in the microvessels) with the elements in face-to-face contact. After exposure, the elements were separated, but not detached, and immersed for 3 seconds in the color developer of Table XV.

TABLE XV

| Color Developer | |
|---|---|
| Benzyl alcohol | 12 ml |
| Sodium sulfite, desiccated | 2.5 gm |
| 4-Amino-3-methyl-N,N—diethyl-aniline monohydrochloride | 2.5 gm |
| Sodium hydroxide | 5.0 gm |
| Sodium thiosulfate | 10.0 gm |
| 6-Nitrobenzimidazole nitrate | 20 mg |
| Water to 1 liter | |

Thereafter, the elements were restored to face-to-face contact for 1 minute to permit development of the imagewise exposed silver halide and image transfer to occur. The elements were than separated, and the silver image was bleached from the photographic paper. A three-color negative image was formed by subtractive primary dyes in the photographic paper while a three-color screened positive image was formed by the additive primary filters and the transferred silver image on the support.

EXAMPLE 10

Formation of Transferred Multicolor Positive

Example 9 was repeated, but with a silver halide emulsion layer coated over the filled microvessels and the silver nucleating agent layer being coated on a separate planar film support. The emulsion layer was a high-speed panchromatically sensitized gelatino-silver halide emulsion layer coated with a 150-micron coating doctor blade spacing. The color developer was of the composition set forth in Table XVI.

TABLE XVI

| Color Developer | |
|---|---|
| Benzyl alcohol | 12 ml |
| Sodium sulfite, desiccated | 2.5 gm |
| 4-Amino-3-methyl-N,N—diethyl-aniline monohydrochloride | 2.5 gm |
| Sodium hydroxide | 7.5 gm |
| Sodium thiosulfate | 60.0 gm |
| 6-Nitrobenzimidazole nitrate | 20 mg |
| Potassium bromide | 2.0 gm |
| 1-Phenyl-3-pyrazolidone | 0.2 gm |
| Water to 1 liter | |

Both elements were immersed in the color developer for 5 seconds and thereafter held in face-to-face contact for 2 minutes. A screened three-color negative was obtained on the support and a transferred positive silver and multicolor positive dye image was obtained on the planar support.

The invention has been described in detail with particular reference to preferred embodiments thereof, but it will be understood that variations and modifications can be effected within the spirit and scope of the invention.

What is claimed is:

1. In an element comprising a support means having first and second major surfaces and, on said support means, at least three laterally offset filters, the improvement comprising:

said support means defining microvessels which individually open toward one of said first and second major surfaces, a plurality of the microvessels opening toward said first major surface of said support means to form a predetermined, ordered array, a plurality of said filters being located in separate interlaid sets of microvessels forming said planar array to form an interlaid pattern, and said support means providing a lateral barrier between adjacent microvessels.

2. In an element comprising a support means having first and second major surfaces and, on said support means, at least three laterally offset segmented filters, the improvement comprising:

said support means defining microvessels which individually open toward one of said first and second major surfaces, a plurality of the microvessels opening toward said first major surface of said support means to form a planar array, next adjacent of the microvessels forming the planar array being laterally spaced by less than the width of adjacent microvessels opening toward either of said first and second major surfaces, and said filters being present at least in part in a plurality of the microvessels of said planar array to form a recurring pattern.

3. An improved element according to claim 2 in which said support means includes lateral wall means providing a barrier to radiation scattering between adjacent microvessels forming the planar array.

4. An improved element according to claim 3 in which said lateral wall means contains a dye.

5. An improved element according to claim 2 in which said support means is capable of redirecting exposing radiation.

6. An improved element according to claim 5 in which said support means is reflective.

7. An improved element according to claim 2 in which said support means includes means forming a substantially transparent bottom wall of the microvessels.

8. An improved element according to claim 3 in which said support means includes means forming a substantially colorless bottom wall of the microvessels.

9. An improved element according to claim 2 in which the microvessels are less than 200 microns in width.

10. An improved element according to claim 9 in which the microvessels are from 4 to 100 microns in width.

11. An improved element according to claim 2 in which the microvessels are from 1 to 1000 microns in depth.

12. An improved element according to claim 2 in which adjacent microvessels are laterally spaced from 0.5 to 5 microns.

13. An improved element according to claim 2 in which the photographic element is comprised of an array of pixels each containing at least one segment of each of said filters and the microvessel subtended area of the pixel accounts for from 50 to 99 percent of the total pixel area.

14. An improved element according to claim 2 in which said support means is comprised of a polymeric film-forming material.

15. An improved element according to claim 2 in which the microvessels open toward said first major surface and said second major surface is lenticular.

16. An element comprising:

support means having first and second major surfaces, said support means defining a planar array of microvessels which open toward said first major surface, a segmented blue filter located in a first set of the microvessels, a segmented green filter located in a second set of the microvessels, a segmented red filter located in a third set of the microvessels, the first, second and third sets of the microvessels forming an interlaid pattern of blue, green and red filter segments, and said support means providing a lateral barrier between adjacent microvessels.

17. An element according to claim 16 in which the microvessels are substantially identical.

18. An element according to claim 17 in which the microvessels are hexagonal.

19. An element according to claim 16 in which the microvessels containing said blue filter also contain yellow dye or a yellow dye precursor, the microvessels containing said green filter also contain a magenta dye or dye precursor and the microvessels containing said red filter also contain a cyan dye or a cyan dye precursor.

* * * * *